United States Patent [19]
Kim et al.

[11] Patent Number: 6,005,283
[45] Date of Patent: Dec. 21, 1999

[54] COMPLEMENTARY BIPOLAR TRANSISTORS

[75] Inventors: Jong-Hwan Kim; Tae-Hoon Kwon; Cheol-Joong Kim, all of Kyungki-do; Suk-Kyun Lee, Incheon, all of Rep. of Korea

[73] Assignee: Samsung Electronics Co., Ltd., Rep. of Korea

[21] Appl. No.: 08/949,223

[22] Filed: Oct. 10, 1997

[30] Foreign Application Priority Data

Oct. 11, 1996 [KR] Rep. of Korea ............. 96-45305
Sep. 10, 1997 [KR] Rep. of Korea ............. 97-46600

[51] Int. Cl.⁶ ............... H01L 27/102; H01L 29/735
[52] U.S. Cl. ............. 257/557; 257/558; 257/575
[58] Field of Search ............... 257/557, 558, 257/575

[56] References Cited

U.S. PATENT DOCUMENTS

| | | | |
|---|---|---|---|
| 5,163,178 | 11/1992 | Gomi et al. | 257/558 |
| 5,455,188 | 10/1995 | Yang | 257/575 |
| 5,777,375 | 7/1998 | Shishido | 257/558 |
| 5,828,124 | 10/1998 | Villa | 257/558 |

*Primary Examiner*—Jerome Jackson, Jr.
*Attorney, Agent, or Firm*—Myers Bigel Sibley & Sajovec

[57] ABSTRACT

A complementary bipolar transistor having a lateral npn bipolar trasistor, a vertical and a lateral pnp bipolar transistor, an integrated injection logic, a diffusion capacitor, a polysilicon capacitor and polysilicon resistors are disclosed. The lateral pnp bipolar transistor has an emitter region and a collector region which includes high-density regions and low-density regions, and the emitter region is formed in an n type tub region. In the integrated injection logic circuit, collector regions are surrounded by a high-density p type region, and low-density p type regions are formed under the collector regions. The diffusion capacitor and the polysilicon capacitor are formed in one substrate. The diffusion regions except the regions formed by diffusing the impurities in the polysilicon resistors into the epitaxial layer are formed before forming the polysilicon resistors, and polysilicon electrodes are formed along with the polysilicon resistors.

9 Claims, 99 Drawing Sheets

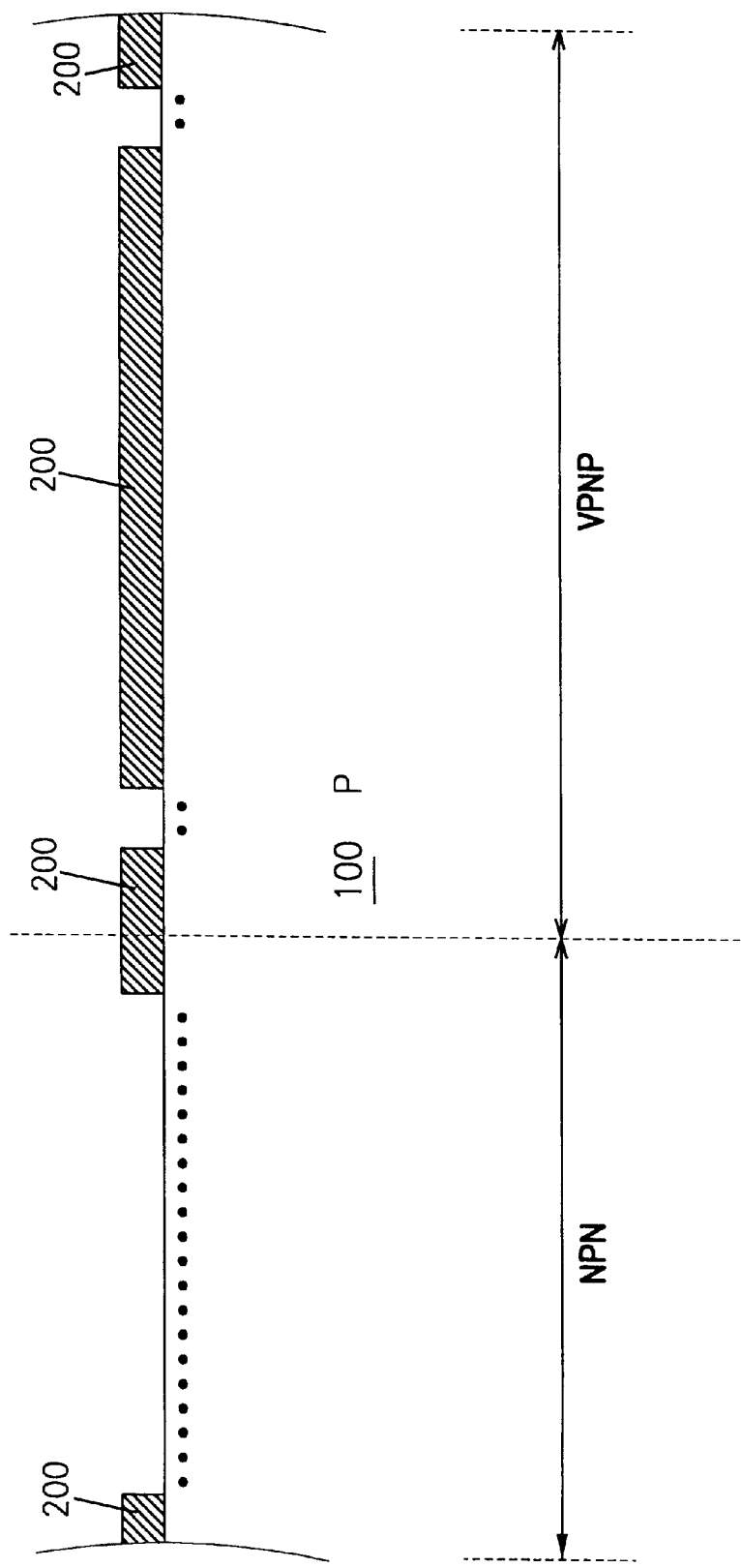

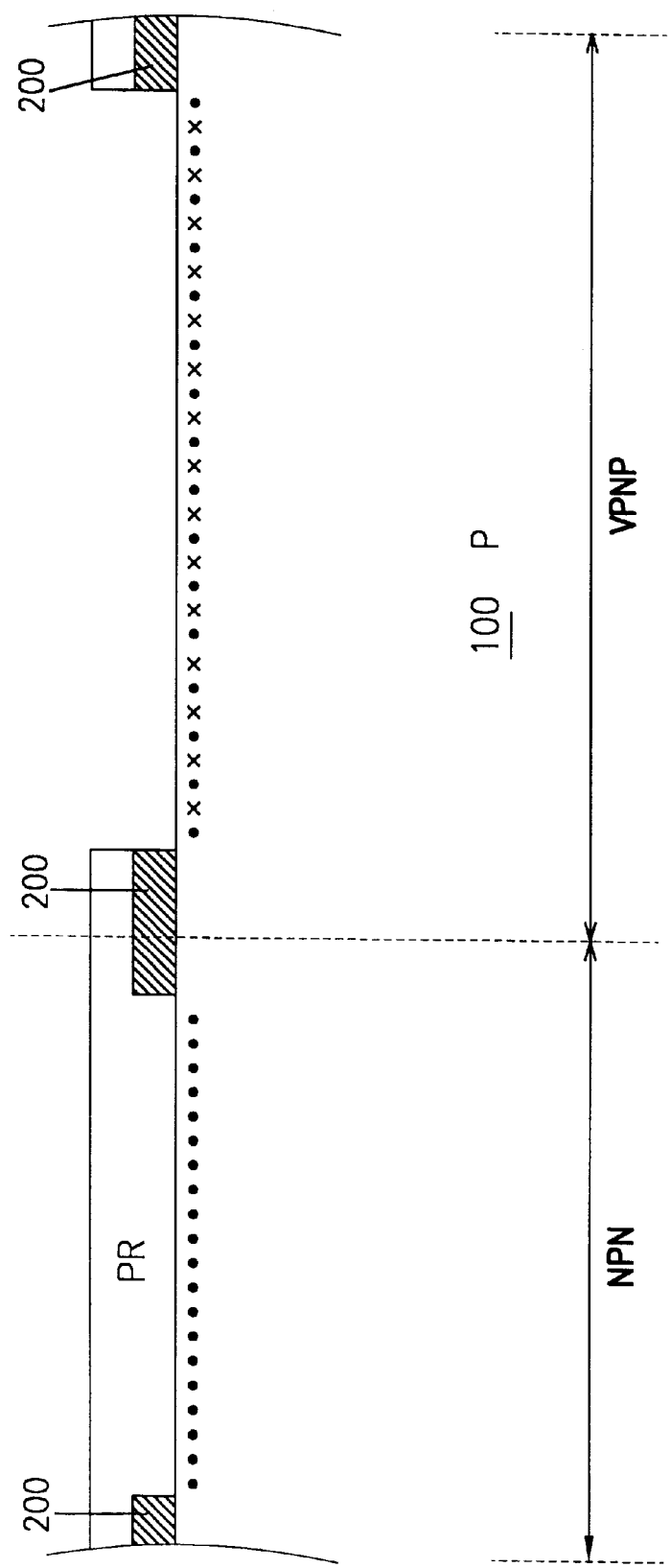

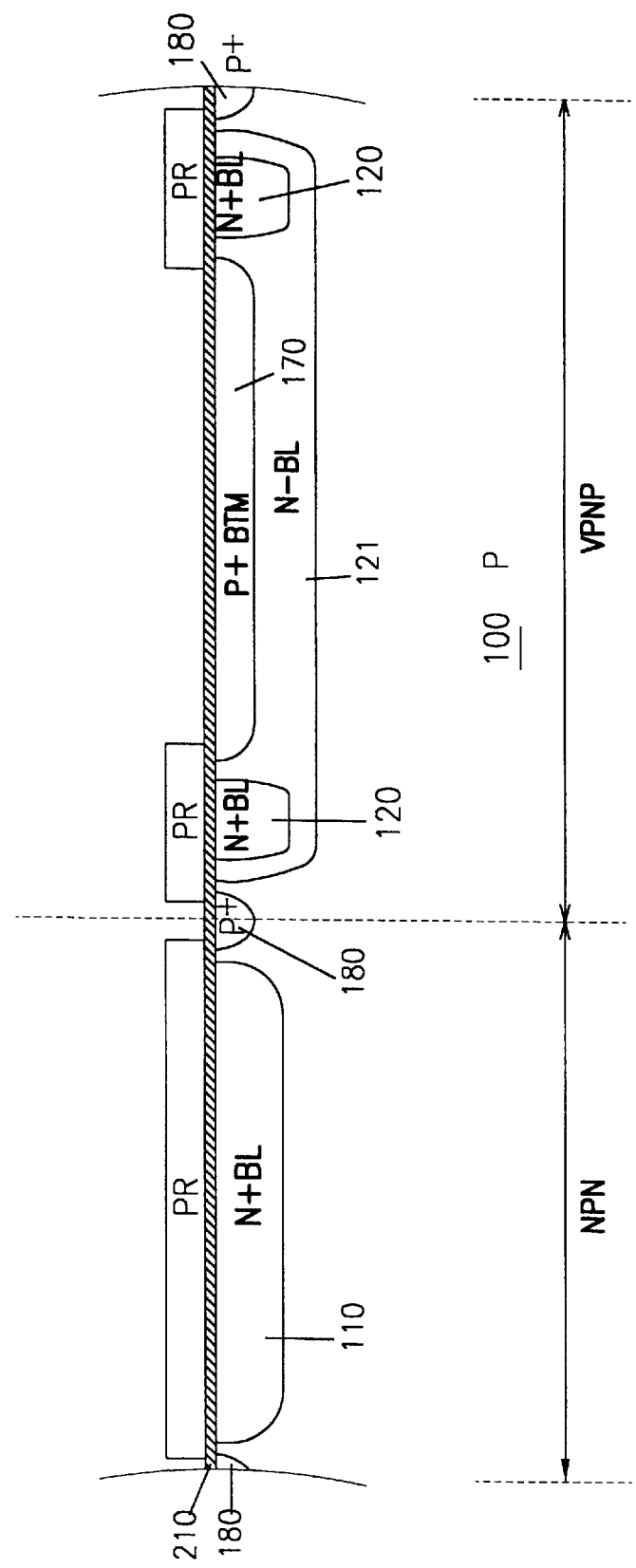

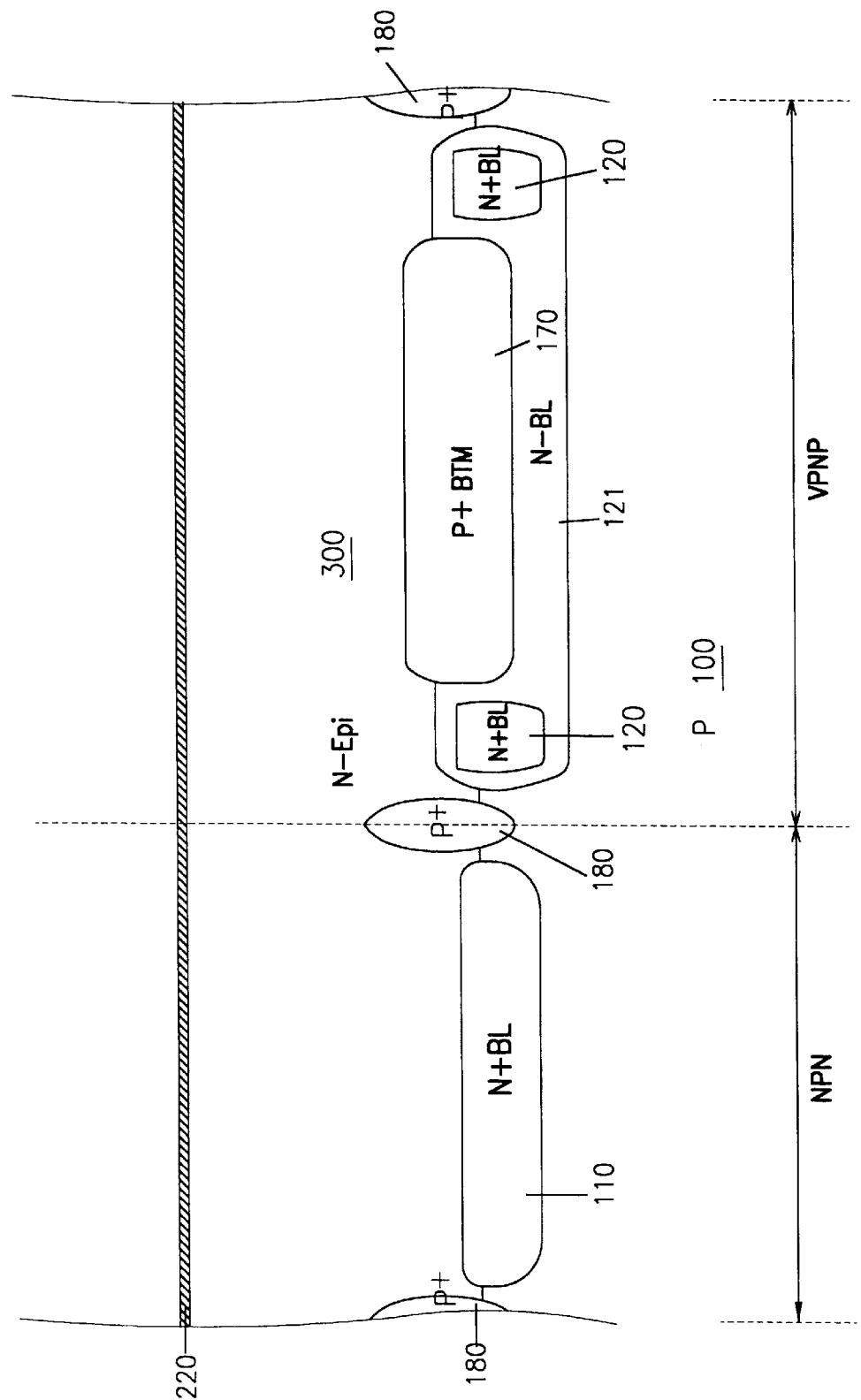

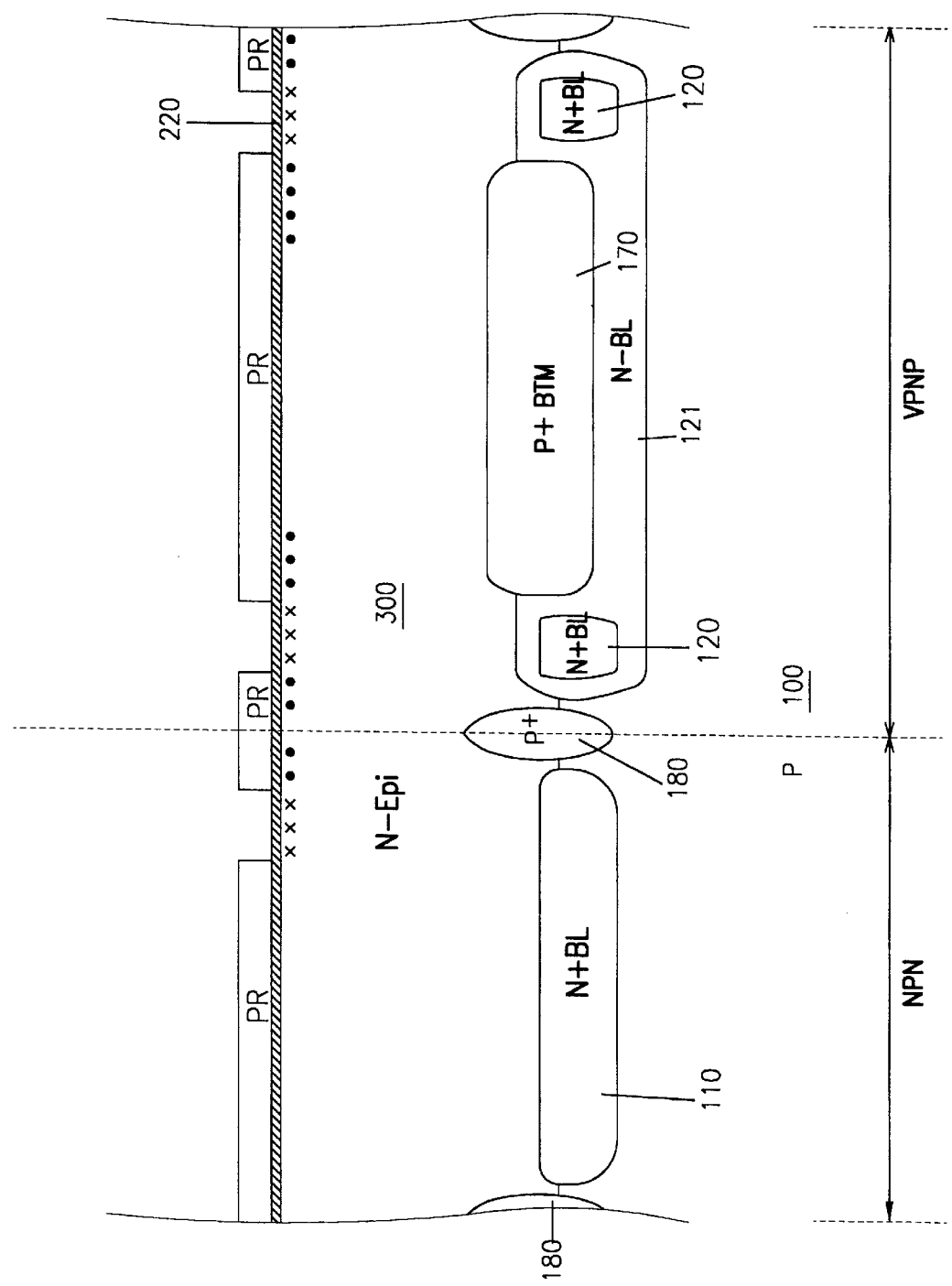

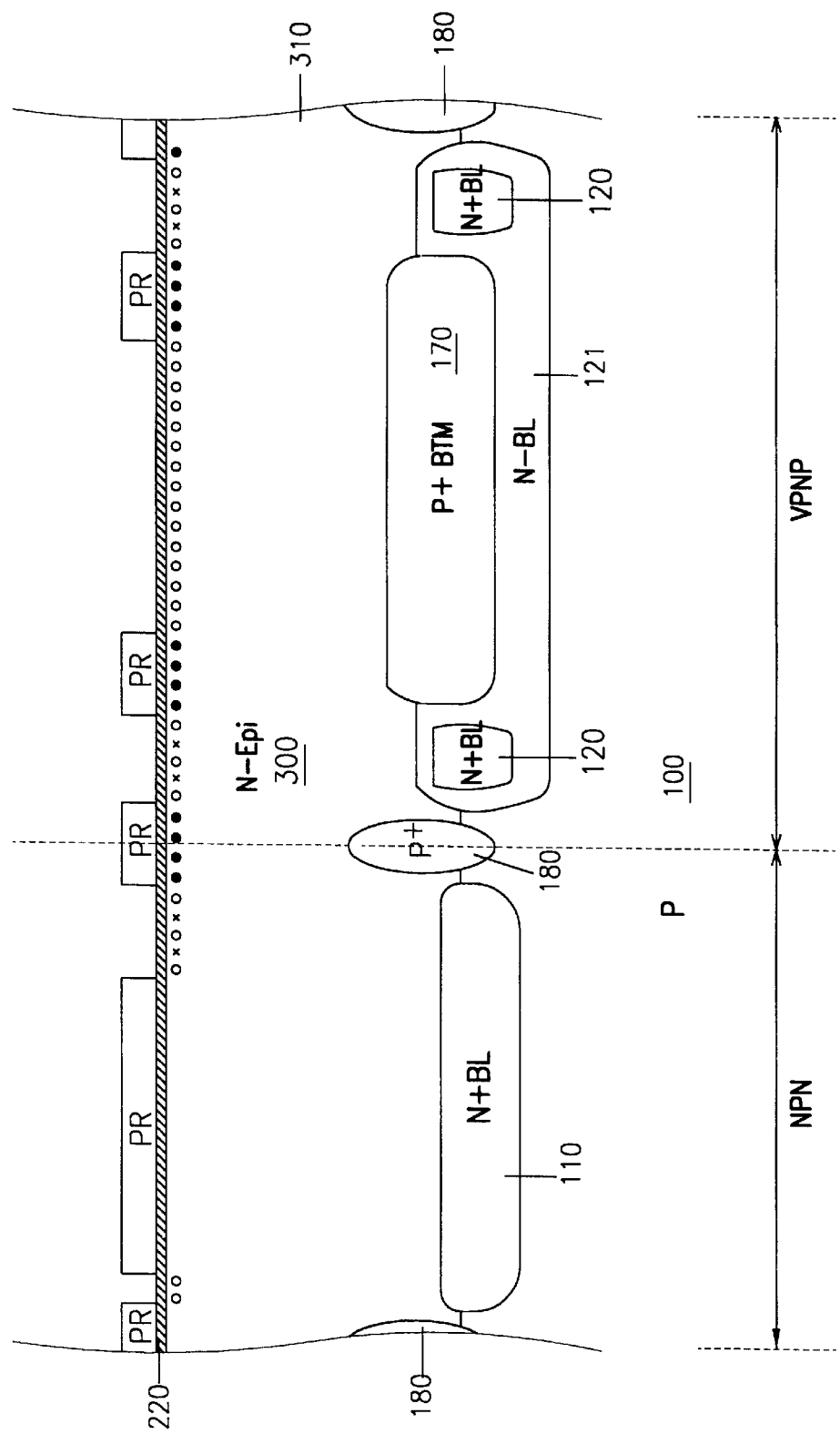

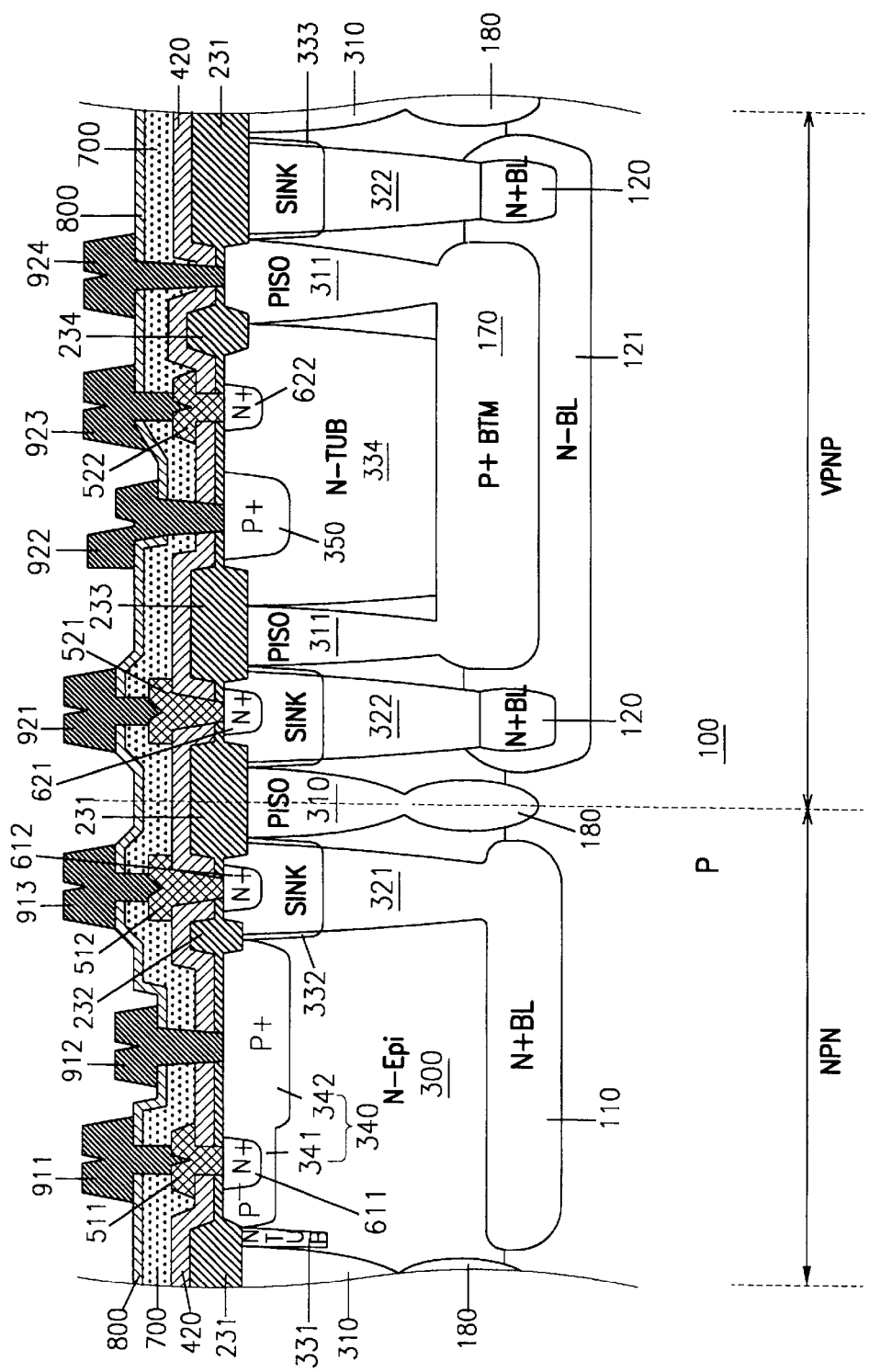

COMPLEMENTARY BIPOLAR TRANSISTORS

BACKGROUND OF THE INVENTION (a) Field of the Invention

The present invention relates to integrated circuit transistors and manufacturing methods thereof, in particular, to bipolar transistors, integrated injection logics devices ($I^2L$), capacitors, polysilicon resistors and isolation regions which separate the above devices and manufacturing methods therefor.

(b) Description of the Related Art

Many semiconductor devices are integrated in a chip in various fields. In order to integrate these devices on a chip, many complicated processes are used, and thus many problems may occur. For example, the resistivity in the polysilicon resistors are not uniform, that is, the distribution of the impurities in the resistors are not uniform. This is because there are many ion implantation steps and drive-in steps once doping of the polysilicon resistors are completed. During the successive ion implantation steps and drive-in steps, the impurities in the polysilicon resistors may be redistributed nonuniformly. In addition, since a separate polysilicon layer is deposited and patterned to form polysilicon electrodes after forming the polysilicon resistors, two polysilicon layers are used for resistors and electrodes respectively. The manufacturing method thus may be complicated. Furthermore, the characteristics of the $I^2L$ may not be good, and the description thereof is now described with reference to FIG. 1A which illustrates a conventional $I^2L$.

An n+ type buried layer 2 is formed on a p type substrate 1, and an n type epitaxial layer 3 is formed thereon. The epitaxial layer 3 has a plurality of diffusion regions such as n type regions 4, 8, 9, 10 and 24 and p type regions 5, 31 and 34 which extend downwards from the surface of the epitaxial layer 3. An n+ type sink region 4 is formed on the edges of the buried layer 2. A LOCOS oxide layer 13 is formed on the central region of the portion of the epitaxial layer 3 enclosed by the sink region 4. P type regions 5 and 31 and 34 are formed at both sides of the LOCOS oxide layer 13, respectively. The p type region 34 includes two p− type regions 36 and 37 and a central p+ type region 35 therebetween. The p type region 31 has a p− type region 33 adjacent to the LOCOS oxide layer 13 and a p+ type region 34 adjacent thereto, and the p type region 5 is formed to be separated from the p type region 31. Multiple n+ type regions 8, 9 and 10 are formed in the p− type regions 33, 36 and 37. Another n+ type region 24 is formed in one side of the sink region 4, and a LOCOS layer 14 is formed on the other side of the sink region 4. A LOCOS oxide layer 11 and 12 surrounding the n+ type region 24 is formed on the epitaxial layer 3. An oxide layer 15 is formed on the epitaxial layer 3 and on the LOCOS oxide layers 11, 12, 13 and 14, and it has contact holes on the n+ type regions 8, 9, 10 and 24 and on the p+ type regions 5, 32 and 35. In the contact holes on the n+ type regions 8, 9, 10 and 24, polysilicon electrodes 17, 18, 19 and 16 are formed to be in contact with the n+ type regions 8, 9,10 and 24, and silicide layers 30 are formed on the respective polysilicon electrodes 17, 18, 19 and 24. An interlayer insulating film 23 is formed thereon and it has contact holes exposing the polysilicon electrodes 17, 18, 19 and 24 and contact holes in the oxide layer 15. Finally, metal electrodes 21, 22 and 25 which are respectively in contact with the p+ type regions 5, 32 and 35, and metal electrodes 20, C1, C2 and C3 which are respectively in contact with the polysilicon electrodes 16, 17, 18 and 19 are formed in the contact holes.

In this conventional $I^2L$, a punch through phenomenon occurs among the n+ type region 10, the p− type region and the epitaxial layer 3 in the region as shown by A in FIG. 1A, and this yields leakage current which degrades the characteristics of the device.

Next, a conventional lateral pnp bipolar transistor is described with reference to FIG. 1B.

An n+ buried layer 40 is formed on a p type substrate 1, and an n type epitaxial layer 3 with is formed thereon. A p+ isolation region 44 formed in the epitaxial layer 3 extends downward from the surface of the epitaxial layer 3, and a p+ type region 42 is formed to extend from the p+ isolation region 44 to the substrate 1. The isolation region 44 and the p+ type region 42 surround the buried layer 40, and LOCOS oxide layers 61 and 63 are formed on the isolation region 44. The portion of the epitaxial layer 3 surrounded by the isolation region 44 has a plurality of diffusion regions such as n type regions 46 and 48 and p type regions 51 and 52 which extend downwards from the surface of the epitaxial layer 3. An n+ type sink region 46 is formed to be connected to the edges of the buried layer 40. A p+ type emitter region 52 and a p+ type collector region 51 which surrounds the emitter region 52 and is separated from the emitter region 52 are formed in the epitaxial region 3. An n+ type region 42 is formed in the sink region 4, and it provides currents to the epitaxial layer 3 which serves as a base through the sink region 46 and the buried layer 40. A LOCOS oxide layer 62 is formed on the portion of the epitaxial layer 3 between the sink region 46 and the portion of the collector region 51 adjacent to the sink region 46. An oxide layer 15 is formed on the epitaxial layer 3 and the LOCOS oxide layers 61, 62 and 63, and it has contact holes on the n+ type region 48 and the collector and the emitter regions 51 and 52. In the contact hole on the n+ type region 48, a polysilicon electrode 70 is formed to be in contact with the n+ type regions 48. An interlayer insulating film 23 is formed thereon and the interlayer insulating film 23 has contact holes exposing the polysilicon electrode 70 and contact holes in the oxide layer 15. Finally, an emitter and a collector metal electrodes 81 and 82 which are respectively in contact with the emitter and collector regions 52 and 51 and a base metal electrode 83 which is in contact with the polysilicon electrode 48 is formed in the contact holes.

In this conventional lateral pnp bipolar transistor, since the concentration of the epitaxial layer 3 which function as the base is very low, sufficient distance may be required between the emitter region 52 and the collector region 51 for maintaining the breakdown voltage. However, the large distance between them may cause the current gain to become small.

SUMMARY OF THE INVENTION

An object of the present invention is to prevent the leakage currents in $I^2L$ and/or to reduce the size of the $I^2L$.

Another object of the present invention is to provide lateral bipolar transistors that can have high current gain and/or proper emitter-collector breakdown voltage.

Another object of the present invention is to obtain uniform distribution of resistivity in polysilicon resistors.

Another object of the present invention is to simplify the entire manufacturing processes.

According to a feature of the present invention, a high density tub region surrounds an emitter region of a lateral bipolar transistor.

According to another feature of the present invention, an emitter region and/or a collector region of a lateral bipolar transistor have heavily doped regions and lightly doped regions. The lightly doped region of the emitter region is located outside of the emitter region, while the lightly doped region of the emitter region is located inside of the collector region such that the lightly doped regions face each other.

At this time, a highly doped region of first conductivity type may be located between the two diffusions of second conductivity type to increase the breakdown voltage of the device.

The highly doped regions and the lightly doped regions of the emitter and the collector regions are formed respectively when forming an intrinsic and an extrinsic regions of the base region of the vertical bipolar transistor.

According to another feature of the present invention, collector regions of an integrated injection logic device have up-down and left-right symmetry or rectangular shape where the two sides are 1–1.5 times longer than the other two sides.

According to another feature of the present invention, collector regions of first conductivity type in the integrated injection logic are adjacent to a high-density region of second conductivity type, and low-density regions of the second conductivity type are located under the collector regions. The high-density region may surround collector regions, or it may be located between the collector regions and a sink region.

According to another feature of the present invention, an injection region and an input region in which collector regions is formed is formed in a tub region of opposite conductivity type.

According to another feature of the present invention, a diffusion capacitor and a polysilicon capacitor are formed in the same substrate.

According to another feature of the present invention, a polysilicon resistor is formed on a thick oxide layer made of LOCOS method, after forming contacts for electrically connecting diffusion regions formed in a semiconductor substrate. The polysilicon layer which is patterned to form the resistor may be used for forming polysilicon electrodes for transmitting external signals to the diffusion regions through the contacts.

DETAILED DESCRIPTION OF THE PREFERRED EMBODIMENTS

Figure 1A:
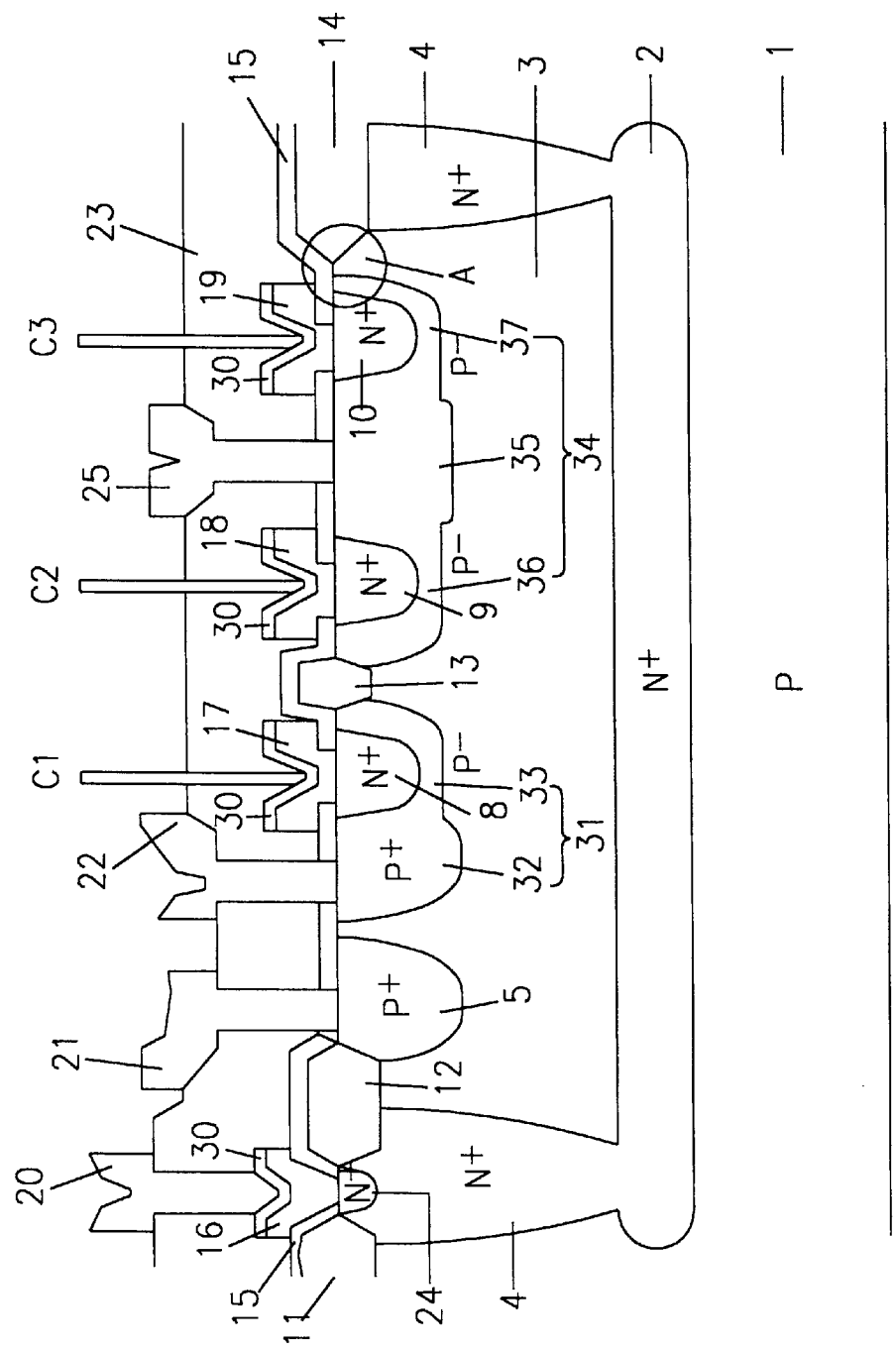
FIG. 1A is a sectional view of a conventional lateral pnp bipolar transistor.
Figure 1B:
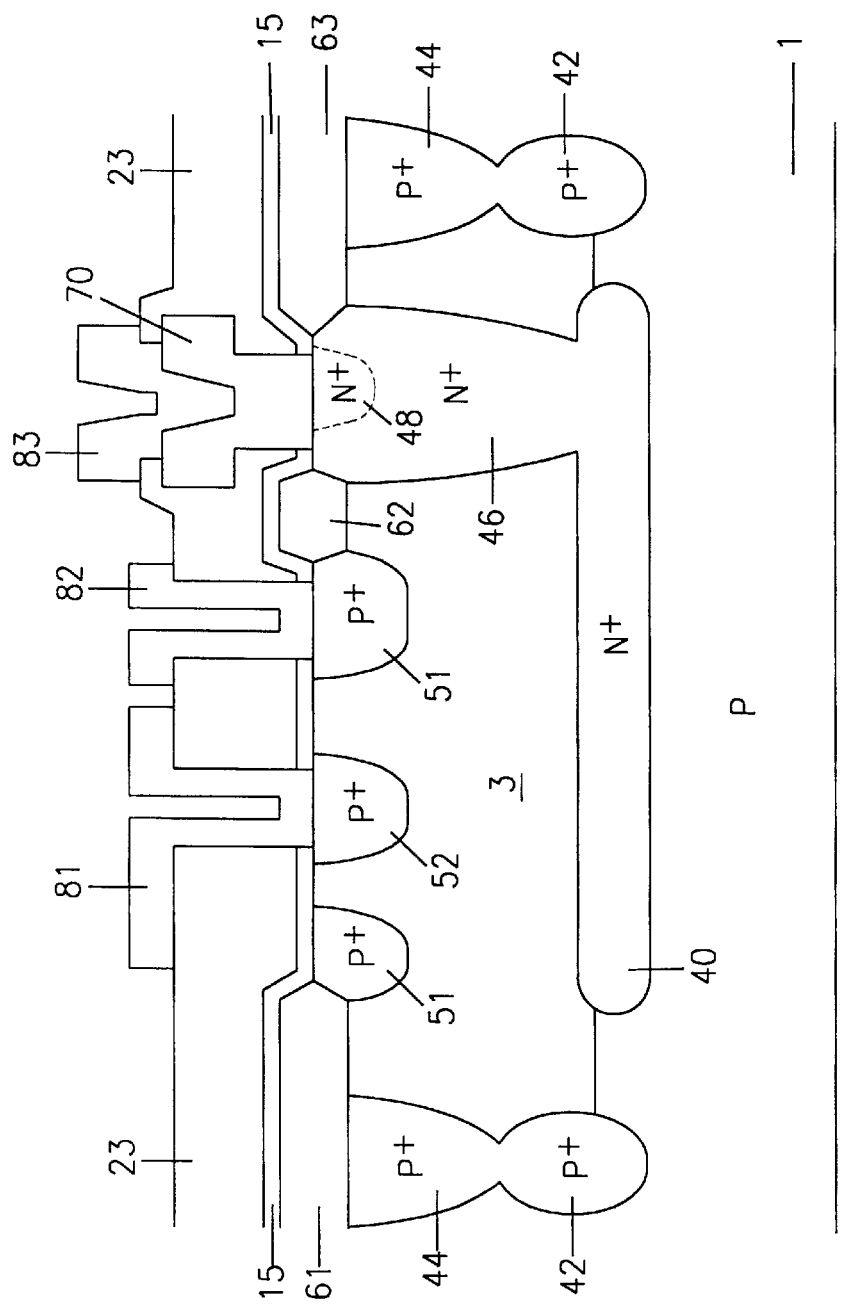
FIG. 1B is a sectional view of a conventional lateral $I^2L$.

The present invention will now be described with more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be through and complete, and will fully convey the scope of the invention to those skilled in the art. In the drawings, the thickness of layers and regions are exaggerated for clarity. Moreover, the terms "first conductivity type" and "second conductivity type" refer to opposite conductivity types such as n type or p type, however, each embodiment described and illustrated herein includes its complementary embodiments as well. It will be understood that when an element such as a layer, region or substrate is referred to as being "on" another element, it can be directly on the other element or intervening elements may also be present.

Figure 2:
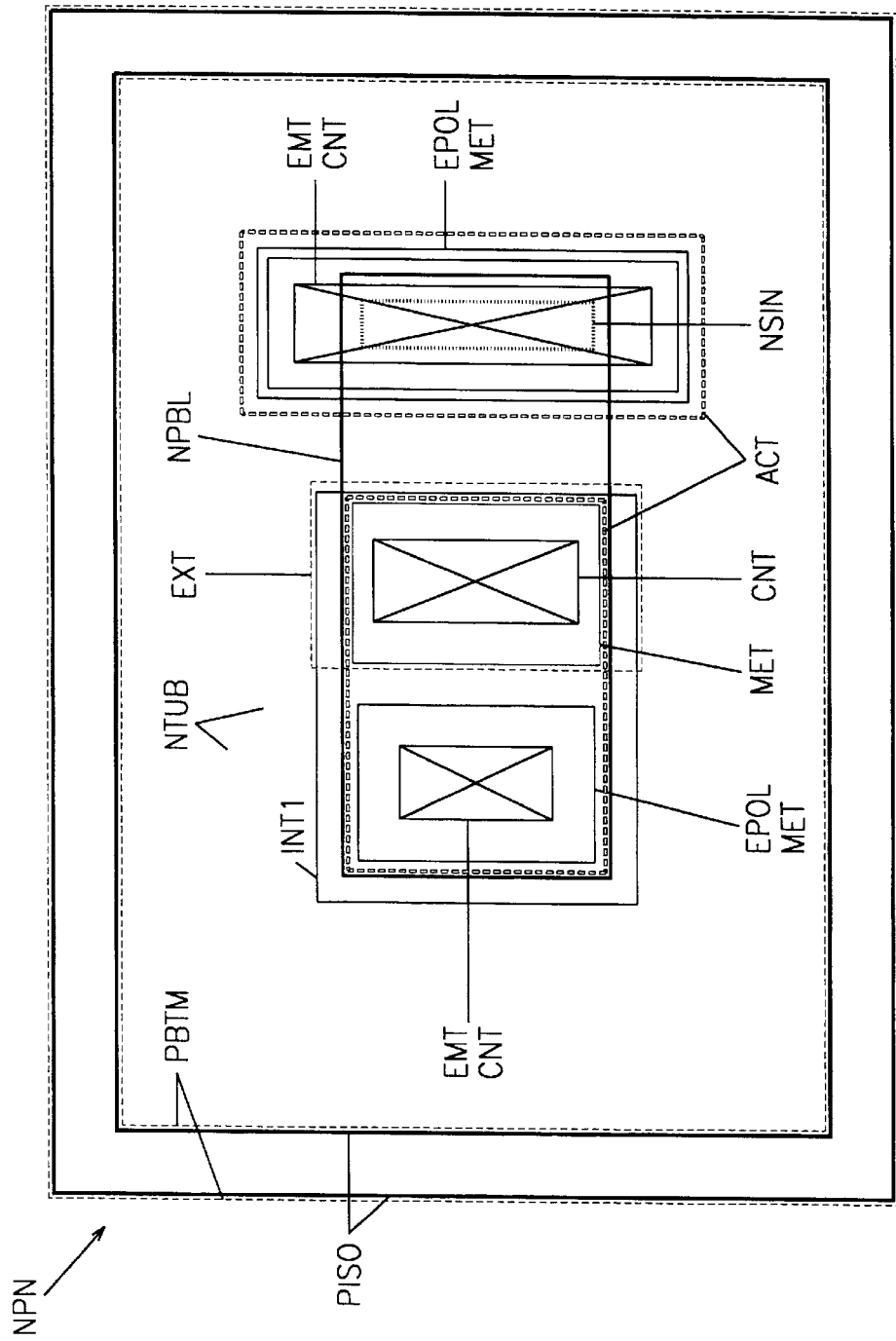
FIG. 2 shows a mask layout required for manufacturing a vertical npn bipolar transistor NPN according to an embodiment of the present invention.
Figure 3:
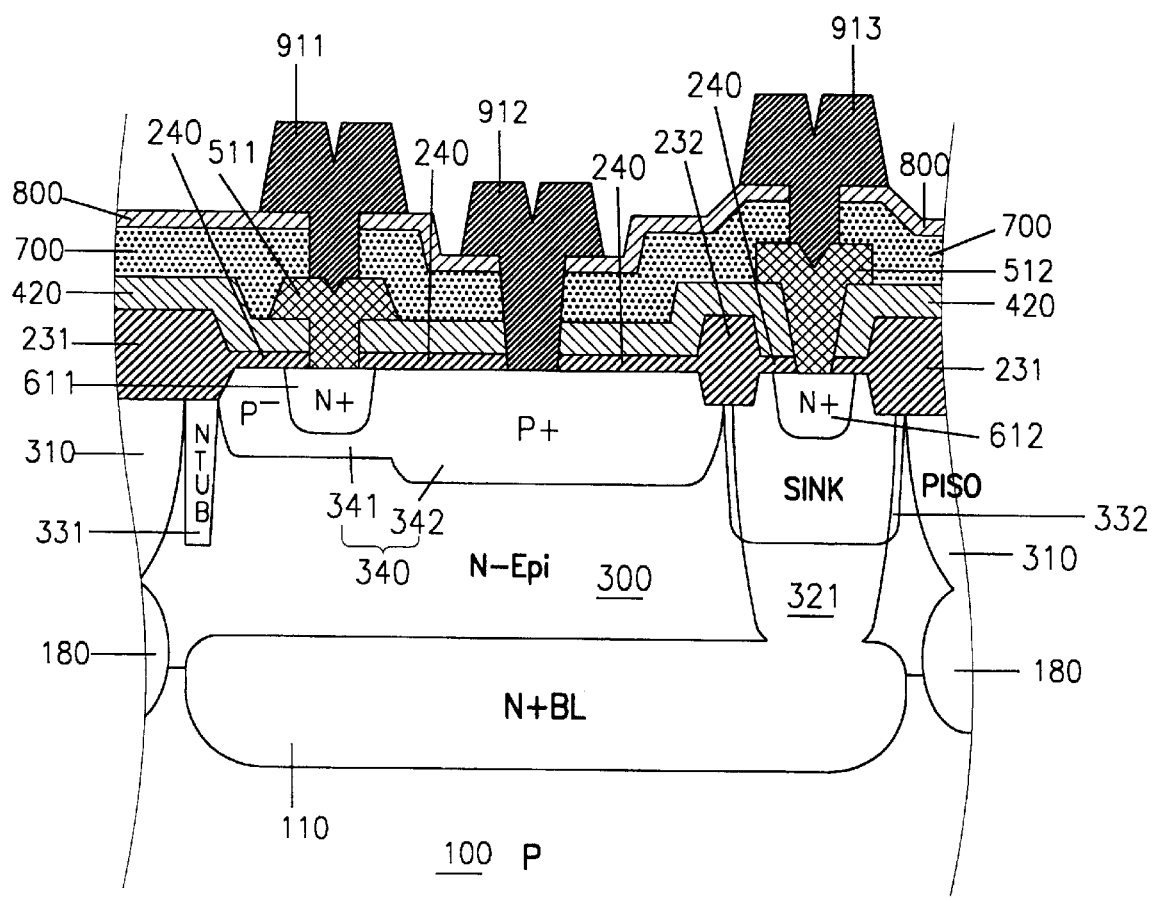
FIG. 3 is a sectional view of a vertical npn bipolar transistor manufactured by using the masks shown in FIG. 2.

First, a vertical npn bipolar transistor according to an embodiment of the present invention is described with reference to FIGS. 2 and 3 which are a layout diagram of the masks and a sectional view of the transistor, respectively.

An epitaxial layer 300 doped with low-density n type impurities is formed on a p type substrate 100, and an isolation region 310 and an isolating p+ type region 180 doped with high-density p type impurities defines an element region by surrounding a portion of the substrate 100 and the epitaxial layer 300. The isolation region 310 and the isolating p+ type region 180 isolate this device from other semiconductor devices formed on the same substrate. The isolation region 310 in the epitaxial layer 300 extends downward from the surface of the epitaxial layer, and the isolating p+ region 180 extends from the isolation layer 310 to the substrate 100.

An n+ buried layer 110 doped with high-density n type impurities is formed between the substrate 100 and the epitaxial layer 300 in the element region surrounded by the isolation region 310 and the isolating p+ region 180.

Several diffusion regions 321, 331, 332, 340, 611 and 612 are formed in the epitaxial layer 300 and extend downward from the surface of the epitaxial layer 300.

A ring-type tub region 331 and 332 doped with n type impurities in the epitaxial layer 300 is formed along the inner side of the isolation region 310 and it has a narrow portion 331 and a broad portion 332 connected to each other. A sink region 321 doped with high-density n type impurities is overlapped with the broad portion 332 and extends to an edge of the buried layer 110 to be connected to the buried layer 110. The impurity density of the tub region 331 and 332 is larger than that of the epitaxial layer 300 but smaller than that of the sink region 321, and either of the sink region 321 or the portion 332 may be eliminated.

A base region 340 formed in the epitaxial layer 300 is surrounded by the tub region 331 and 332, and it has an intrinsic region 341 doped with low density p type impurities and an extrinsic region 342 doped with high density p type impurities. An emitter region 611 doped with high-density n type impurities is formed in the intrinsic region 341, and a n+ region 612 which has higher n type impurity density than the sink region 321 and the tub region 332 is formed in the sink region 321.

The narrow portion 331 of the tub region lies between the isolation region 310 and the intrinsic region 341, and thus it can reduce or prevent punch through effect which occurs between the isolation region 310 and the base region 340, thereby increasing the breakdown voltage of the transistor. This enables the distance between the base region 340 and the isolation region 310 to be reduced, thereby reducing the device size. Such tub regions that play a similar role as in this embodiment will be described in the later embodiments, that is, an n type tub region between two p type diffusion regions can reduce or prevent the punch through effect therebetween.

Thin pad oxide layers 240 are formed on the portions of the epitaxial layer 300 where the sink region 321 and the base region 340 are formed respectively, and the remaining portions of the epitaxial layer 300 are covered with a thick oxide layer 231 and 232 made by LOCOS method. In particular, the thick oxide layer 232 is formed on the portion of the epitaxial layer 300 between the sink region 321 and the base region 340. An insulating layer such as a low temperature oxide (LTO) layer 420 is formed on the pad oxide layers 240 and the thick oxide layer 231 and 232. The LTO layer 420, may be eliminated.

The LTO layer 420 and the pad oxide layers 240 have contact holes which expose the emitter region 611 and the n+ region 612, and an emitter polysilicon electrode 511 and a collector polysilicon electrode 512 are formed in the contact holes to be in electrical contact with the emitter region 611 and the n+ region 612, respectively. An insulating layer such as an LTO layer 700 is formed on the polysilicon electrodes 511 and 512 and the LTO layer 420, and an insulating layer such as a silicon nitride layer 800 is formed thereon. The nitride layer 800 may be deleted in this device. The nitride layer 800 and the LTO layer 700 have contact holes which expose the polysilicon electrodes 511 and 512, and an emitter metal electrode 911 and a collector metal electrode 912 are formed in the contact holes to be in electrical contact with the emitter polysilicon electrode 511 and the collector polysilicon electrode 512, respectively. In addition, the nitride layer 800, the LTO layers 700 and 420 and the pad oxide layers 240 have a contact hole which exposes the extrinsic region 342, and a base metal electrode 912 is formed in the contact hole to be in electrical contact with the extrinsic region 342 of the base region 340.

Figure 4:
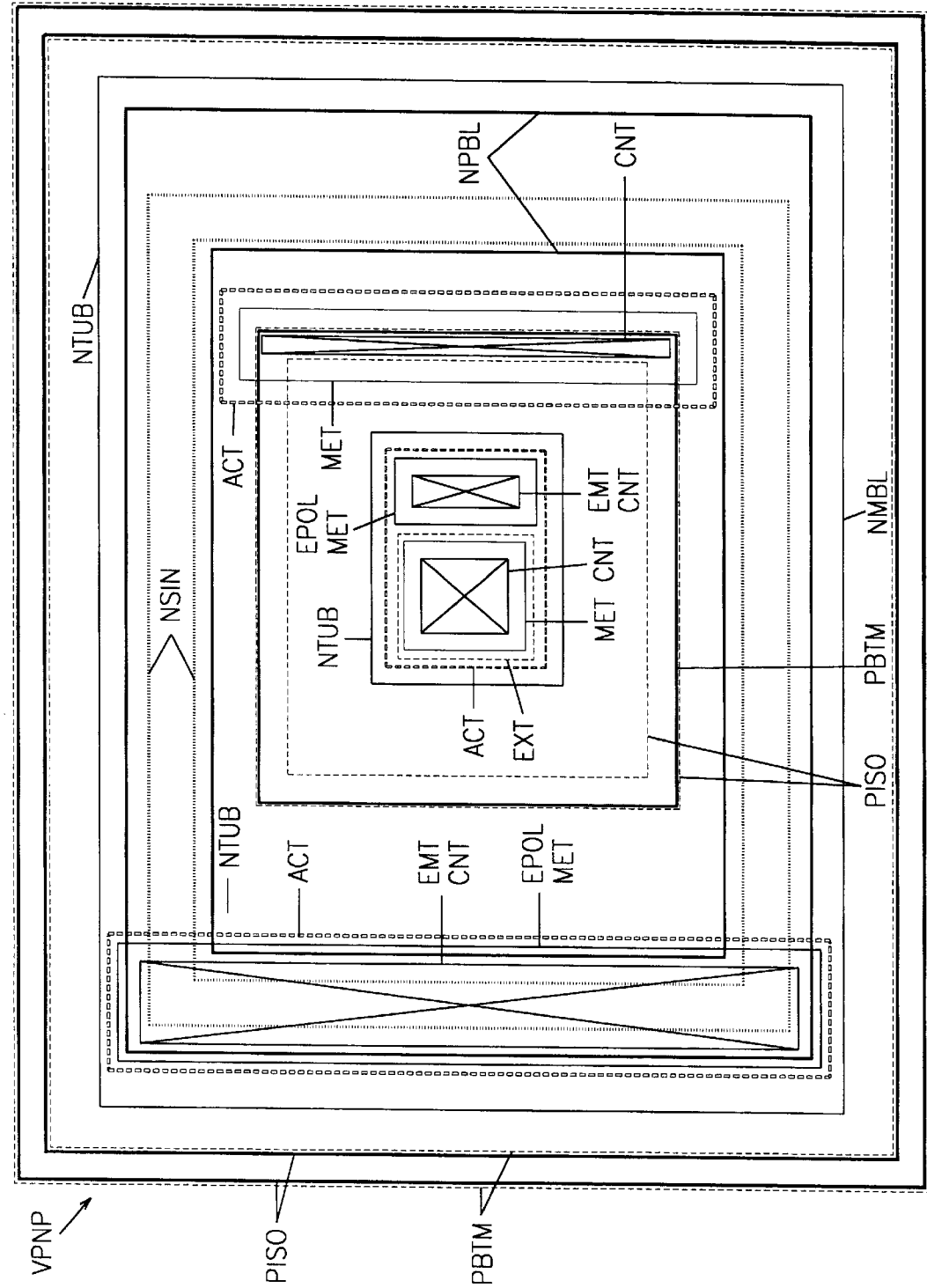
FIG. 4 shows a mask layout for manufacturing a vertical pnp bipolar transistor VPNP according to an embodiment of the present invention.
Figure 5:
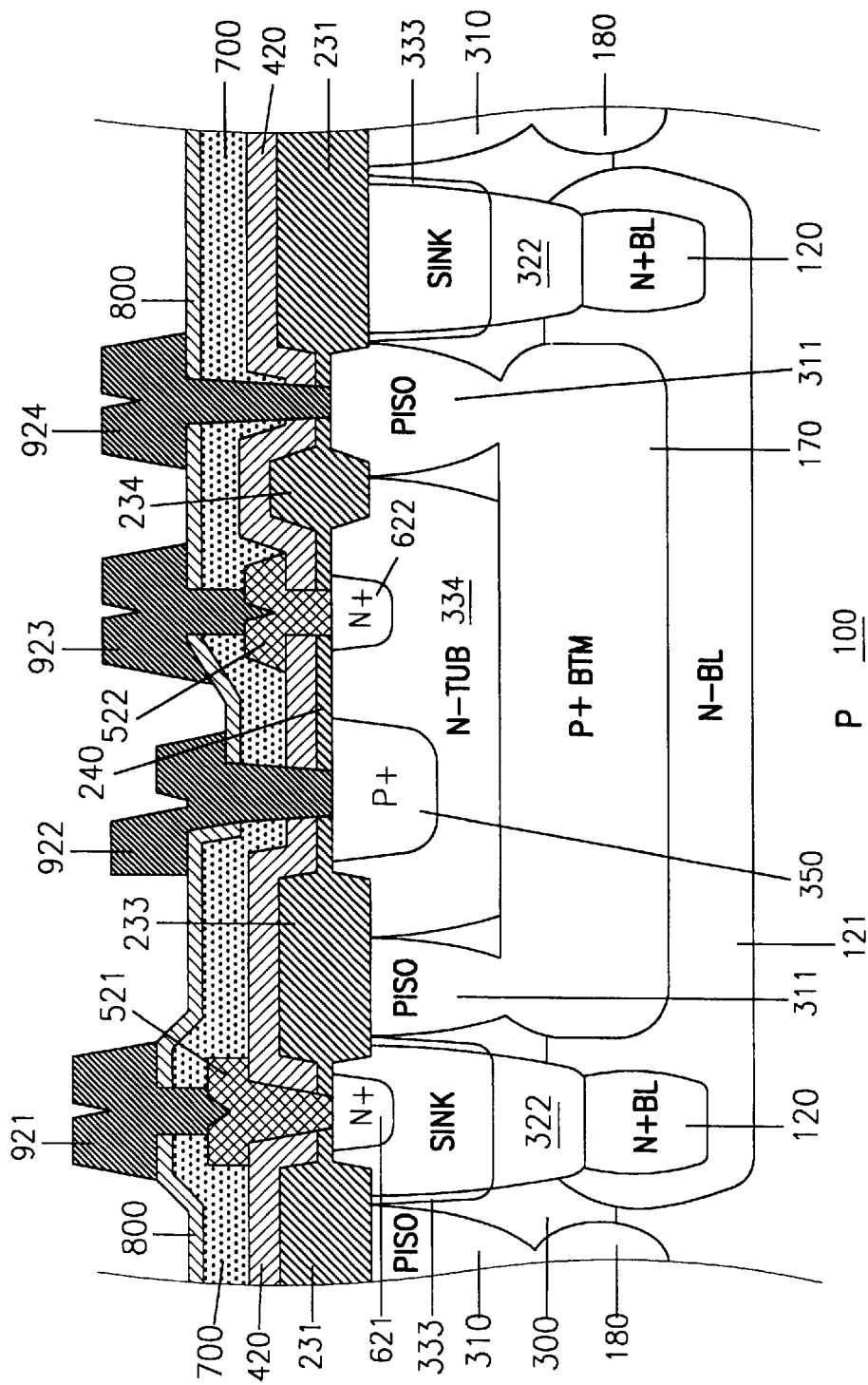
FIG. 5 is a sectional view of a vertical pnp bipolar transistor manufactured by using the masks shown in FIG. 4.

Next, a vertical pnp bipolar transistor according to an embodiment of the present invention is described with reference to FIGS. 4 and 5 which are a layout diagram of the masks and a sectional view of the transistor, respectively.

An epitaxial layer 300 doped with low-density n type impurities is formed on a p type substrate 100, and an isolation region 310 and an isolating p+ type region 180 doped with high-density p type impurities defines an element region by surrounding a portion of the substrate 100 and the epitaxial layer 300. The isolation region 310 and the isolating p+ type region 180 isolate this device from other semiconductor devices formed on the same substrate. The isolation region 310 in the epitaxial layer 300 extends downward from the surface of the epitaxial layer, and the isolating p+ region 180 extends from the isolation layer 310 to the substrate 100.

An n– buried layer 121 doped with low-density n type impurities is formed between the substrate 100 and the epitaxial layer 300 in the element region surrounded by the isolation region 310 and the isolating p+ region 180. An n+ buried layer 120 doped with high-density n type impurities is formed in the n– buried layer 121 along the edges of the n– buried layer. A bottom layer 170 doped with high-density p type impurities are formed between the n– buried layer 121 and the epitaxial layer 300, and it is located at the center of the n– buried layer 121.

Several diffusion regions 311, 322, 333, 334, 350, 621 and 622 are formed in the epitaxial layer 300 and extend downward from the surface of the epitaxial layer 300.

A ring-type sink region 322 doped with high-density n type impurities in the epitaxial layer 300 is formed along the inner side of the isolation region 310, and extends to the n+ buried layer 120. Tub regions 333 doped with n type impurities are formed to be overlapped with the portions of the sink region 322. The impurity density of the tub regions 333 is larger than that of the epitaxial layer 300 but smaller than that of the sink region 322.

A ring-type p+ region 311 doped with high-density p type impurities extends to the bottom layer 170 along the edges of the bottom layer 170. A tub region 334 is formed at the center of the region surrounded by the p+ region 311 and extends to the bottom layer 170.

An emitter region 350 doped with high-density p type impurities and a base region 622 doped with high-density n type impurities are formed in the tub region 334, and an n+ region 621 which has higher n type impurity density than the sink region 322 and the tub region 333 is formed in the sink region 322.

Thin pad oxide layers 240 are formed on the portions of the epitaxial layer 300 where the tub region 334, the tub region 333 including the n+ region 621 and a portion of the p+ region 311 are formed respectively. Thick oxide layer 231, 233 and 234 made by LOCOS method is formed on the remaining portions of the epitaxial layer 300, in particular, on the portions of the epitaxial layer 300 between the n+ region 612 and the emitter region 340 and between the base region 622 and the p+ region 311. An insulating layer such as a low temperature oxide (LTO) layer 420 is formed on the pad oxide layers 240 and the thick oxide layer 231, 233 and 234. The LTO layer 420 may be eliminated if unnecessary.

The LTO layer 420 and the pad oxide layers 240 have contact holes which expose the base region 622 and the n+ region 621, and a base polysilicon electrode 522 and a bias polysilicon electrode 521 are formed in the contact holes to be in electrical contact with the base region 622 and the n+ region 621, respectively. An insulating layer such as an LTO layer 700 is formed on the polysilicon electrodes 522 and 521 and the LTO layer 420, and an insulating layer such as a silicon nitride layer 800 is formed thereon. The nitride layer 800 may be deleted in this device. The nitride layer 800 and the LTO layer 700 have contact holes which expose the polysilicon electrodes 522 and 521, and a base metal electrode 923 and a bias metal electrode 921 are formed in the contact holes to be in electrical contact with the base polysilicon electrode 522 and the bias polysilicon electrode 521, respectively. In addition, the nitride layer 800, the LTO layers 700 and 420 and the pad oxide layers 240 have contact holes which expose the emitter region 350 and the p+ region 311, and an emitter metal electrode 922 and the collector metal electrode 924 are formed in the contact holes to be in electrical contact with the emitter region 350 and the p+ region 311.

Figure 6:
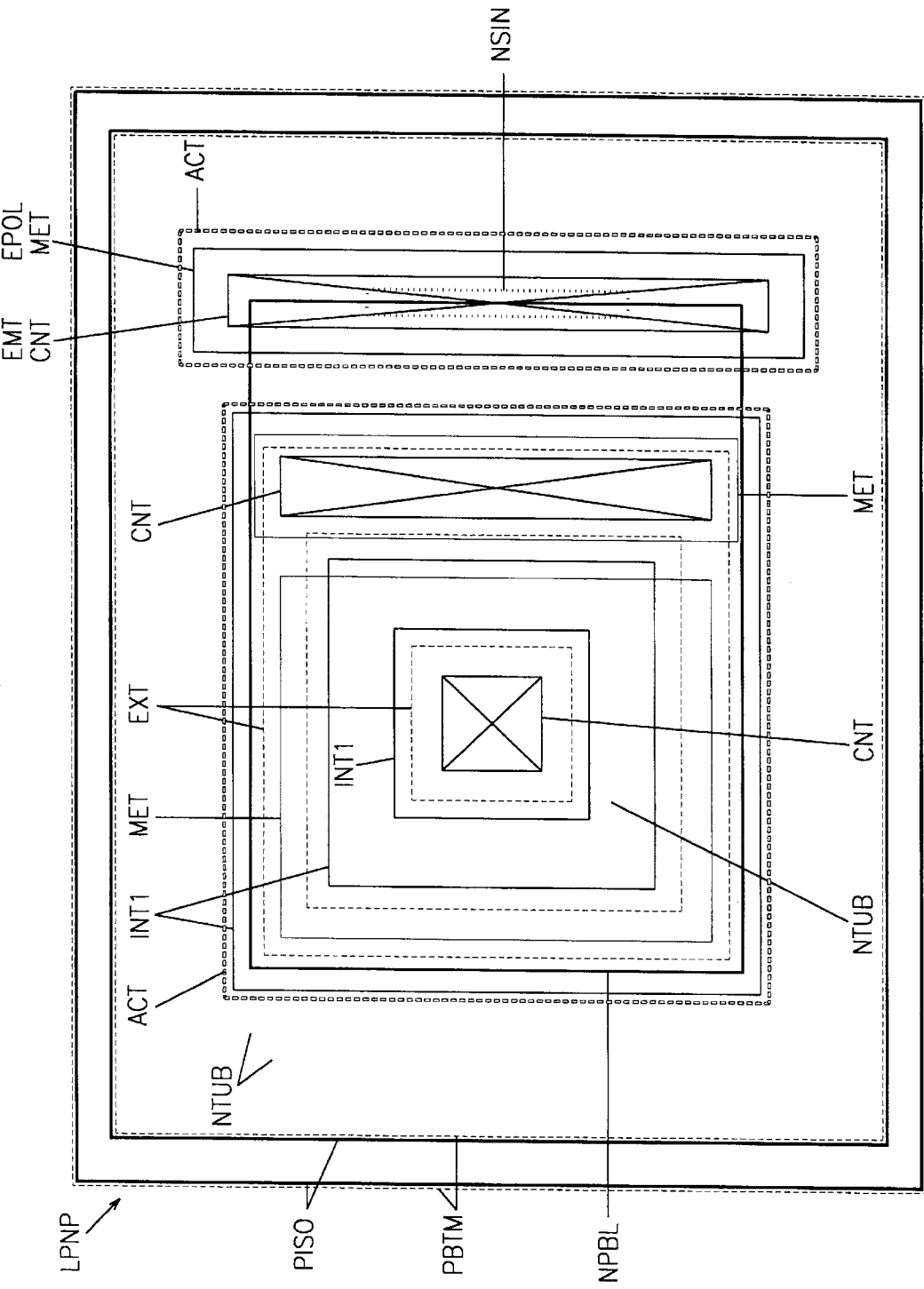
FIG. 6 shows a mask layout for manufacturing a lateral pnp bipolar transistor LPNP according to an embodiment of the present invention.
Figure 7A:
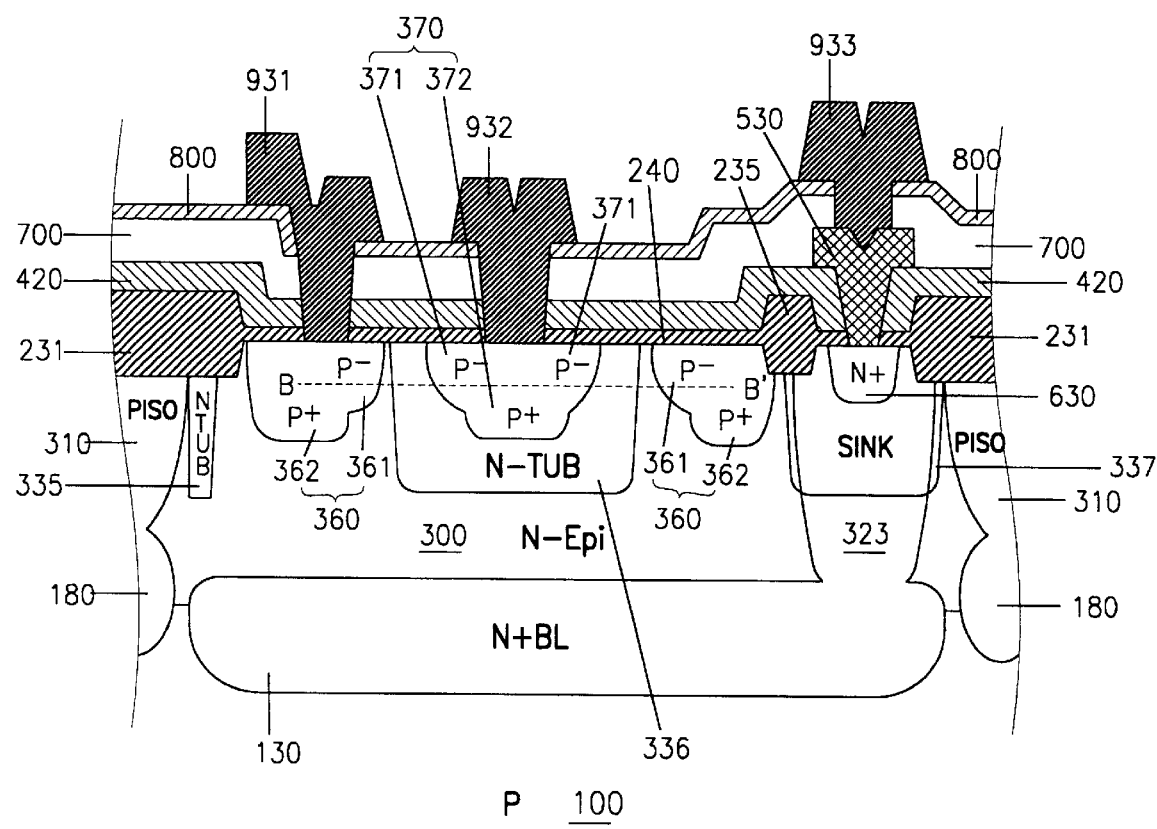
FIG. 7A is a sectional view of a lateral pnp bipolar transistor manufactured by using the masks shown in FIG. 6.

Next, a structure of a lateral pnp bipolar transistor according to an embodiment of the present invention is described with reference to FIGS. 6 and 7A which are a layout diagram of the masks and a sectional view of the transistor, respectively.

An epitaxial layer 300 doped with low-density n type impurities is formed on a p type substrate 100, and an isolation region 310 and an isolating p+ type region 180 doped with high-density p type impurities defines an element region by surrounding a portion of the substrate 100 and the epitaxial layer 300. The isolation region 310 and the isolating p+ type region 180 isolate this device from other semiconductor devices formed on the same substrate. The isolation region 310 in the epitaxial layer 300 extends downward from the surface of the epitaxial layer, and the isolating p+ region 180 extends from the isolation layer 310 to the substrate 100.

An n+ buried layer 130 doped with high-density n type impurities is formed between the substrate 100 and the epitaxial layer 300 in the element region surrounded by the isolation region 310 and the isolating p+ region 180.

Several diffusion regions 323, 335, 336, 337, 360, 370 and 630 are formed in the epitaxial layer 300 and extend downward from the surface of the epitaxial layer 300.

A ring-type tub region 335 and 337 doped with n type impurities in the epitaxial layer 300 is formed along the inner side of the isolation region 310 and it has a narrow portion 335 and a broad portion 337 connected to each other. A sink region 323 doped with high-density n type impurities is overlapped with the broad portion 337 and extends to an edge of the buried layer 130 to be connected to the buried layer 130. A tub region 336 doped with n type impurities is formed at the center of the area enclosed by the ring-type tub region 335 and 337, and it serves as a base of this transistor. The impurity density of the tub regions 336, 335 and 337 is larger than that of the epitaxial layer 300 but smaller than that of the sink region 323, and either of the sink region 323 or the broad portion 337 may be eliminated.

A p type emitter region 370 is formed in the tub region 336 and it has two adjacent p type regions 371 and 372, i.e., a p+ region 372 doped with high-density p type impurities and a low-density p type region 371 doped with low-density p type impurities surrounding the high-density p type region 372. A collector region 360 in the epitaxial layer 300 surrounds the tub region 336 and is separated from the tub region 336, and it has two adjacent p type regions 361 and 362, i.e., a p− region 361 doped with low-density p type impurities and a p+ region 362 doped and high-density p type impurities with being located outside of the p− region 361. A n+ region 630 which has higher n type impurity density than the sink region 323 and the tub region 337 is formed in the sink region 323.

Thin pad oxide layers 240 are formed on a portion of the epitaxial layer 300 surrounded by the ring-type tub region 335 and 337, and on the portions of the epitaxial layer 300 where the sink region 323 is formed, respectively. The remaining portions of the epitaxial layer 300 are covered with a thick oxide layer 231 and 235 made by LOCOS method, in particular, on the portion of the epitaxial layer 300 between the sink region 323 and the collector region 360. An insulating layer such as a low temperature oxide (LTO) layer 420 is formed on the pad oxide layers 240 and the thick oxide layer 231 and 235. The LTO layer 420, if necessary, may be eliminated.

The LTO layer 420 and the pad oxide layer 240 have a contact hole which exposes the n+ region 630, and a base polysilicon electrode 530 is formed in the contact hole to be in electrical contact with the n+ region 630. An insulating layer such as an LTO layer 700 is formed on the polysilicon electrode 530 and on the LTO layer 420, and an insulating layer such as a silicon nitride layer 800 is formed thereon. The nitride layer 800 may be deleted in this device. The nitride layer 800 and the LTO layer 700 have contact holes which expose the polysilicon electrode 530, and an base metal electrode 933 is formed in the contact hole to be in electrical contact with the emitter polysilicon electrode 530. In addition, the nitride layer 800, the LTO layers 700 and 420 and the pad oxide layer 240 have contact holes which expose the p+ regions 372 and 362, and an emitter and a collector metal electrode 932 and 931 are formed in the contact holes to be in electrical contact with the emitter and the collector regions 370 and 360.

Figure 7B:
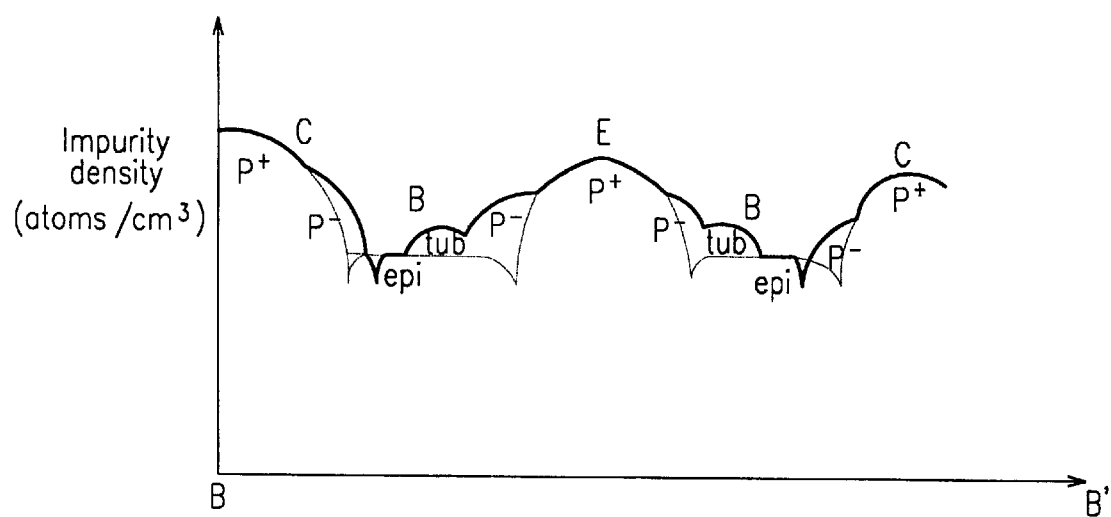
FIG. 7B shows impurity density distribution in the lateral pnp bipolar transistor shown in FIG. 7A with respect to the position along the line B–B' in FIG. 7A.
Figure 7C:
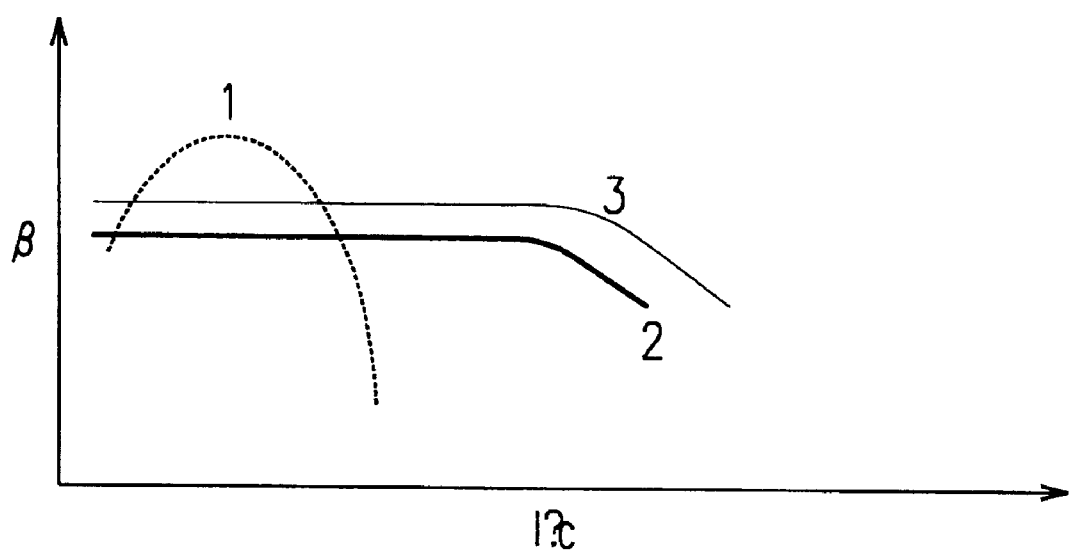
FIG. 7C shows current gain of the lateral pnp bipolar transistor shown in FIG. 7A.

Now, impurity density distribution and current gain will be described with reference to FIGS. 7B and 7C. FIG. 7B shows impurity density distribution along the line B–B' shown in FIG. 7A, wherein the solid line represents the case with both the p− regions 361 and 371 and the tub region 336 while the dotted line represents the case without the p− region 361 and 371 and the tub region 336. FIG. 7C shows current gains for lateral pnp transistors without the p− regions 361 and 371 and the tub region 336 (line 1), only with the tub region 336 (line 2) and with both of them (line 3), where the horizontal line represents collector current and the vertical line represents current gain ($\beta$).

As shown in FIG. 7B, introduction of the tub region 336 means that a portion of the epitaxial layer 300 serving as base is changed into the tub region 336 of higher impurity density. As a result, the tub region 336 makes the impurity density of the base become higher. In addition, introduction of the p− regions 361 and 371 results in the reduction of the base width.

As shown in FIG. 7C, the transistor having only a tub region has a lower maximum current gain than the transistor without the tub region and the p− regions, but it shows more linear current gain and has higher maximum collector current. Furthermore, since the tub region which has higher impurity density than the epitaxial layer is placed between the emitter region 370 and the collector region 360, the base-collector breakdown voltage increases. Therefore, the distance between the emitter region 370 and the collector region 360, the base width, can be reduced compared with a conventional lateral pnp transistor, while maintaining the breakdown voltage.

Since the p− regions 361 and 371 as well as the tub region 336 increase the breakdown voltage, the base width can be reduced while maintaining the breakdown voltage.

Therefore, the transistor having both the tub region 336 and the p− regions 361 and 371 has more current gain than the transistor having only a tub region. Furthermore, since the portions of the p-n junction near the point where the p+ regions 362 and 372 and the p− regions 361 and 371 meet have concave shapes, the junction area becomes large. Accordingly, the emitter region 370 and the collector region 360 face each other by larger areas, and thus the maximum collector current becomes large.

Figure 8A:
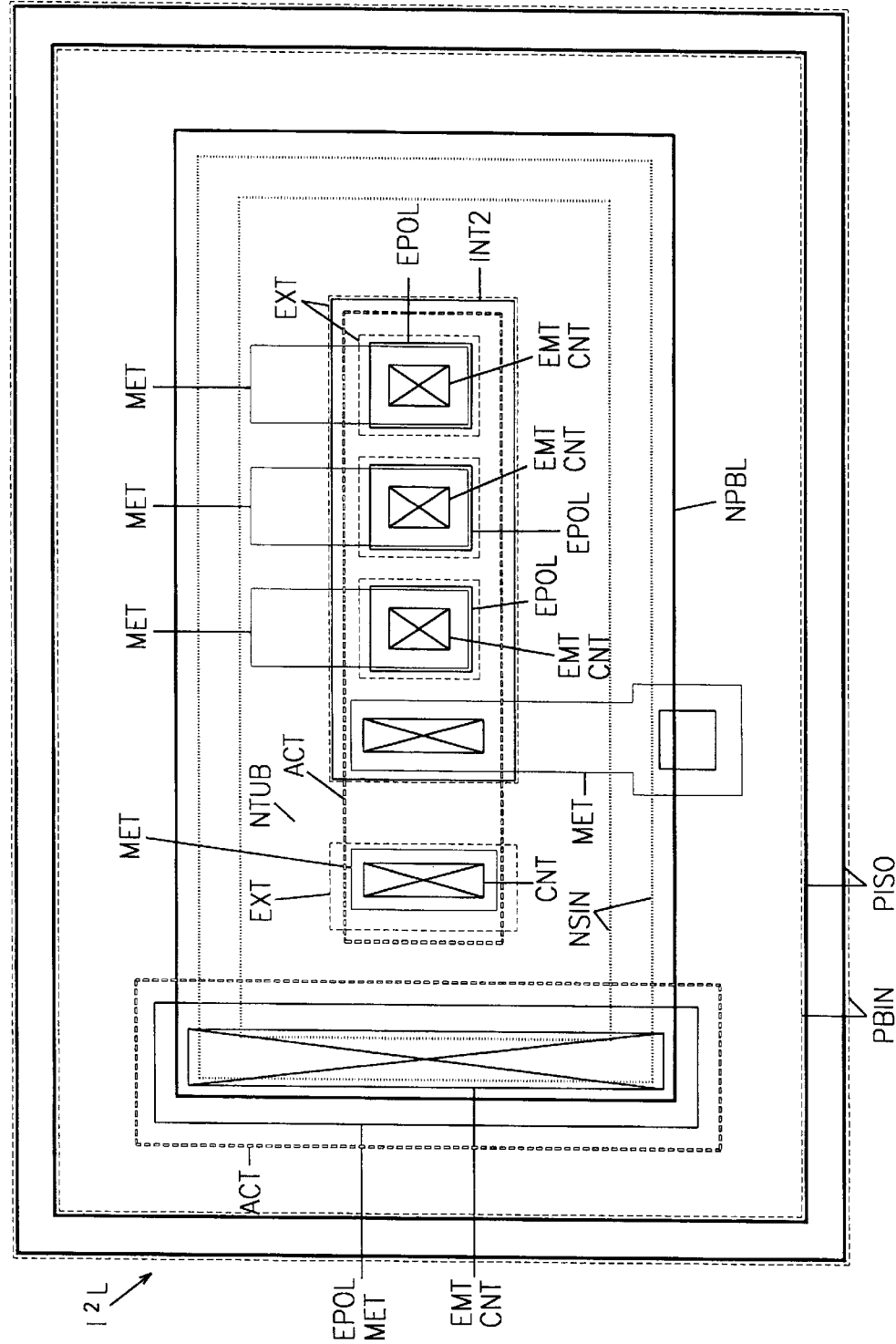
FIGS. 8A and 8B are diagrams representing mask layouts for manufacturing integrated injection logics $I^2L$ according to the embodiments of the present invention.
Figure 8B:
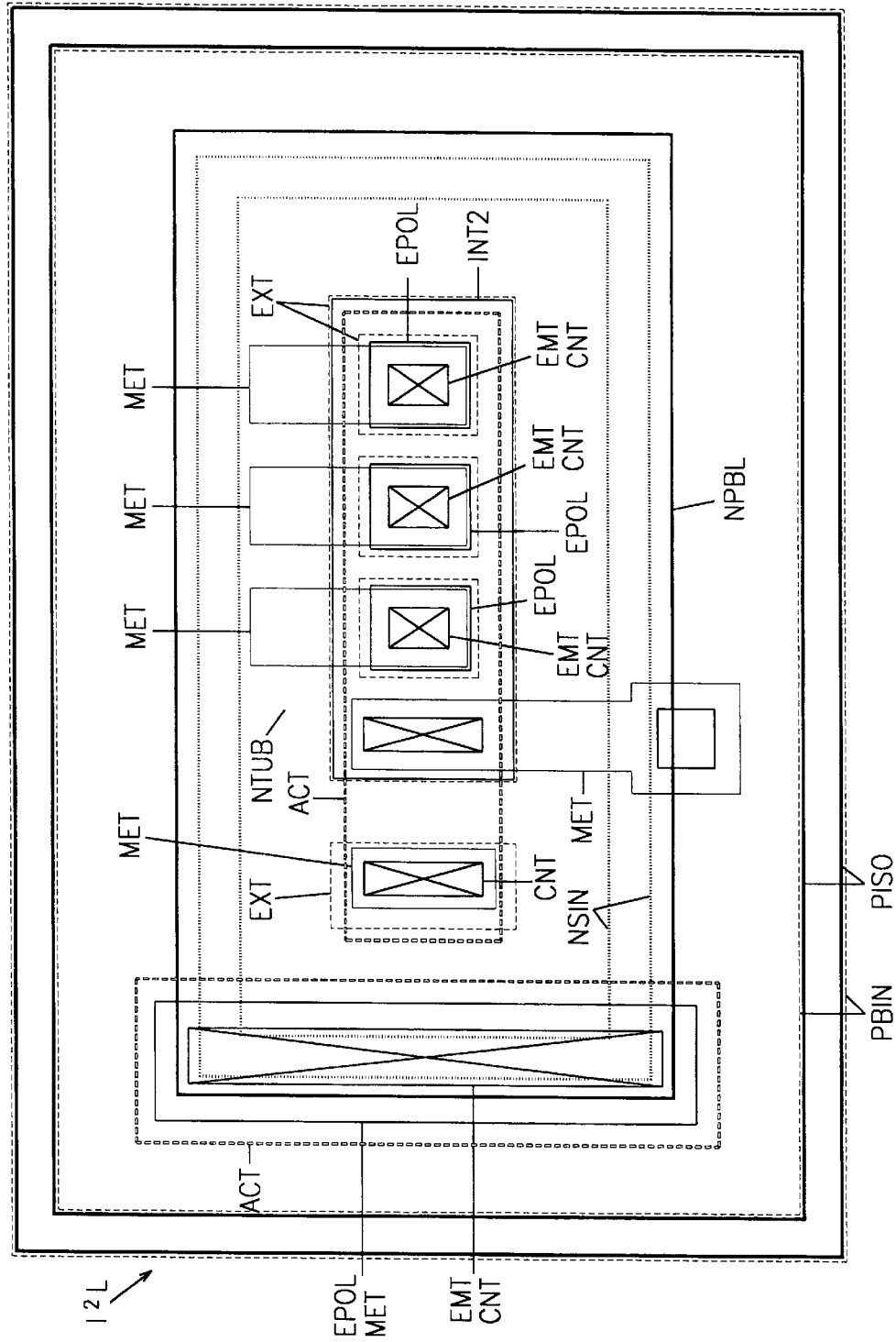
Figure 9A:
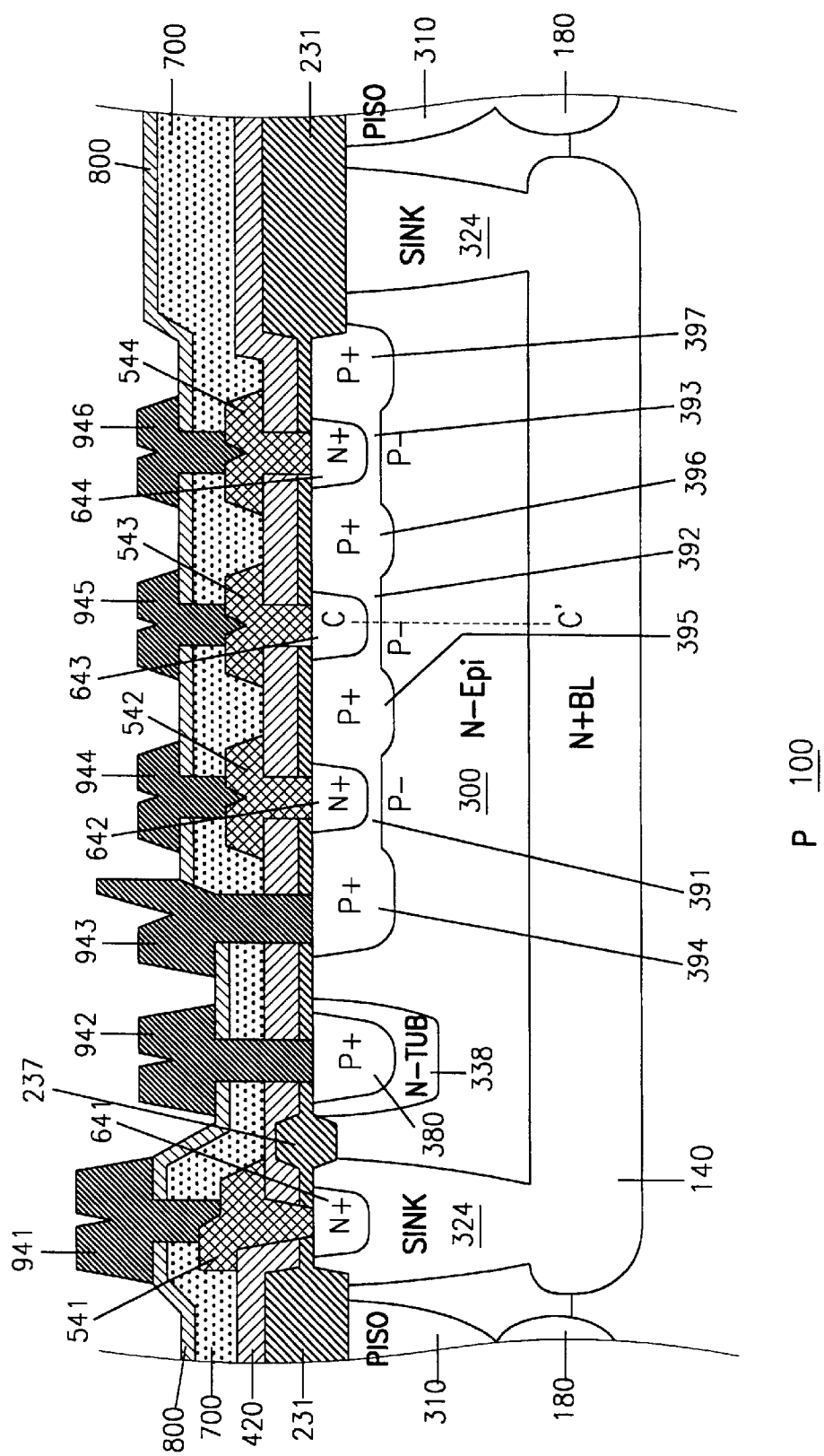
FIGS. 9A and 9B are sectional views of $I^2L$s manufactured by using the masks shown in FIGS. 8A and 8B.
Figure 9B:
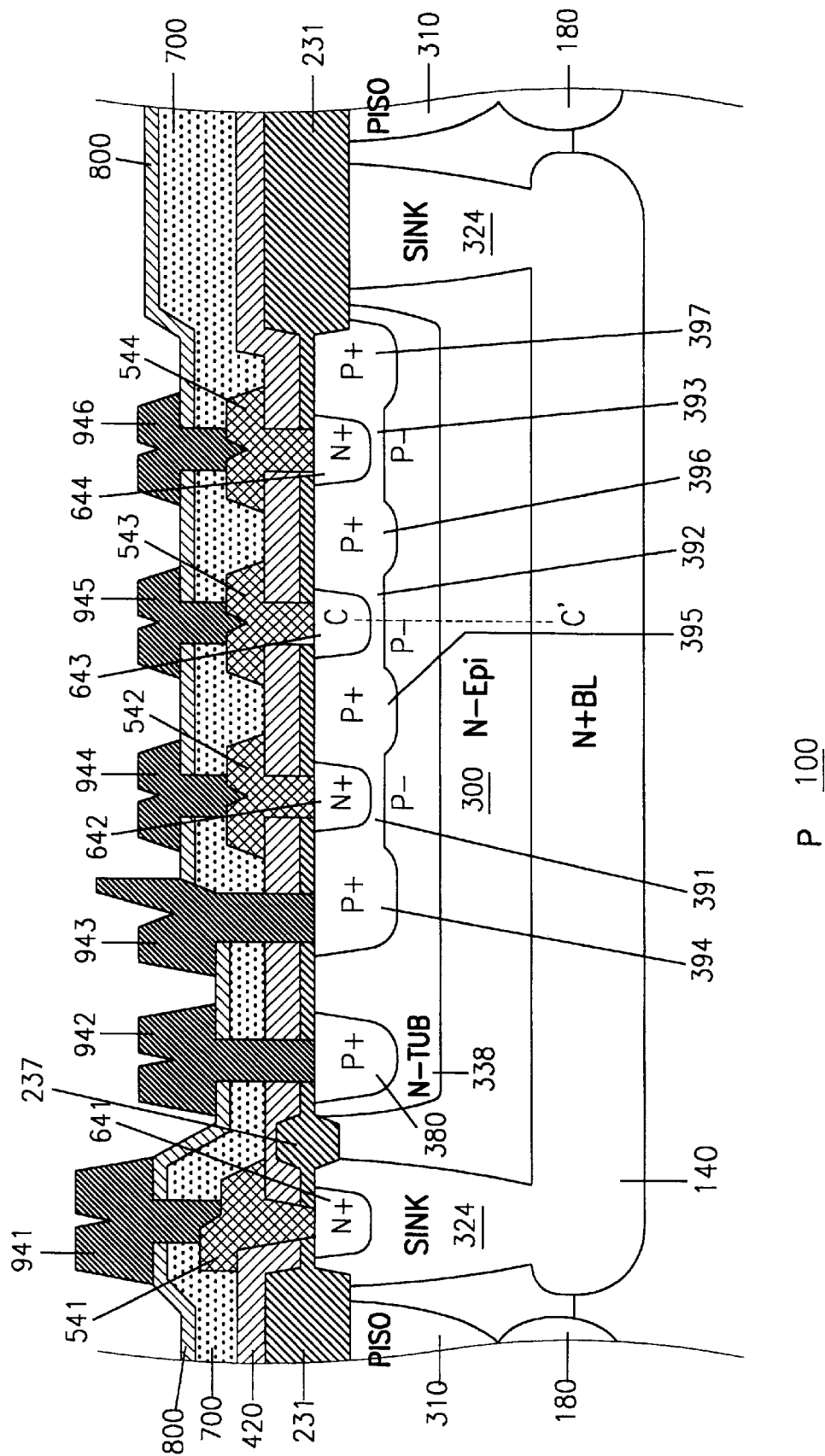

Next, structures of integrated injection logics according to embodiments of the present invention are described with reference to FIGS. 8A and 9A, and 8B and 9B. FIGS. 8A and 8B are layout diagrams of the masks and FIGS. 9A and 9B are sectional views of the I²L made by using the masks shown in FIGS. 8A and 8B, respectively.

An epitaxial layer 300 doped with low-density n type impurities is formed on a p type substrate 100, and an isolation region 310 and an isolating p+ type region 180 doped with high-density p type impurities defines an element region by surrounding a portion of the substrate 100 and the epitaxial layer 300. The isolation region 310 and the isolating p+ type region 180 isolate this device from other semiconductor devices formed on the same substrate. The isolation region 310 in the epitaxial layer 300 extends downward from the surface of the epitaxial layer, and the isolating p+ region 180 extends from the isolation layer 310 to the substrate 100.

An n+ buried layer 140 doped with high-density n type impurities is formed between the substrate 100 and the epitaxial layer 300 in the element region surrounded by the isolation region 310 and the isolating p+ region 180.

Several diffusion regions 324, 338, 380, 394–397, 641 and 642–644 are formed in the epitaxial layer 300 and extend downward from the surface of the epitaxial layer 300.

A ring-type sink region 324 doped with high density n type impurities in the epitaxial layer 300 is formed along the inner side of the isolation region 310, and extends to edges of the buried layer 140 along the edges of the buried layer 140 to be connected to the buried layer 140.

As shown in FIG. 9A, a tub region 338 doped with n type impurities is formed in the portion of the epitaxial layer 300 enclosed by the ring-type sink region 324 and separated from the sink region, and the impurity density of the tub region 338 is larger than that of the epitaxial layer 300 but smaller than that of the sink region 324. An injection region 380 doped with high density p type impurities is formed in the tub region 338.

An input region doped with p type impurities is formed in the epitaxial layer 300 and separated from the tub region 338 and the sink region, and the input region includes three p− regions 391, 392 and 393 doped with low density p type impurities and a p+ region 394, 395, 396 and 397 doped with high density p type impurities. The p− regions 391, 392 and 393 are separated from one another, and surrounded by the p+ region 394, 395, 396 and 397. The impurity density of the p+ region 394, 395, 396 and 397 is substantially the same as that of the injection region 380. Collector regions 642, 643 and 644 doped with high density n type impurities are formed in the p− regions 391, 392 and 393 respectively.

The structure shown in FIG. 9B is different from that shown in FIG. 9A. That is, in FIG. 9B, the input region and the collector regions are formed in the tub region 338, while only the injection region 380 is in the tub region 338 as shown in 9A. In addition, the impurity density of the p− regions are different in FIGS. 9A and 9B. In the structure shown in FIG. 9A, the p− regions 391, 392 and 392 have lower impurity density compared with the ordinary impurity density of p− regions in ordinary bipolar transistors, for example, the intrinsic region 341 of the vertical pnp bipolar transistor shown in FIG. 3 and the p− regions 361 and 371 of the lateral pnp bipolar transistor shown in FIG. 5. However, the impurity density in FIG. 9B is substantially the same as ordinary p− regions. It is now described with reference to FIG. 9C.

Figure 9C:
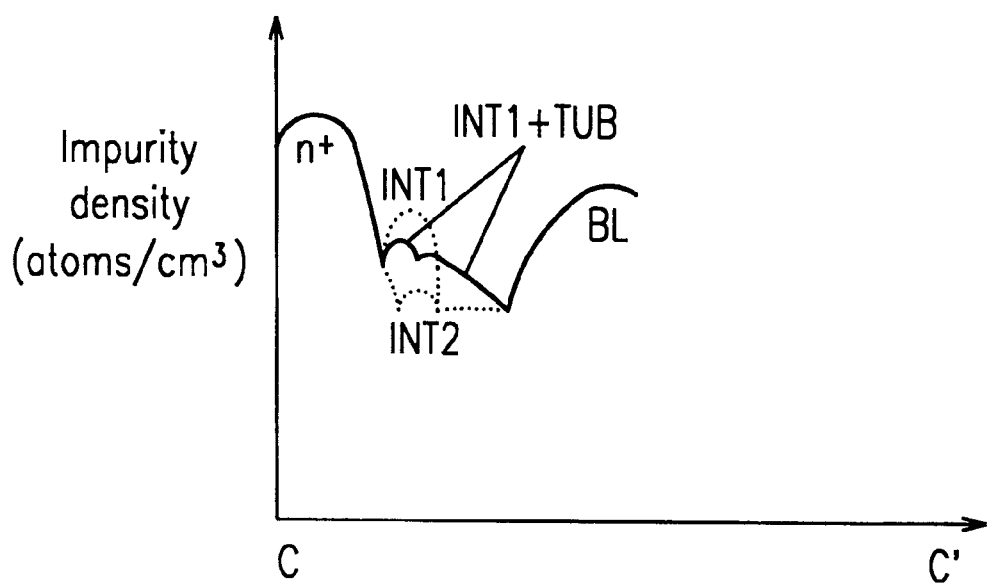
FIG. 9C shows impurity density distributions in the $I^2L$ shown in FIGS. 9A and 9B with respect to the position along the line C–C' in FIGS. 9A and 9B.

FIG. 9C shows impurity density distribution along the line C–C' shown in FIG. 9A and 9B, where three cases are shown. The first case (INT1) is that the tub region 338 is separated from the p− regions 391, 392 and 393 and the impurity density of the p− regions 391, 392 and 393 is ordinary, the second case (INT2) is that the tub region 338 is separated from the p− regions 391, 392 and 393 and the impurity density of the p− regions 391, 392 and 393 is very low, and final case (INT1+TUB) is that the p− regions 391, 392 and 393 are formed in the tub region 338 and impurity density of the p− regions 391, 392 and 393 is ordinary. As shown in FIG. 9C, the second case (INT2) obtains effective device performance since the current from the buried layer 140 easily flows into the collector regions 642, 643 and 644. The third case (INT1+TUB) also obtains sufficiently effective device behavior, since the width of the p− regions 391, 392 and 393 is reduced, (furthermore, the impurity density is slightly lowered compared with the first case) and the density slope is slow.

The collector regions 642, 643 and 644 generally have rectangular shape, and it is preferable that the longitudinal sides are larger than the horizontal sides by 1–1.5 times. Another preferable example is the shape having up-down and left-right symmetry. Such a shape minimizes loss of the portion when the collector regions are misaligned with adjacent regions.

The number of the collector regions is three in this embodiment, but the number can be varied.

As shown in FIGS. 9A and 9B, the p+ region 397 and/or the tub region 338 are sandwiched between the n+ collector region 644 and the epitaxial layer 300. This causes the leakage current between the sink region 324 or the epitaxial layer 300 and the n+ region 644 to be reduced and reduces the pinch resistance. Accordingly, the n+ region 644 and the sink regions can be much closer, and thereby the size of the device can be reduced.

In the meantime, since the resistance of the p− regions 391, 392 and 393 which are located under the collector regions 642, 643 and 644 reaches tens of thousands k Ω, it may be hard to transmit electrical signals through the p− regions 391, 392 and 393. The structure of the p+ region 394, 395, 396 and 397 which surrounds the collector regions 642, 643 and 644 enables the electrical signals from the input region to flow into the collector regions through the p+ regions 394, 395, 396 and 397 with reduced interference and loss. Therefore, the number of the collector regions can be increased compared with the conventional structure, and, for example, the number may become six.

A n+ region 641 doped with high-density n type impurities is formed in the sink region 324.

Thin pad oxide layers 240 are formed on a portion of the epitaxial layer 300 surrounded by the ring-type sink region 324, and on a portion of the epitaxial layer 300 where the sink region 324 is formed, respectively. The remaining portions of the epitaxial layer 300 are covered with a thick oxide layer 231 and 237 made by LOCOS method, in particular, on the portion of the epitaxial layer 300 between the sink region 324 and the tub region 338. An insulating layer such as a low temperature oxide (LTO) layer 420 is formed on the pad oxide layers 240 and the thick oxide layer 231 and 237. The LTO layer 420, if necessary, may be abbreviated.

The LTO layer 420 and the pad oxide layer 240 have contact holes which expose the n+ region 641 and the collector regions 642, 643 and 644 respectively, and a ground polysilicon electrode 541 and collector polysilicon electrodes 542, 543 and 544 are formed in the contact holes to be in electrical contact with the n+ region 642 and the collector regions 642, 643 and 644, respectively. An insulating layer such as an LTO layer 700 is formed on the polysilicon electrodes 541, 542, 543 and 544 and on the LTO layer 420, and an insulating layer such as a silicon nitride layer 800 is formed thereon. The nitride layer 800 may be deleted in this device. The nitride layer 800 and the LTO layer 700 have contact holes which expose the polysilicon electrodes 541, 542, 543 and 544, and a ground metal electrode 941 and collector metal electrodes 944, 945 and 946 are formed in the contact holes to be in electrical contact with the ground polysilicon electrode 541 and the collector polysilicon electrodes 542, 543 and 544, respectively. In addition, the nitride layer 800, the LTO layers 700 and 420 and the pad oxide layer 240 have contact holes which expose the injection region 380 and the p+ region 394 of the input region, and an injection and an input metal electrodes 942 and 943 are formed in the contact holes to be in electrical contact with the injection and the input regions 380 and 394.

Figure 10:
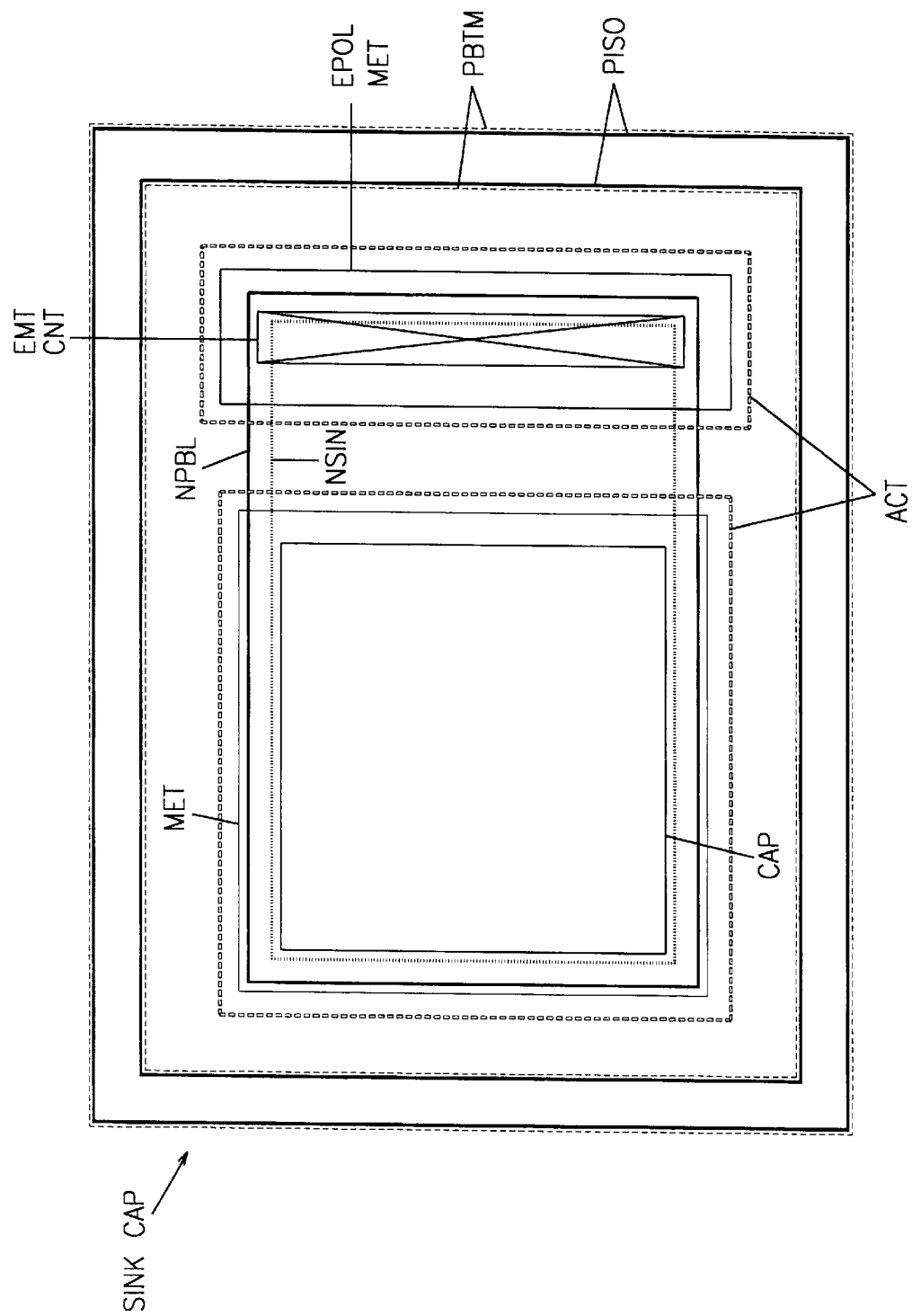
FIG. 10 shows a mask layout for manufacturing a diffusion capacitor SINK CAP according to an embodiment of the present invention.
Figure 11:
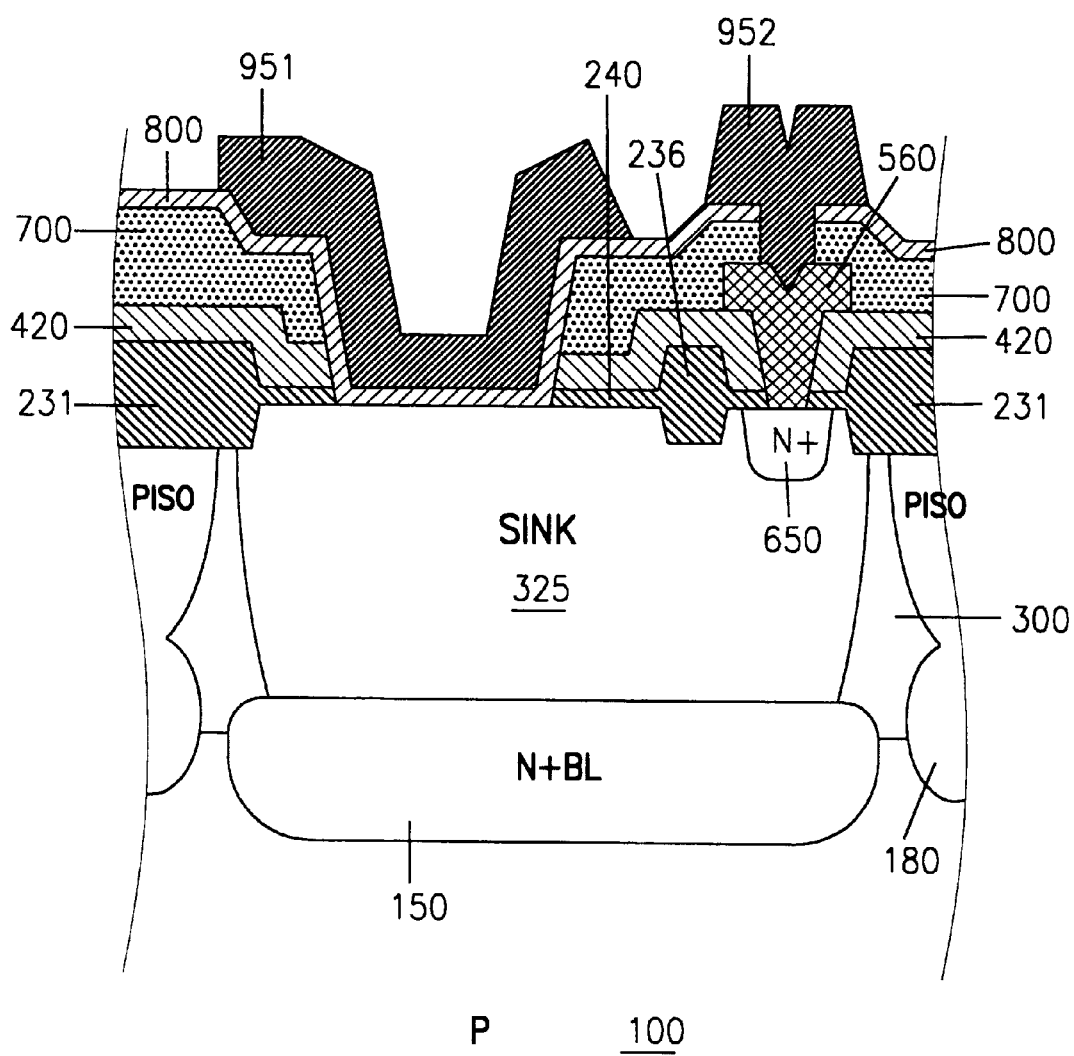
FIG. 11 is a sectional view of a diffusion capacitor manufactured by using the masks shown in FIG. 10.

Next, a diffusion capacitor according to an embodiment of the present invention is described with reference to FIGS. 10 and 11 which are a layout diagram of the masks and a sectional view of the capacitor, respectively.

An epitaxial layer 300 doped with low-density n type impurities is formed on a p type substrate 100, and an isolation region 310 and an isolating p+ type region 180 doped with high-density p type impurities defines an element region by surrounding a portion of the substrate 100 and the epitaxial layer 300. The isolation region 310 and the isolating p+ type region 180 isolate this device from other semiconductor devices formed on the same substrate. The isolation region 310 in the epitaxial layer 300 extends downward from the surface of the epitaxial layer, and the isolating p+ region 180 extends from the isolation layer 310 to the substrate 100.

An n+ buried layer 150 doped with high-density n type impurities is formed between the substrate 100 and the epitaxial layer 300 in the element region surrounded by the isolation region 310 and the isolating p+ region 180.

A sink region 325 doped with high-density n type impurities is formed in the epitaxial layer 300 and extends from the surface of the epitaxial layer 300 to the buried layer 150. A n+ region 650 which has higher n type impurity density than the sink region 321 is formed in the sink region 325.

Thin pad oxide layers 240 are formed on the portions of the epitaxial layer 300 where the sink region 325 is formed, and the remaining portions of the epitaxial layer 300 are covered with a thick oxide layer 231 and 236 made by LOCOS method. In addition, the thick oxide layer 236 is formed on the portion of the epitaxial layer 300 between the n+ region 650 and the remaining portion of the sink region 325. An insulating layer such as a low temperature oxide (LTO) layer 420 is formed on the pad oxide layers 240 and the thick oxide layer 231 and 236. The LTO layer 420, may be eliminated if desired.

The LTO layer 420 and the pad oxide layers 240 have a contact hole which expose the n+ region 650, and a polysilicon electrode 560 is formed in the contact hole to be in electrical contact with the n+ region 650. An insulating layer such as an LTO layer 700, which may be eliminated, is formed on the polysilicon electrode 560 and the LTO layer 420, and the LTO layers 700 and 420 and the pad oxide layer 240 have a first contact hole which exposes a portion of the sink region 325. The first contact hole is covered with an insulating layer such as a silicon nitride layer 800 formed thereon. The nitride layer 800 and the LTO layer 700 have a second contact hole which exposes the polysilicon electrode 560, and a metal electrode 952 is formed in the second contact hole to be in electrical contact with the polysilicon electrode 560. Furthermore, another metal electrode 951 is formed on the nitride layer 800 on the first contact hole.

Figure 12:
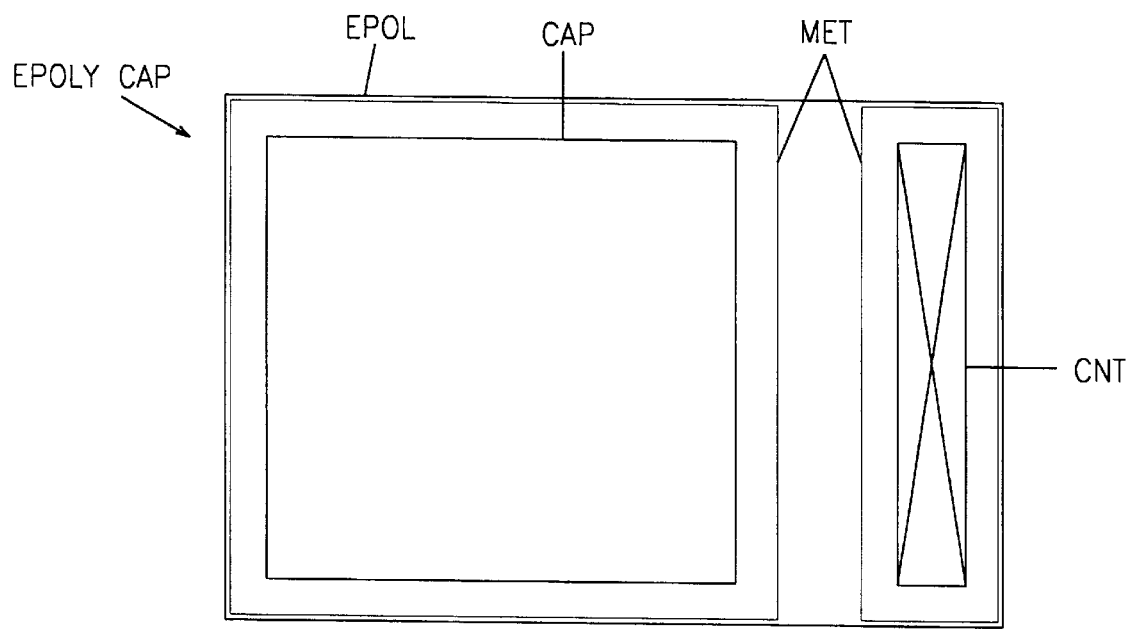
FIG. 12 shows a mask layout for manufacturing a polysilicon capacitor EPOLY CAP according to an embodiment of the present invention.
Figure 13:
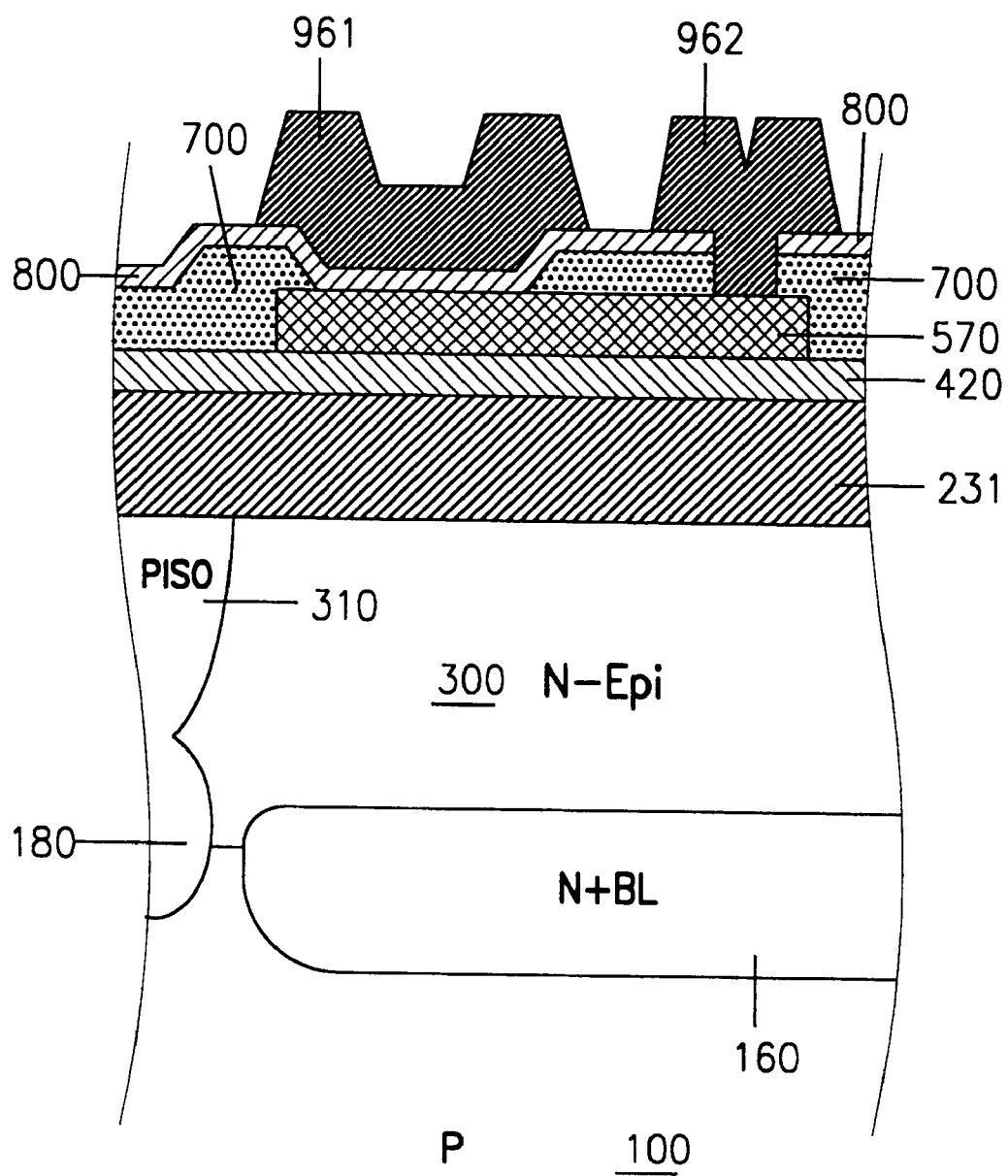
FIG. 13 is a sectional view of a polysilicon capacitor manufactured by using the masks shown in FIG. 12.
Figure 14B:
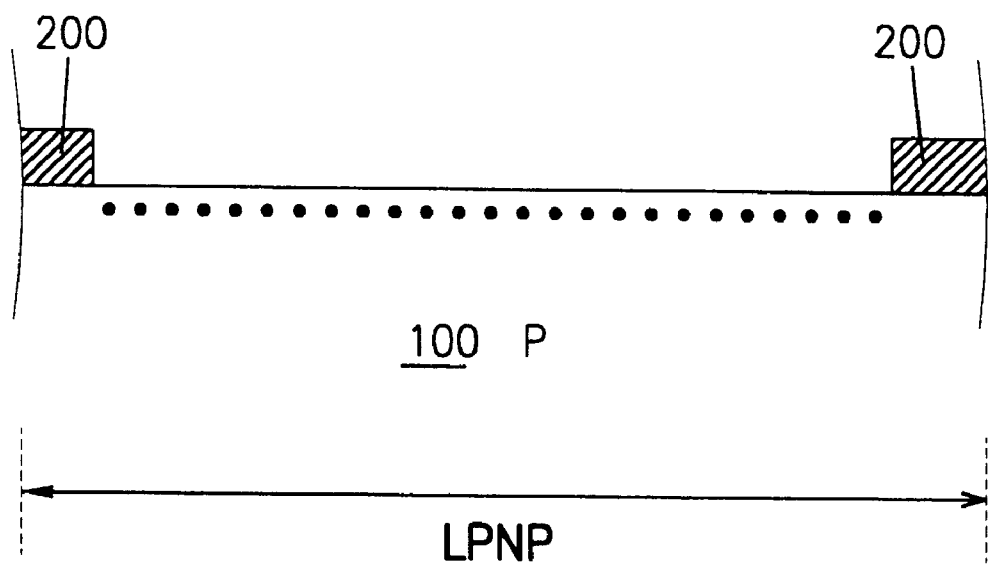
FIGS. 14A–33D are sectional views of the intermediate structures of a complementary bipolar transistor during the manufacturing process thereof according to an embodiment of the present invention.
Figure 14C:
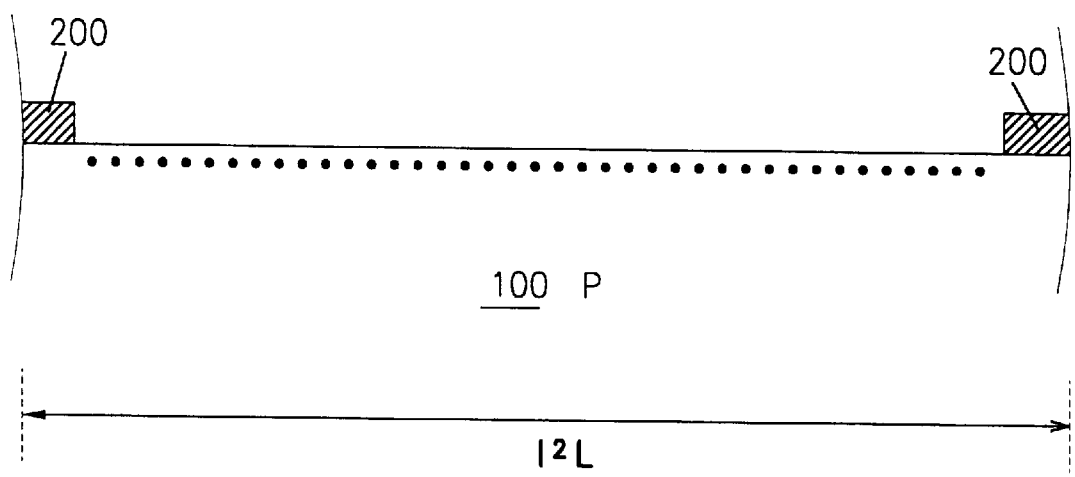
Figure 14D:
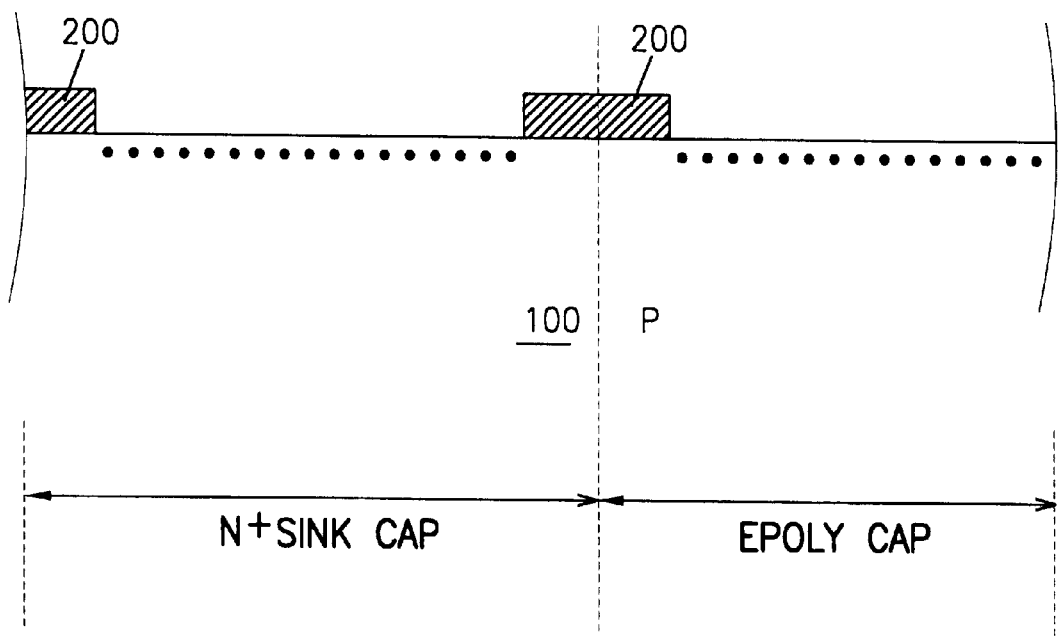
Figure 15B:
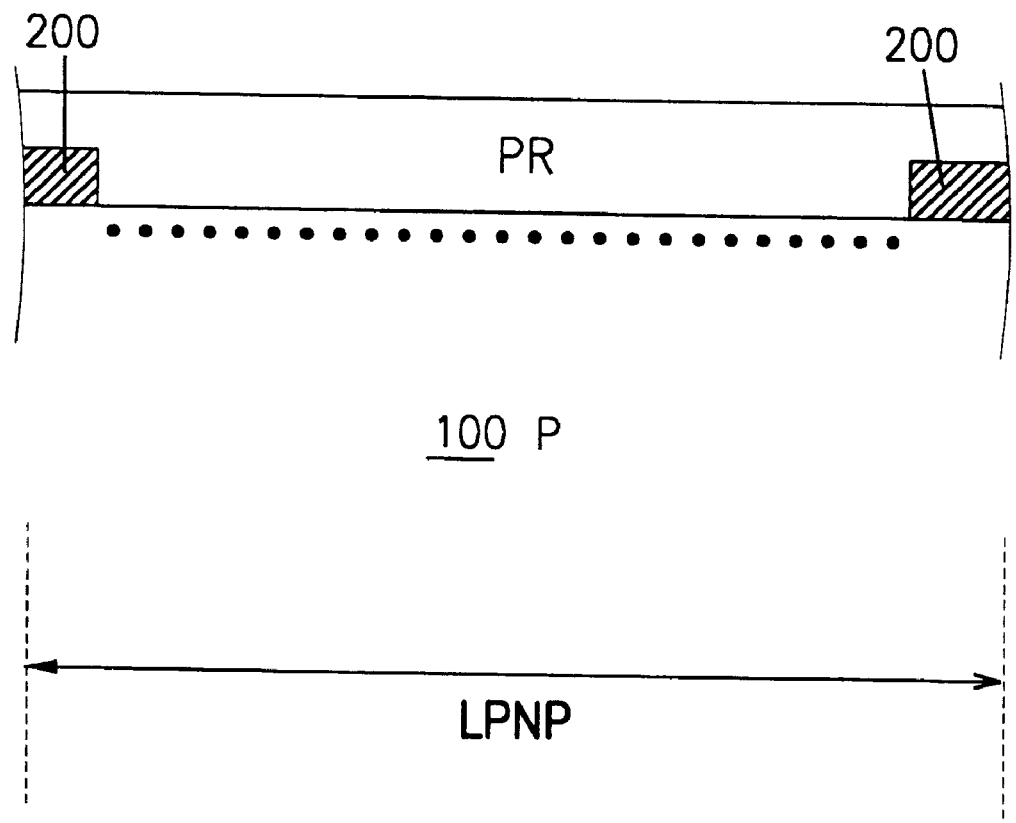
Figure 15C:
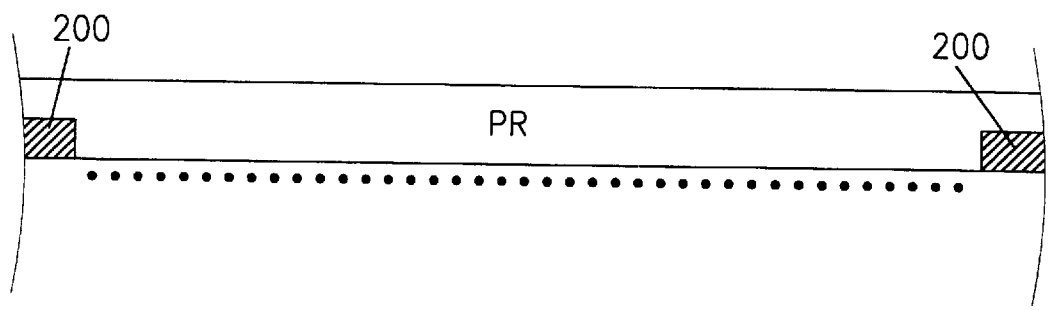
Figure 15C:
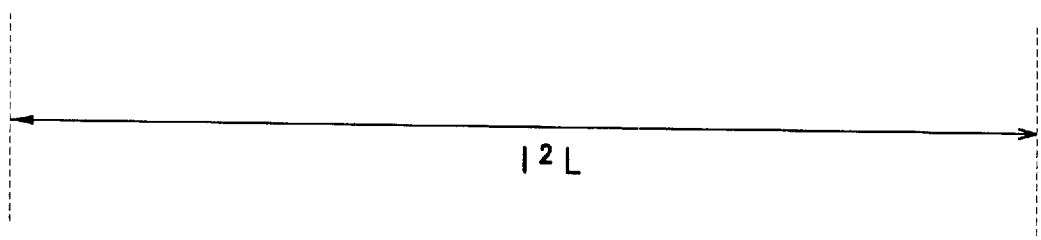
Figure 15D:
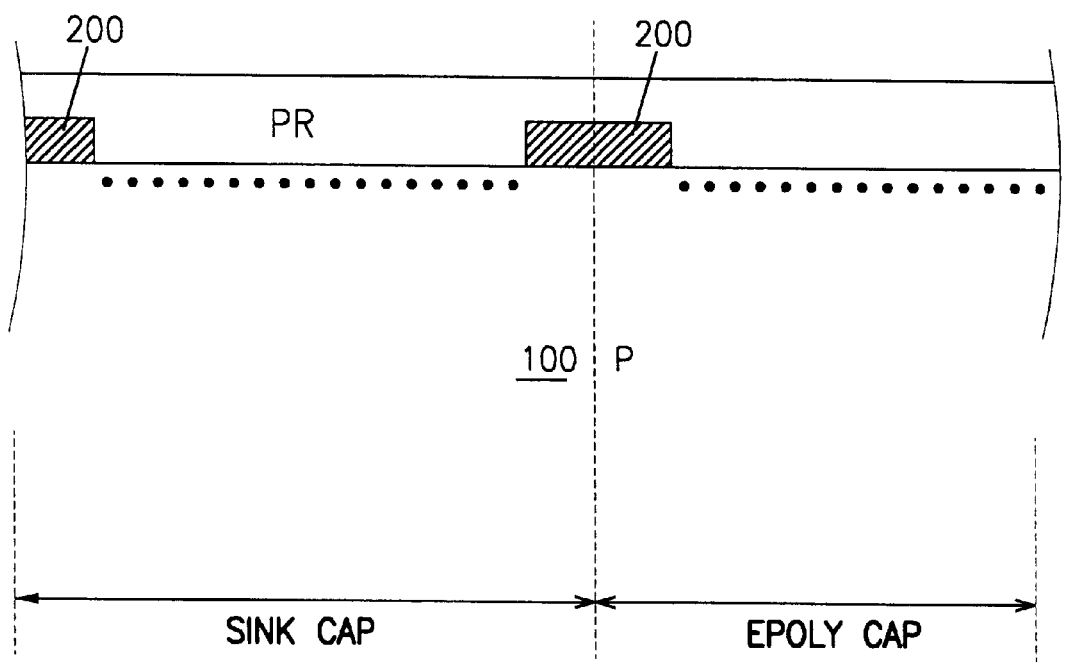
Figure 16A:
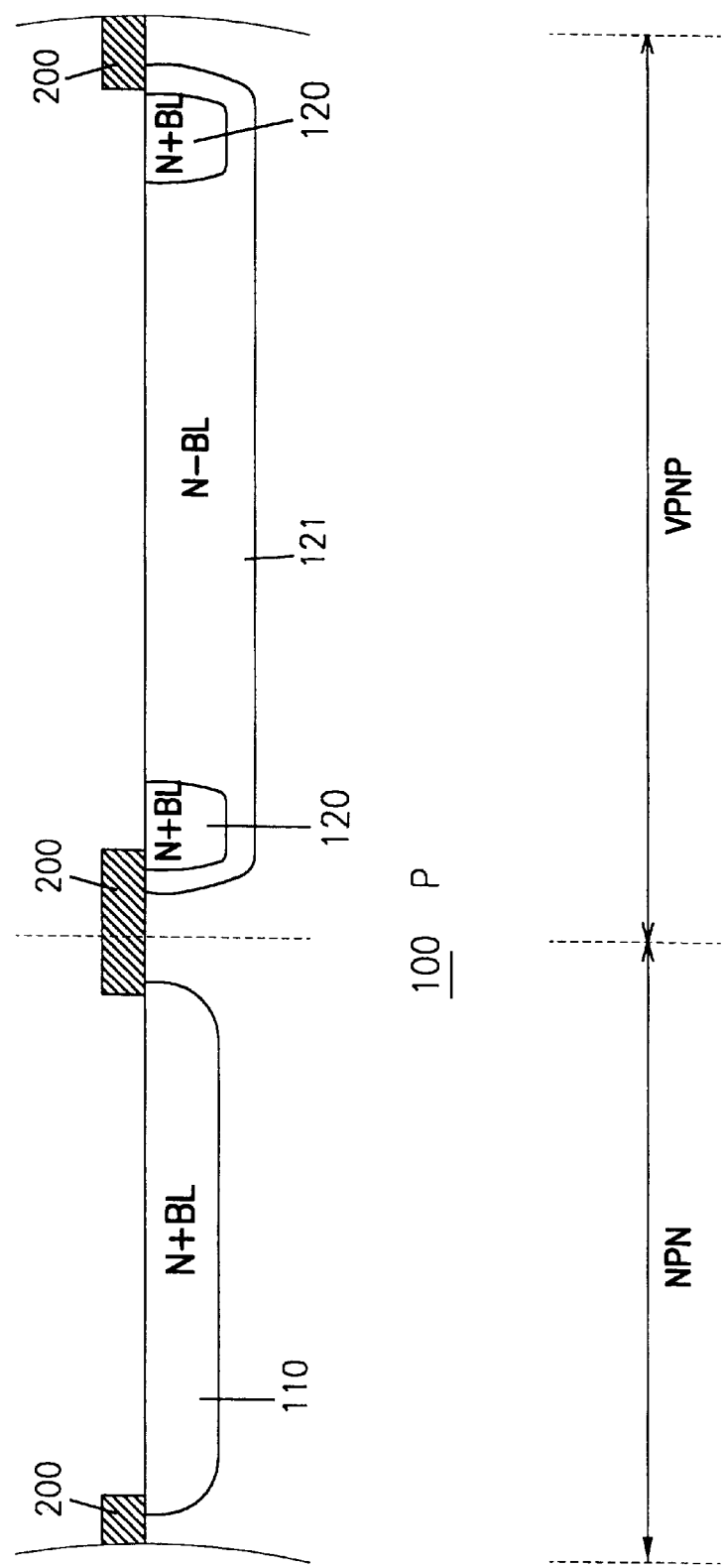
Figure 16B:
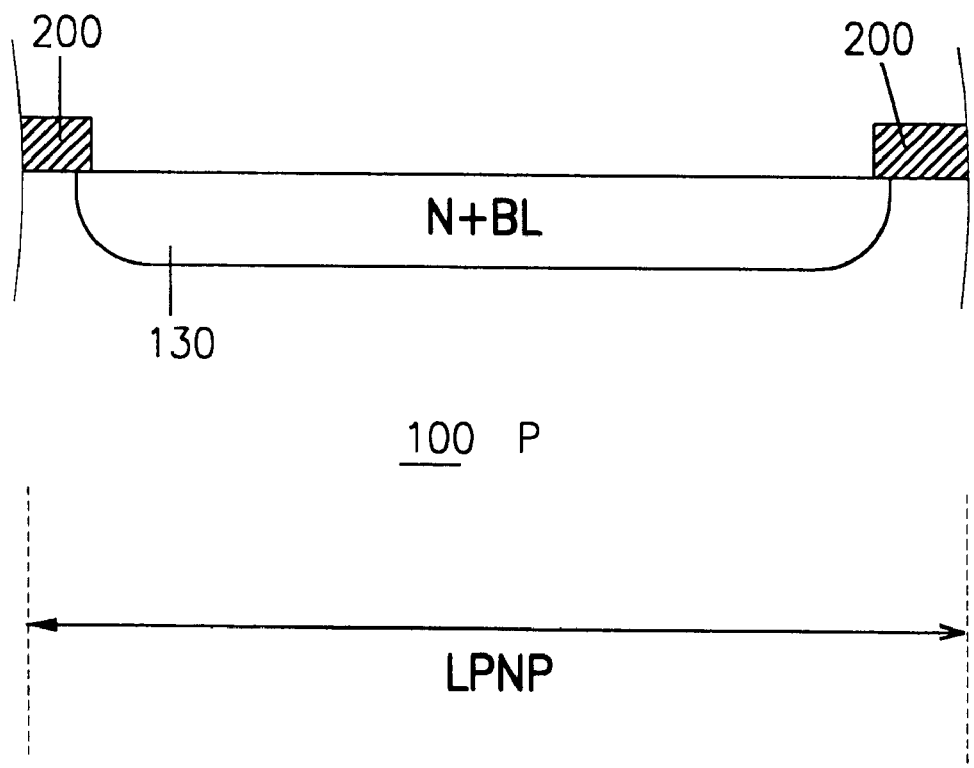
Figure 16C:
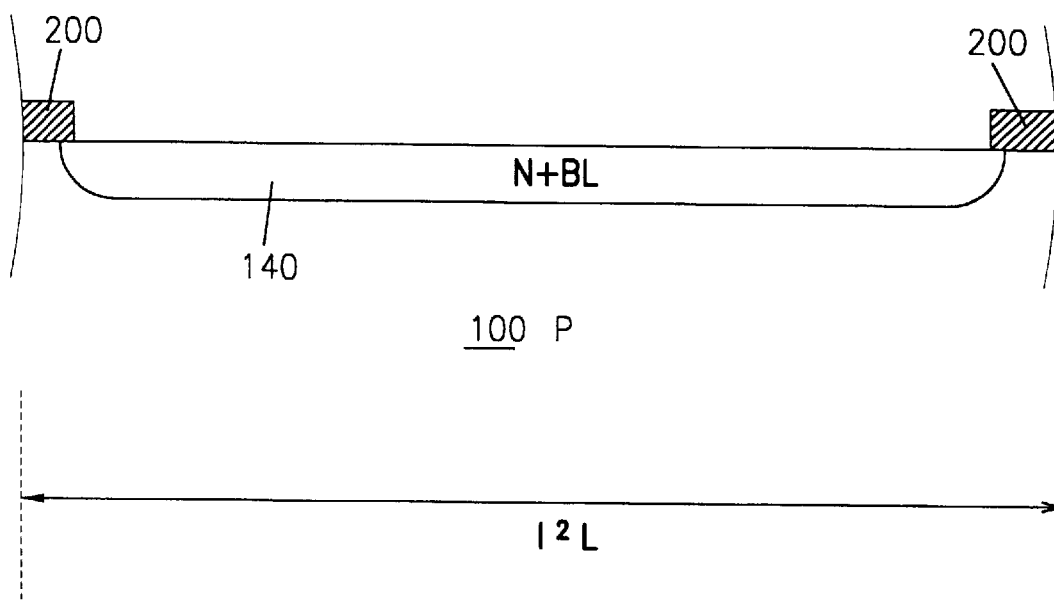
Figure 16D:
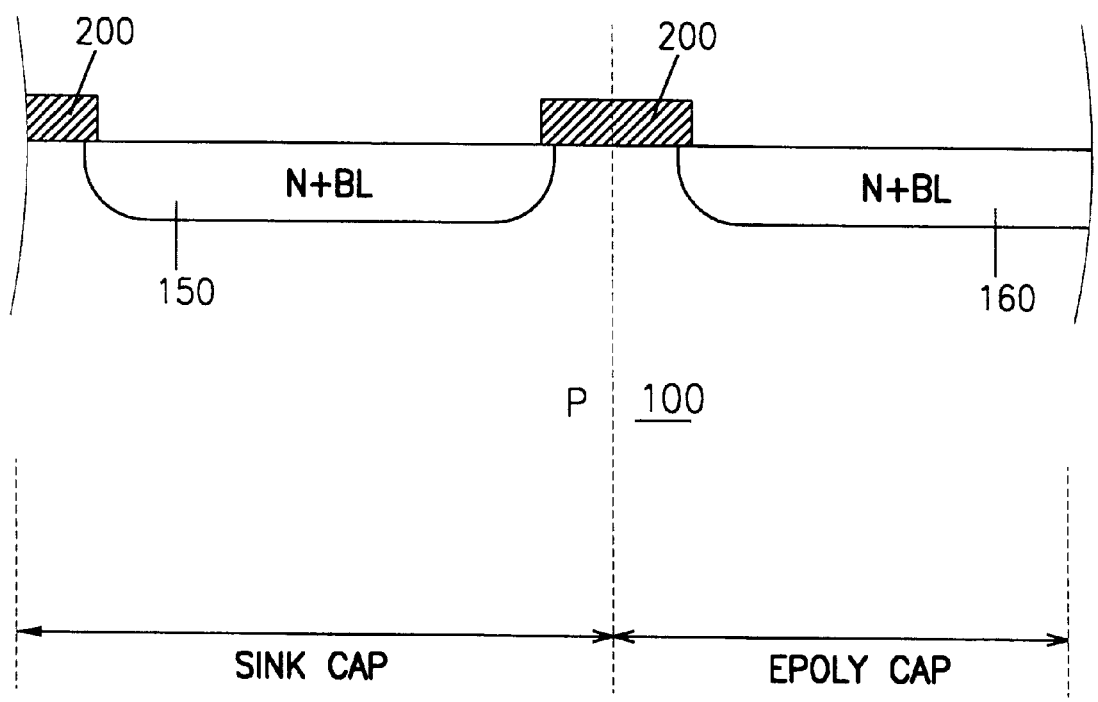
Figure 17B:
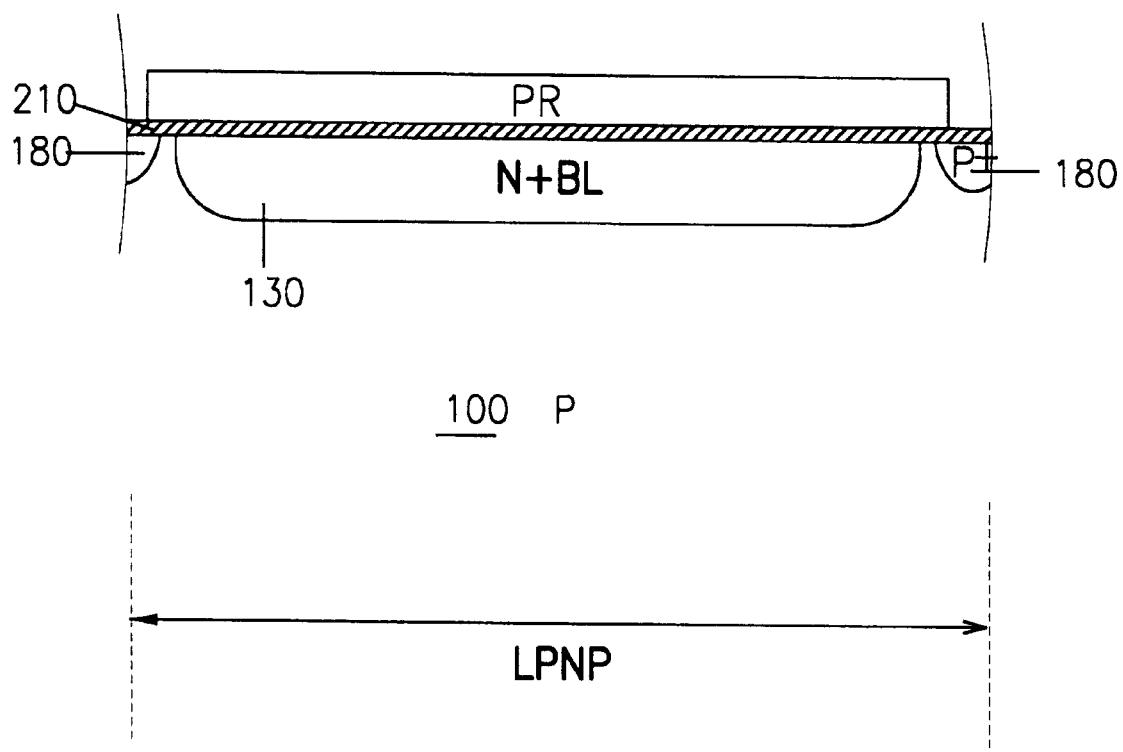
Figure 17C:
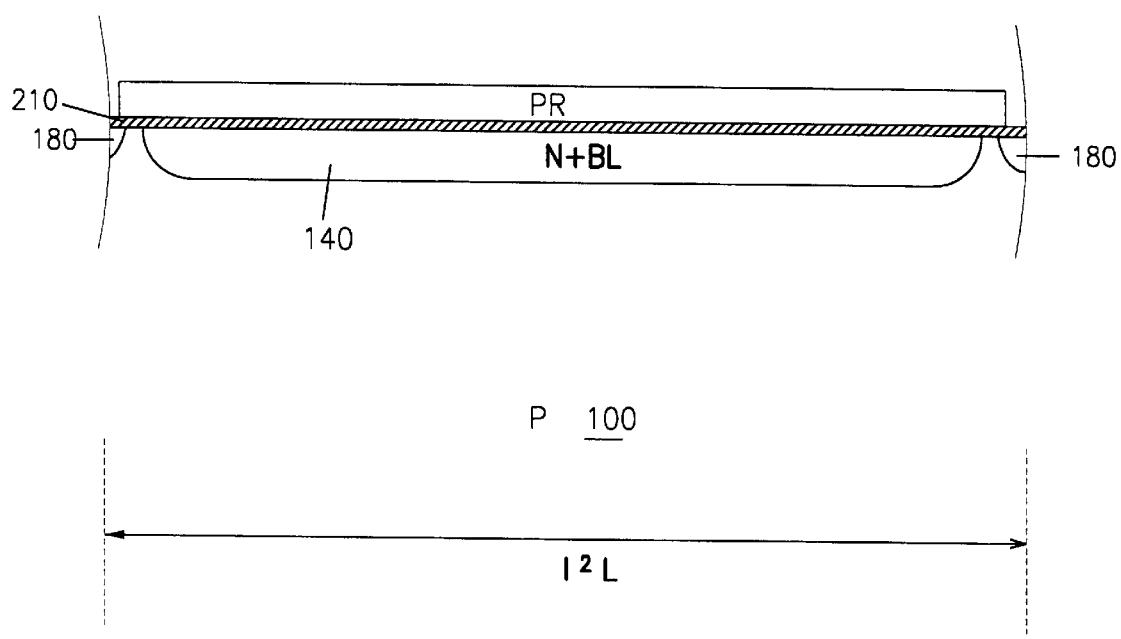
Figure 17D:
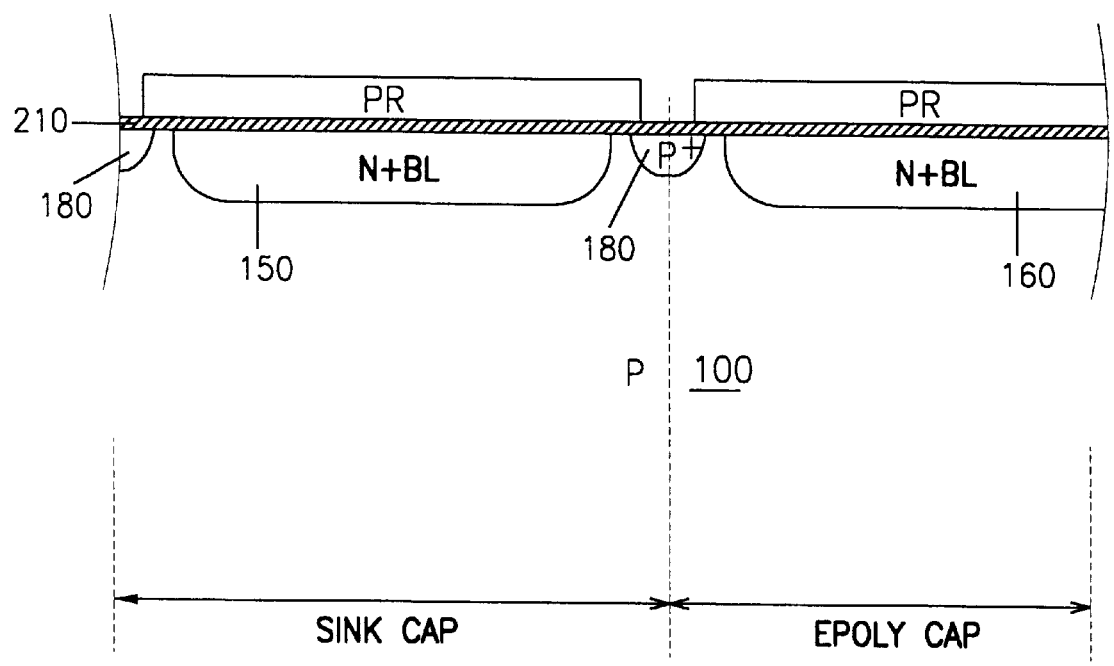
Figure 18B:
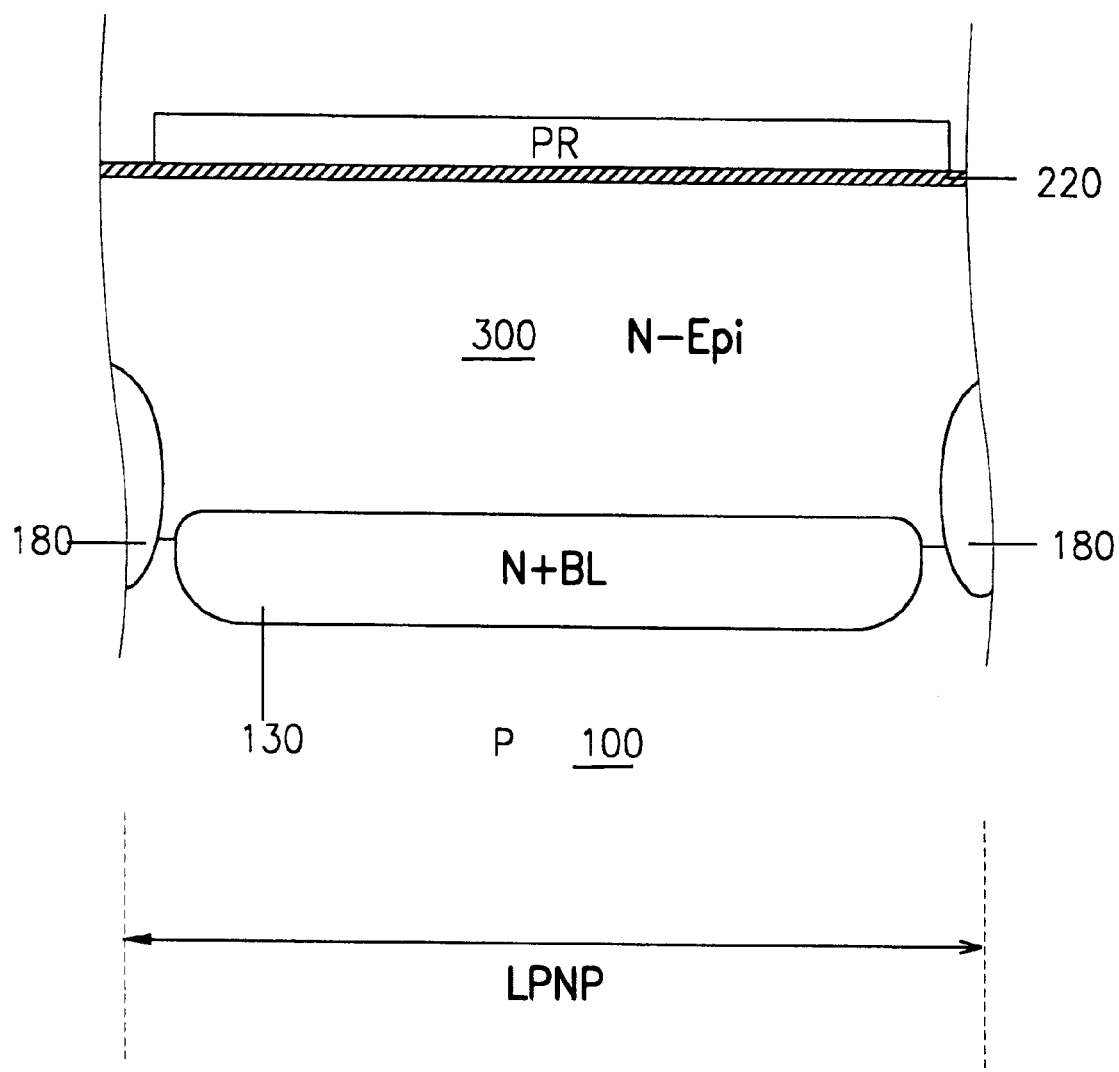
Figure 18C:
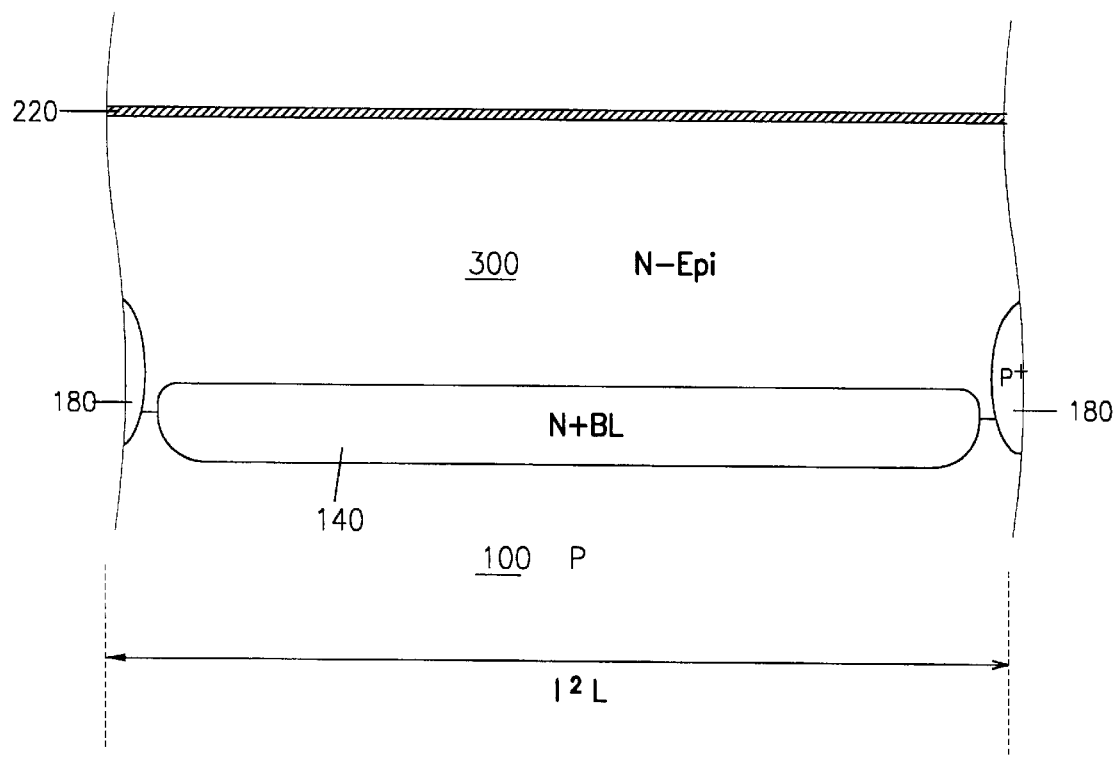
Figure 18D:
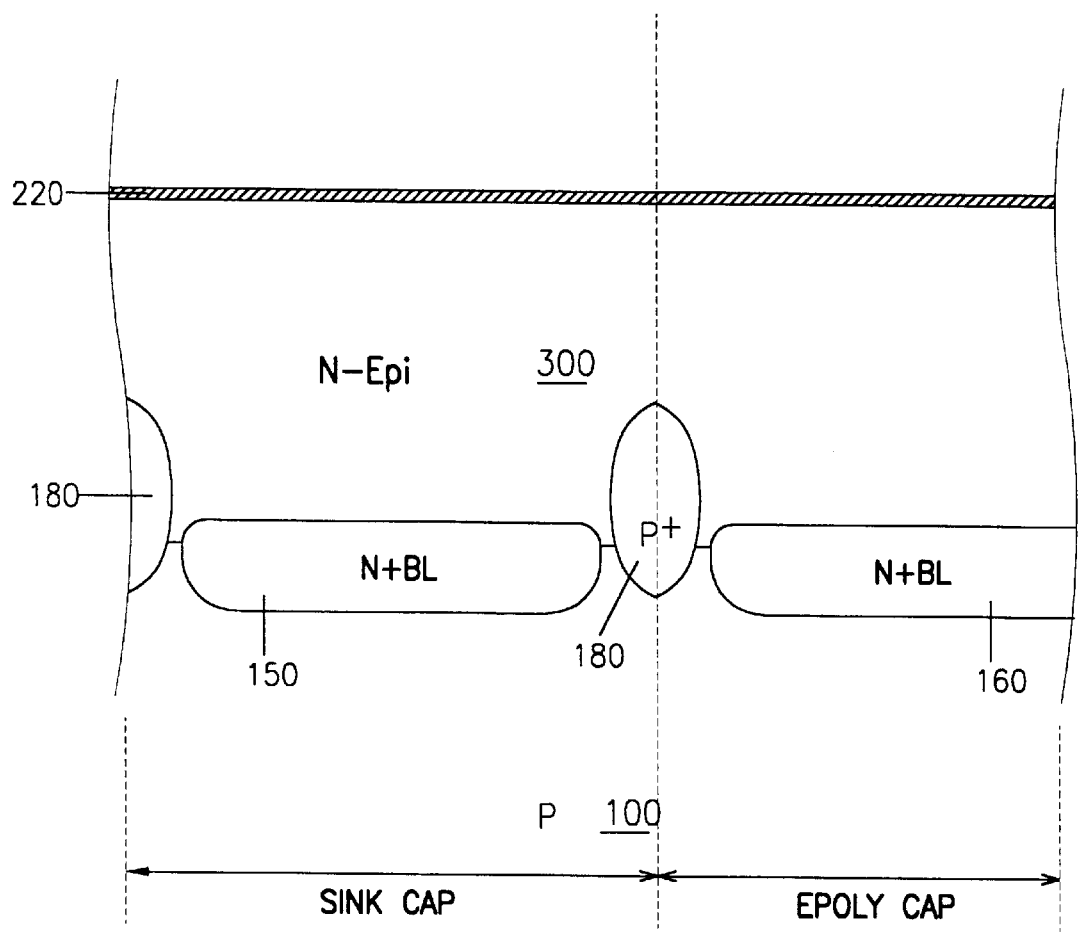
Figure 19A:
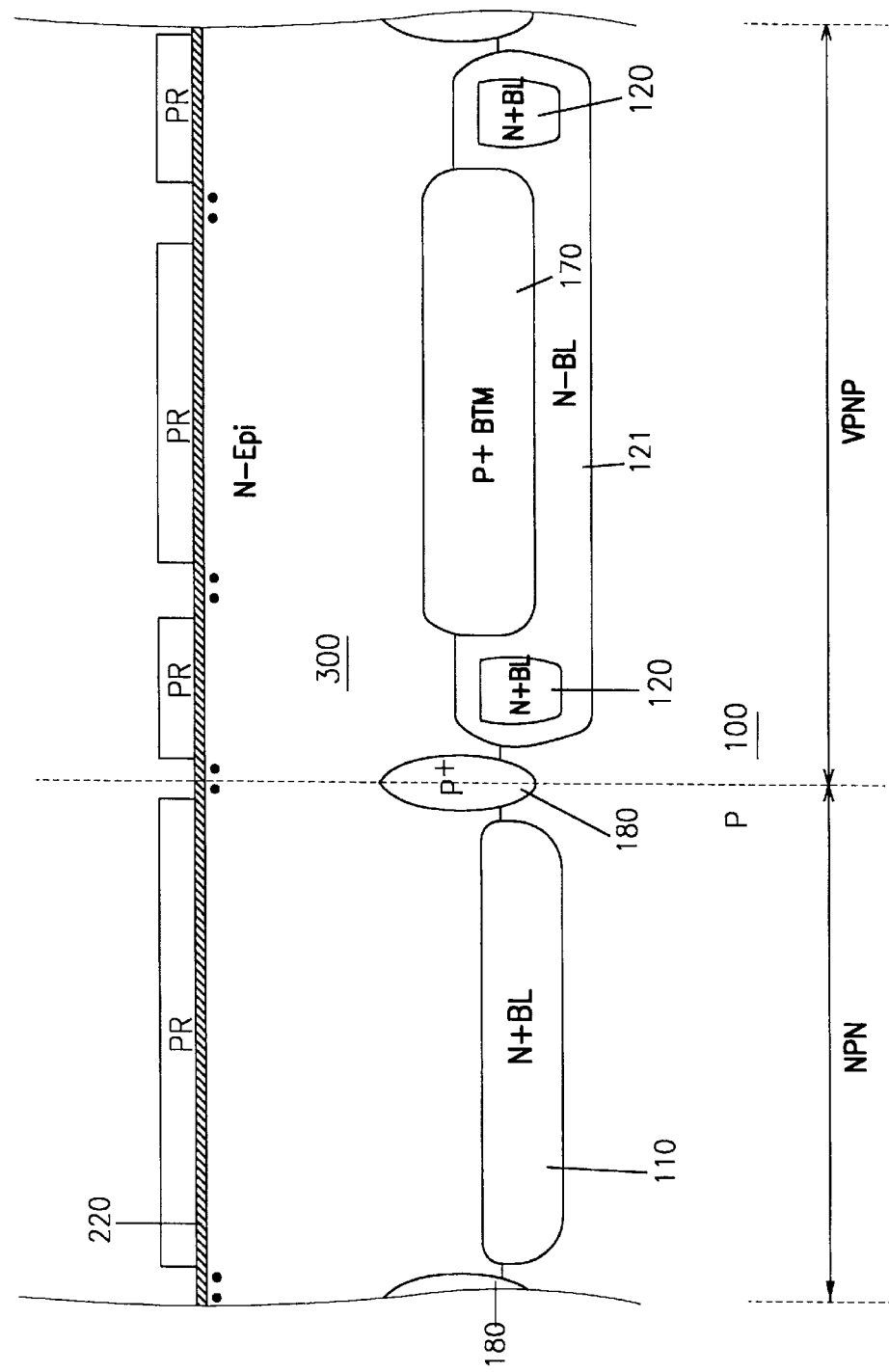
Figure 19B:
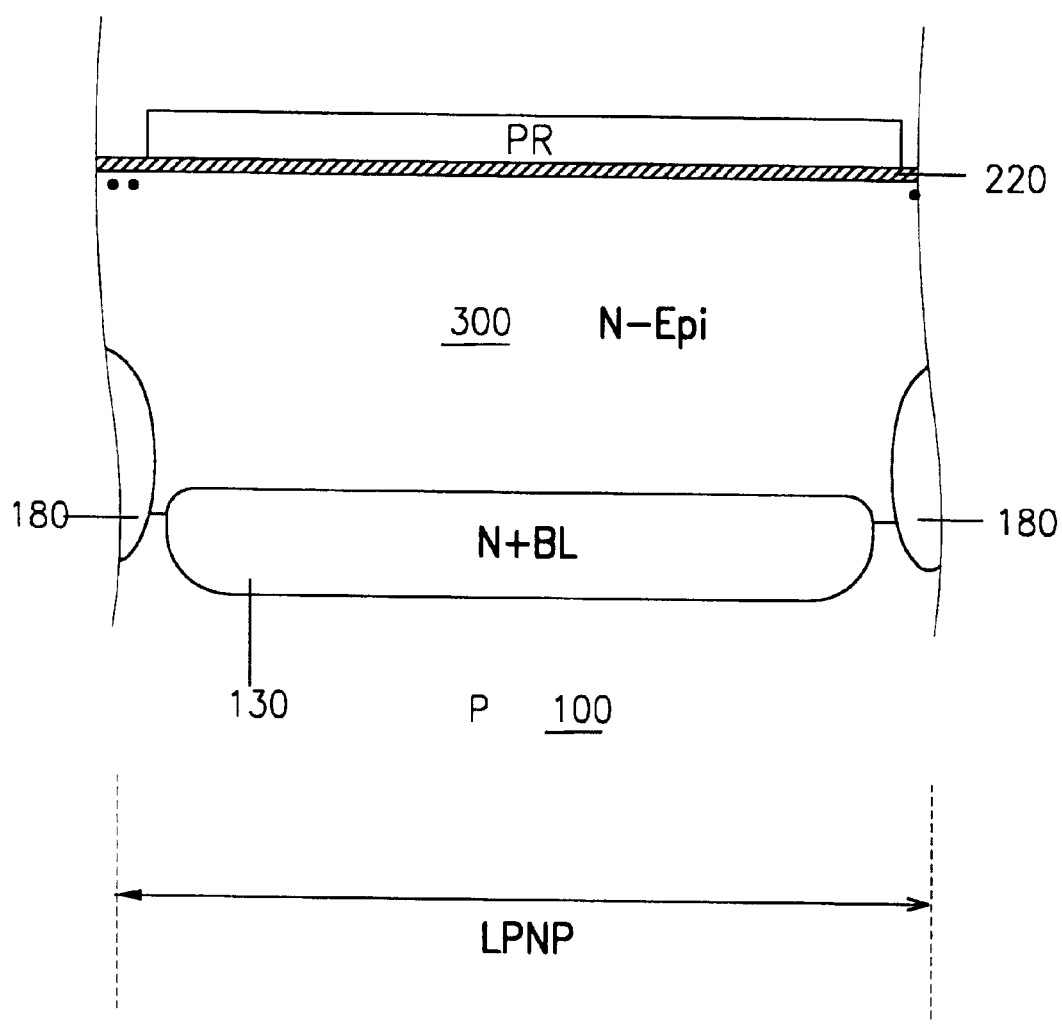
Figure 19C:
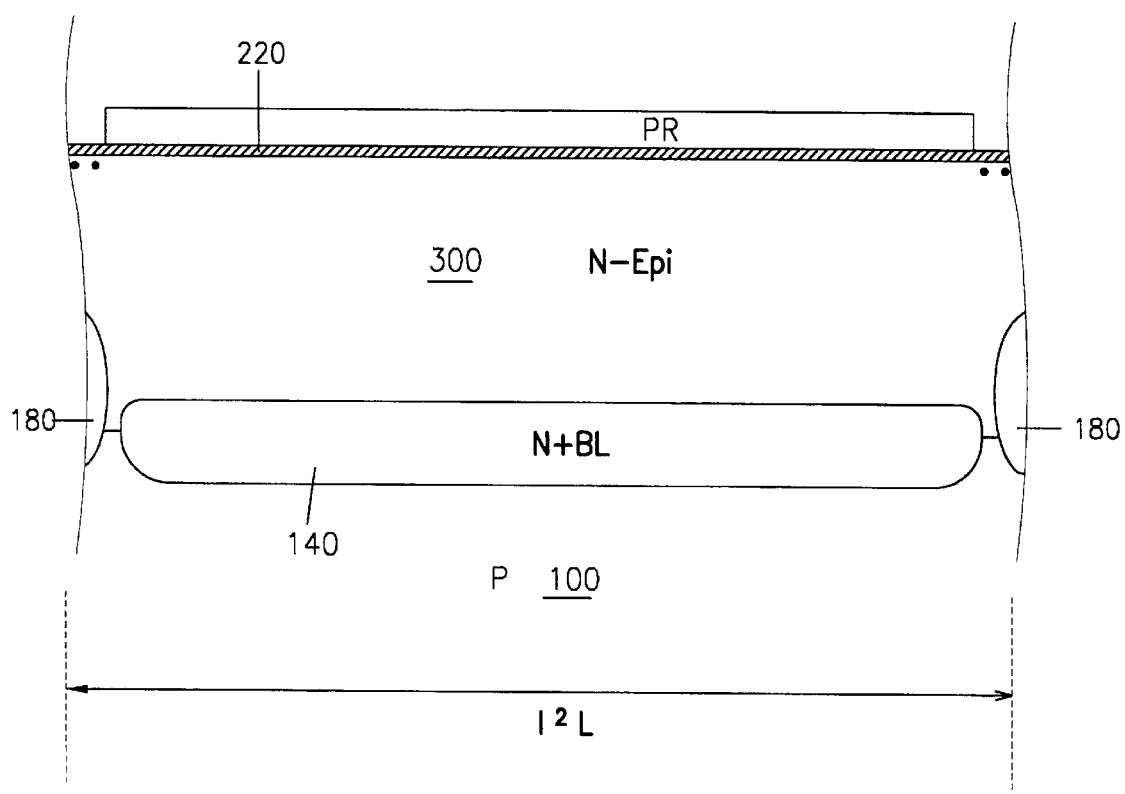
Figure 19D:
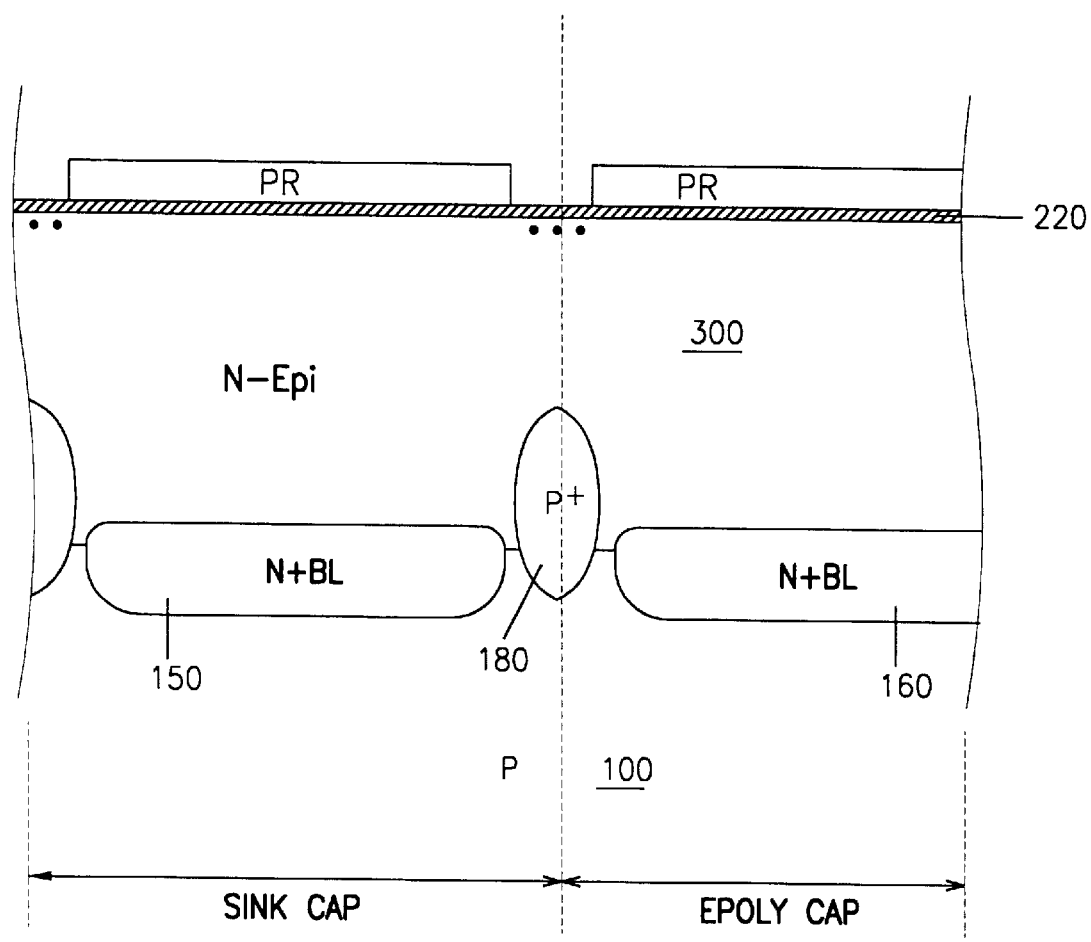
Figure 20B:
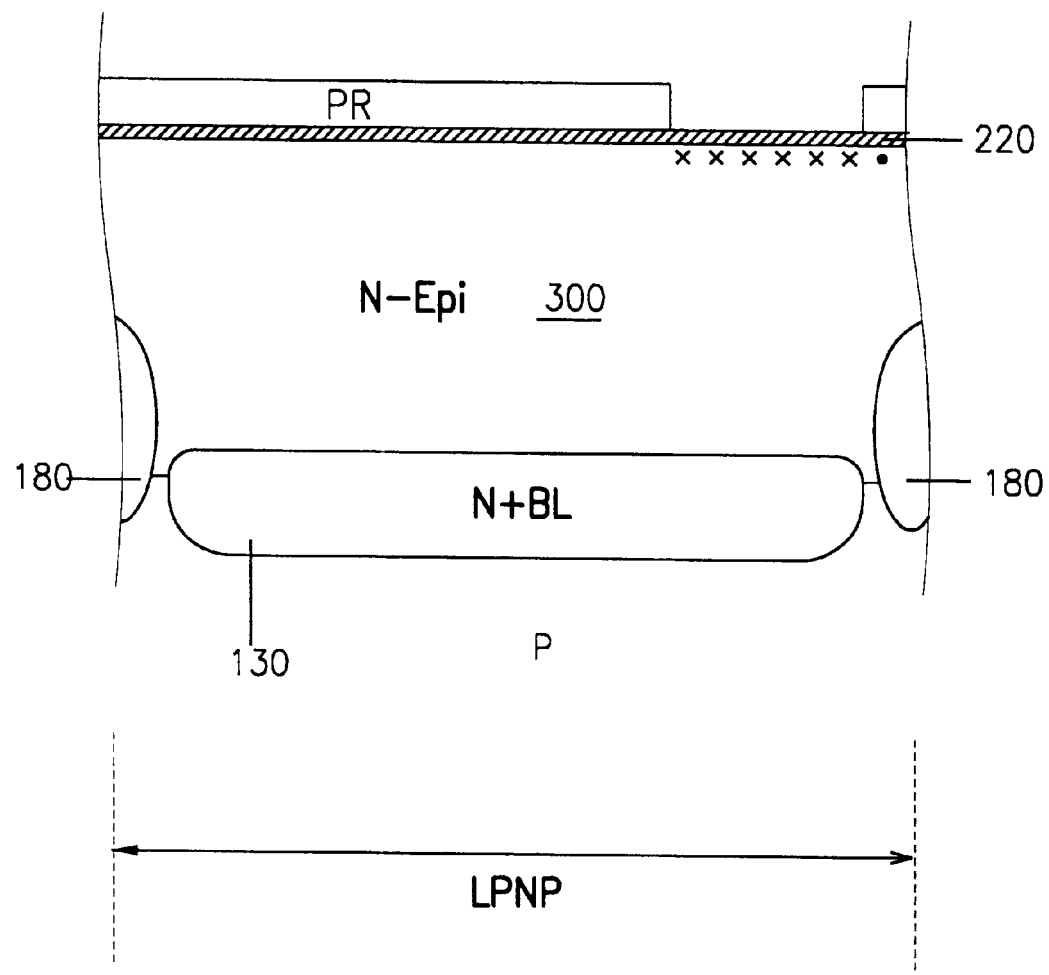
Figure 20C:
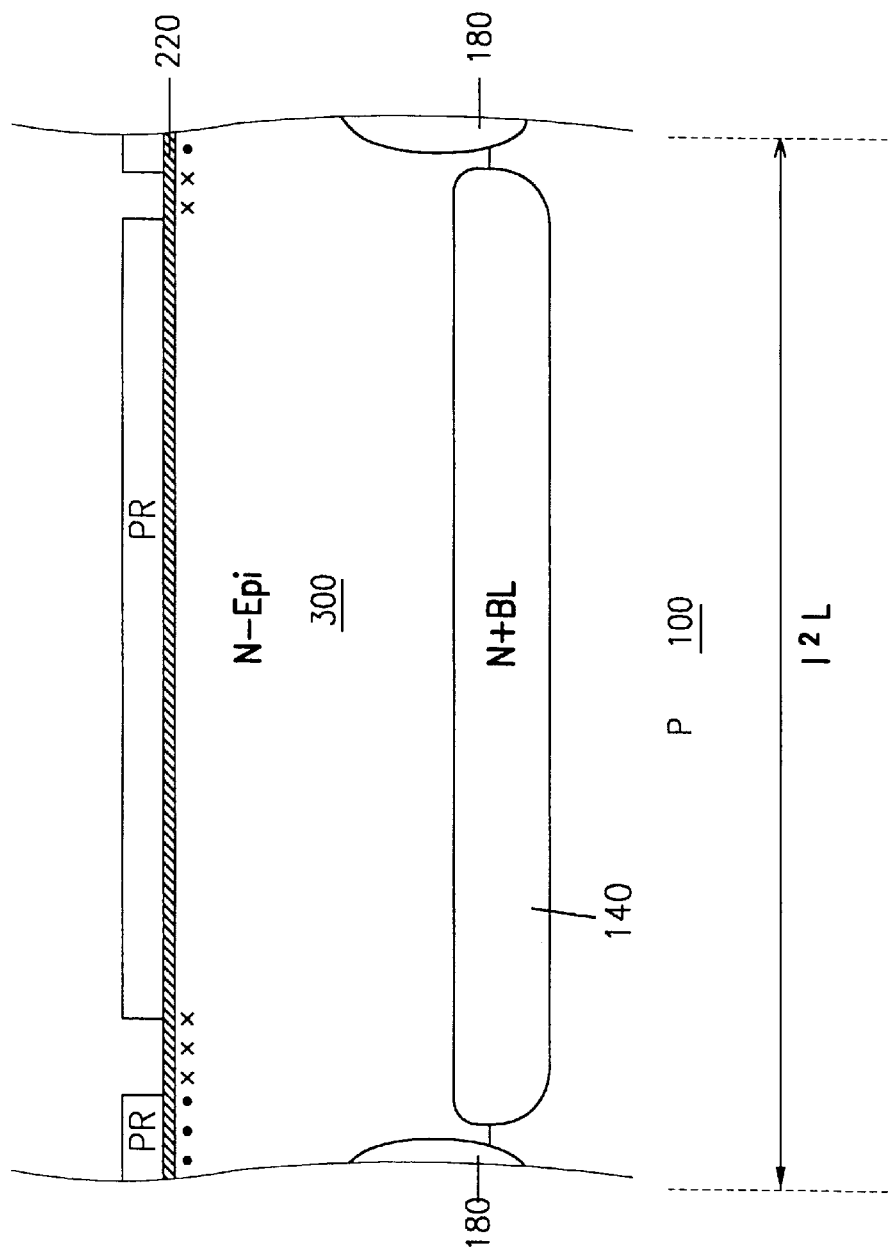
Figure 20D:
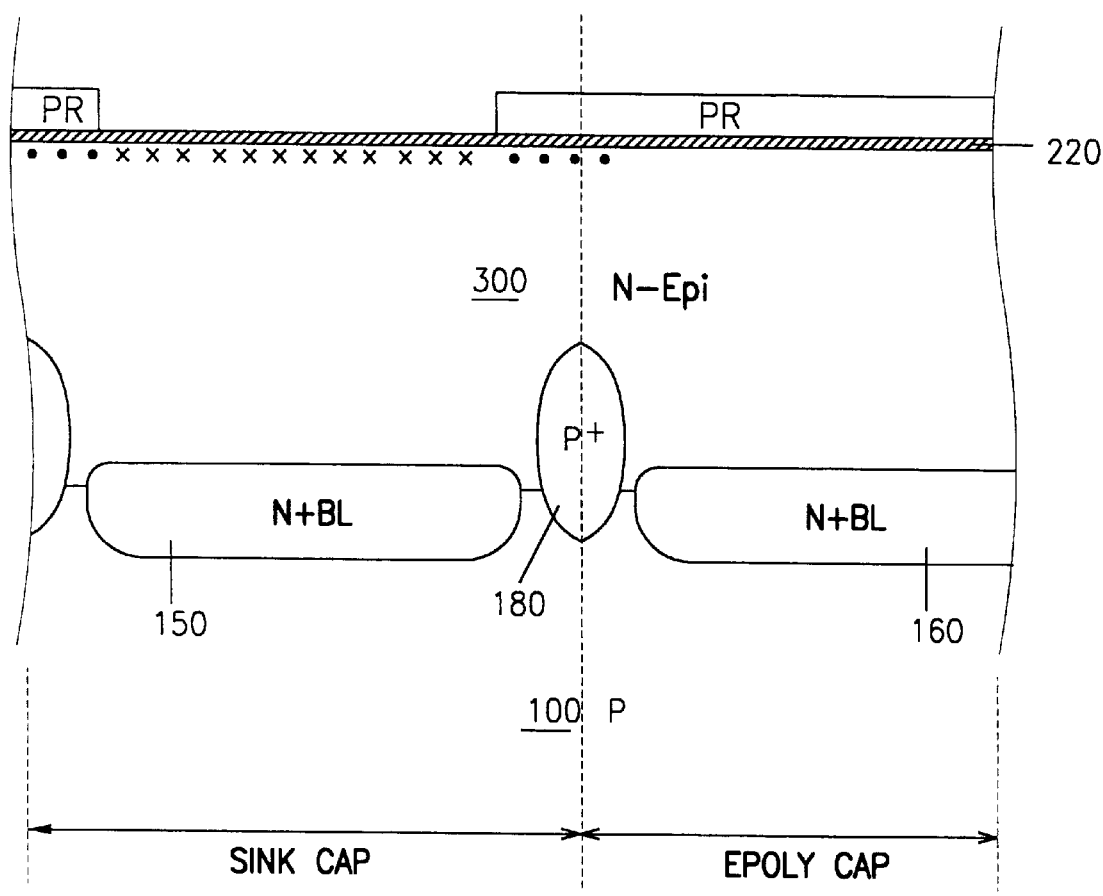
Figure 21B:
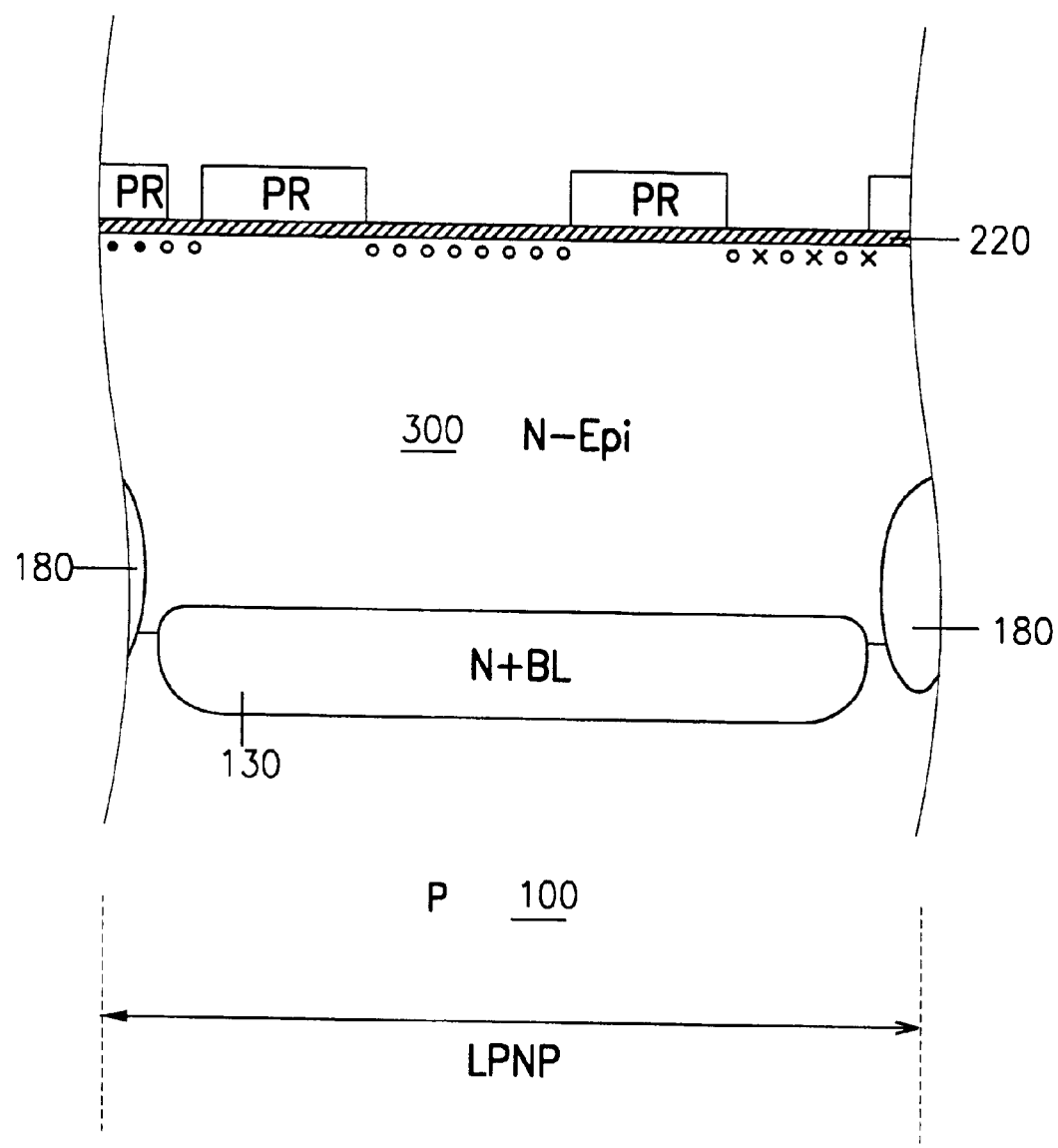
Figure 21C:
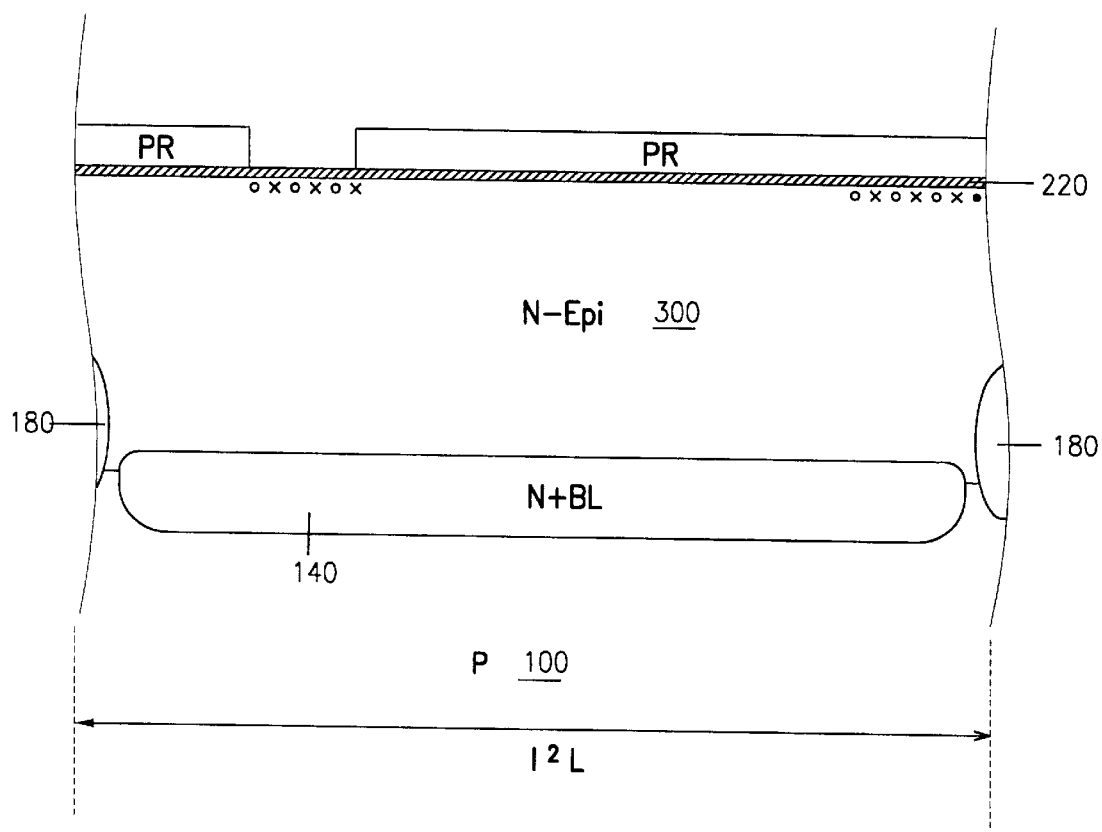
Figure 21D:
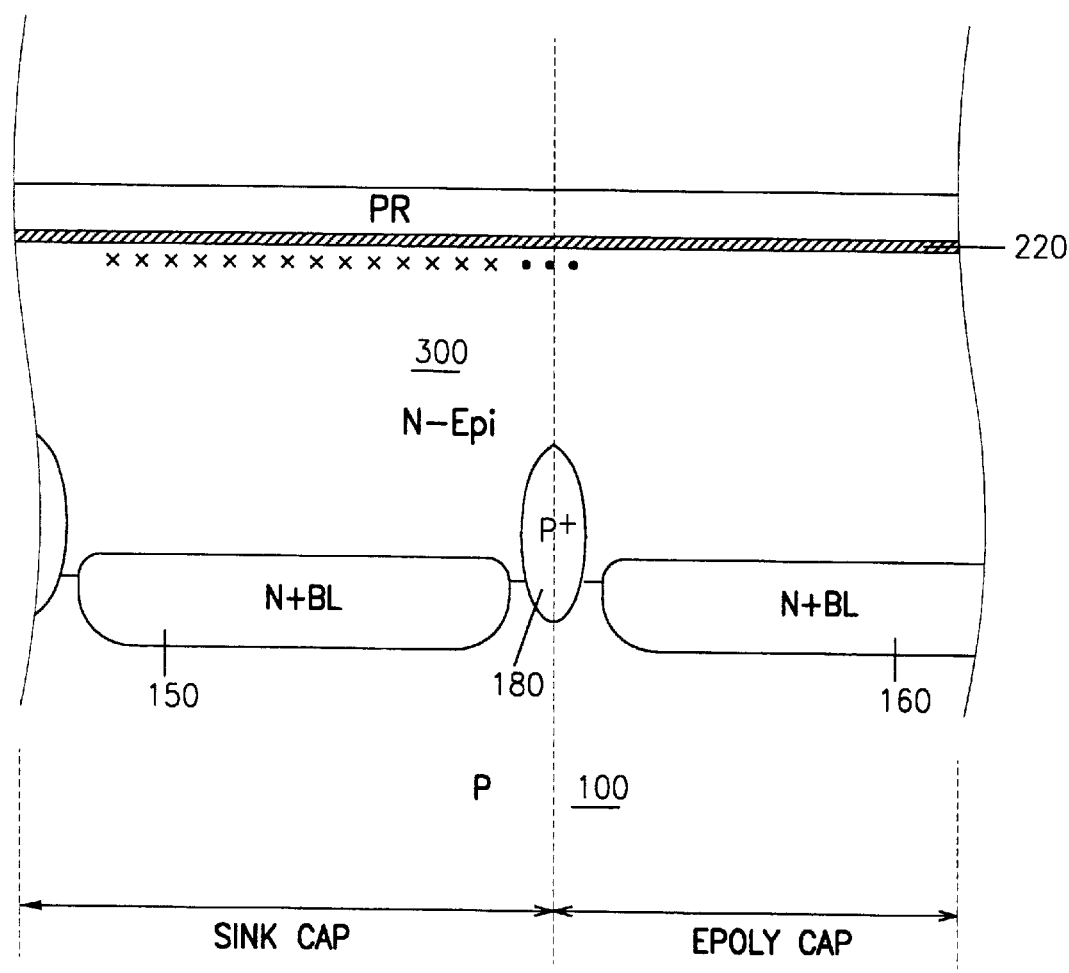
Figure 22A:
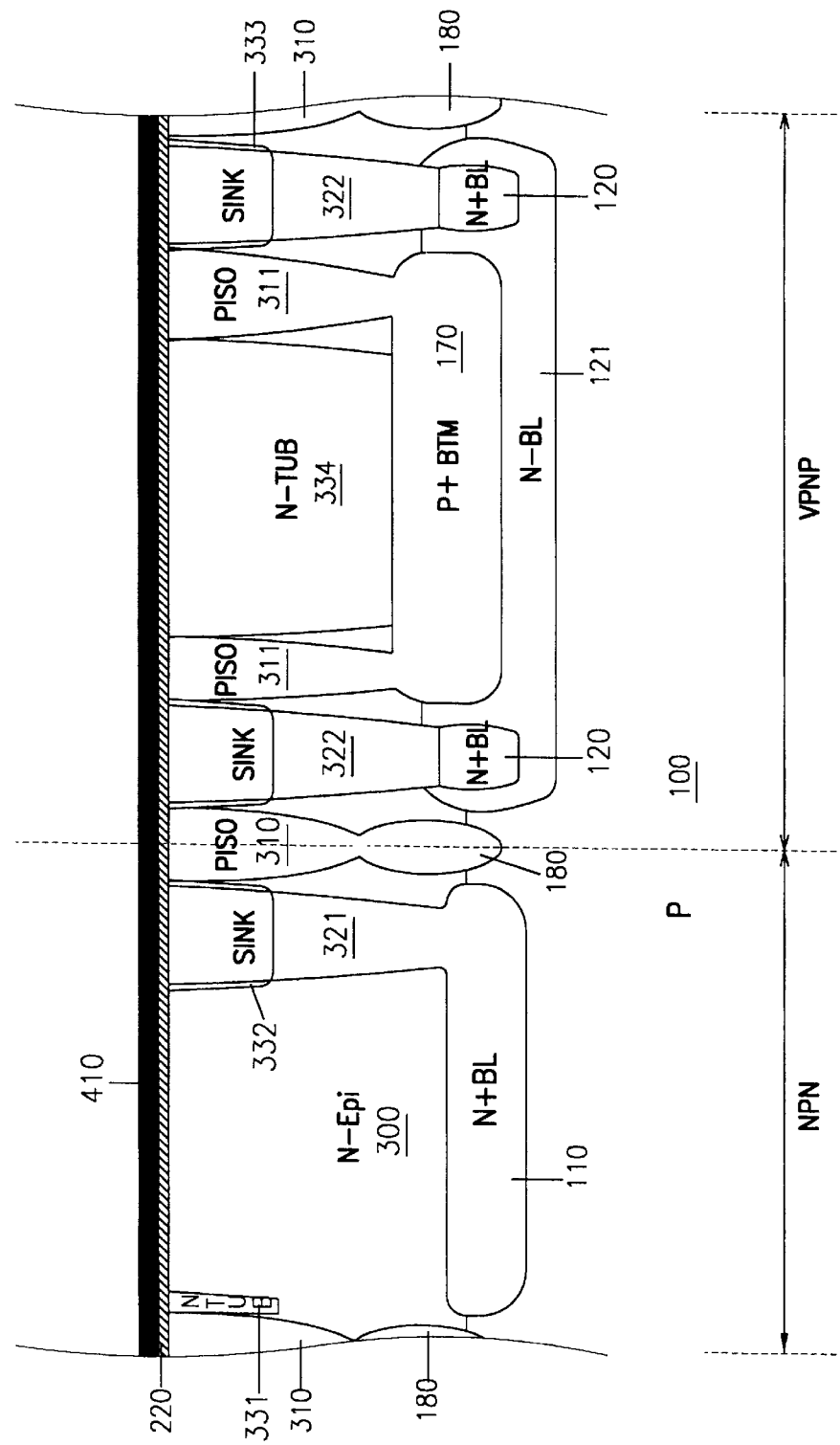
Figure 22B:
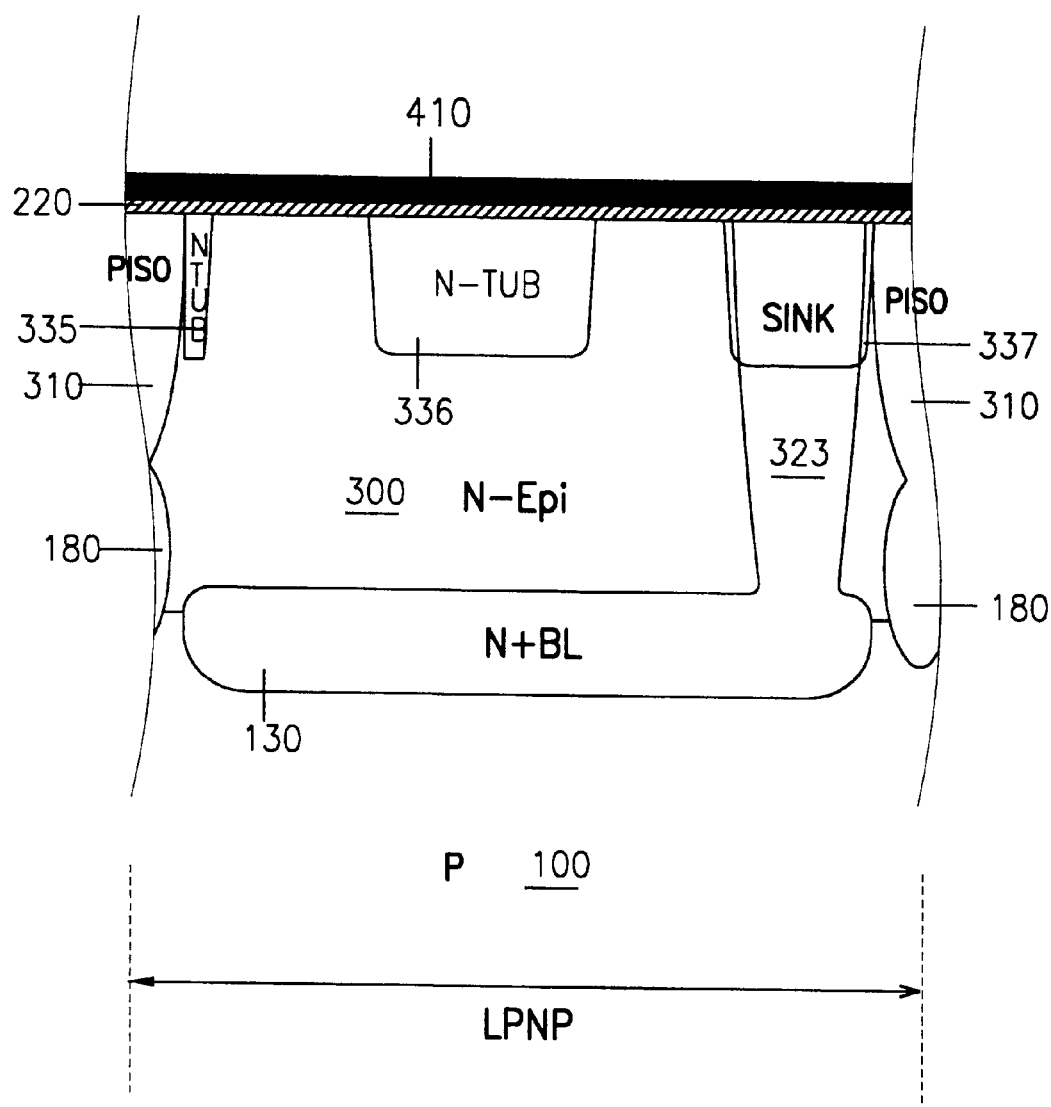
Figure 22C:
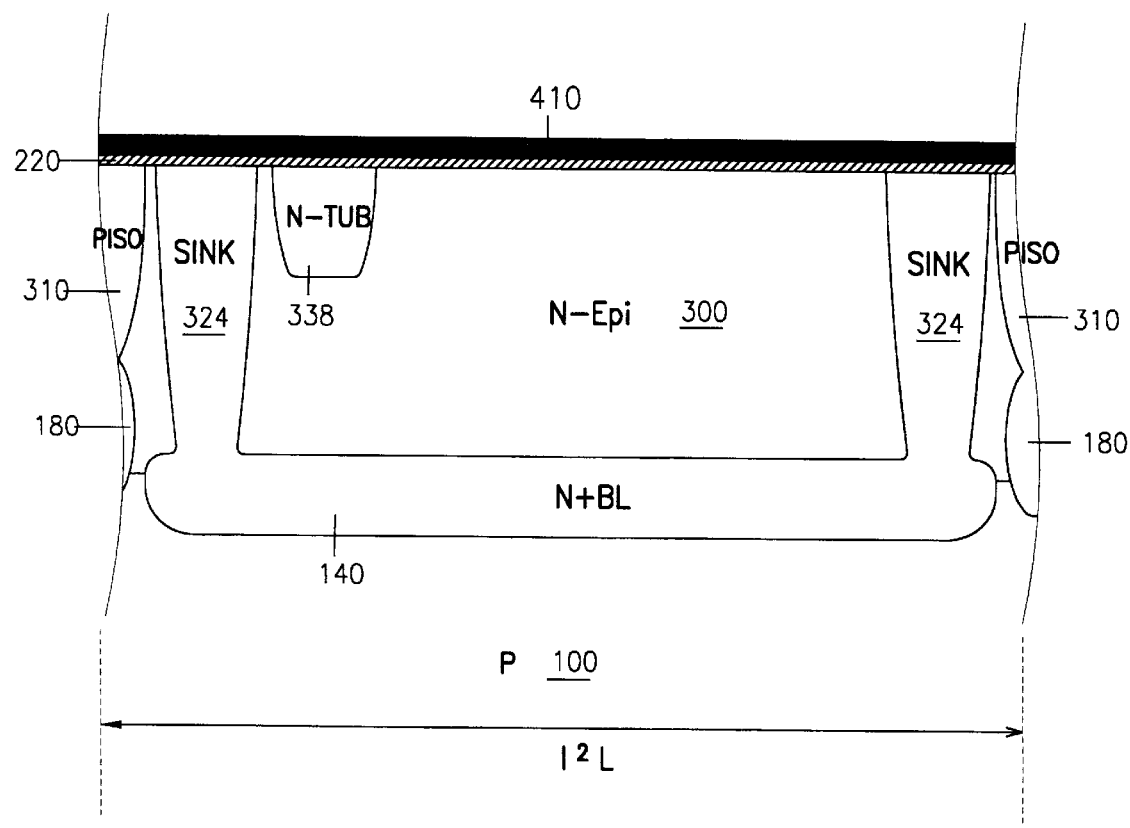
Figure 22D:
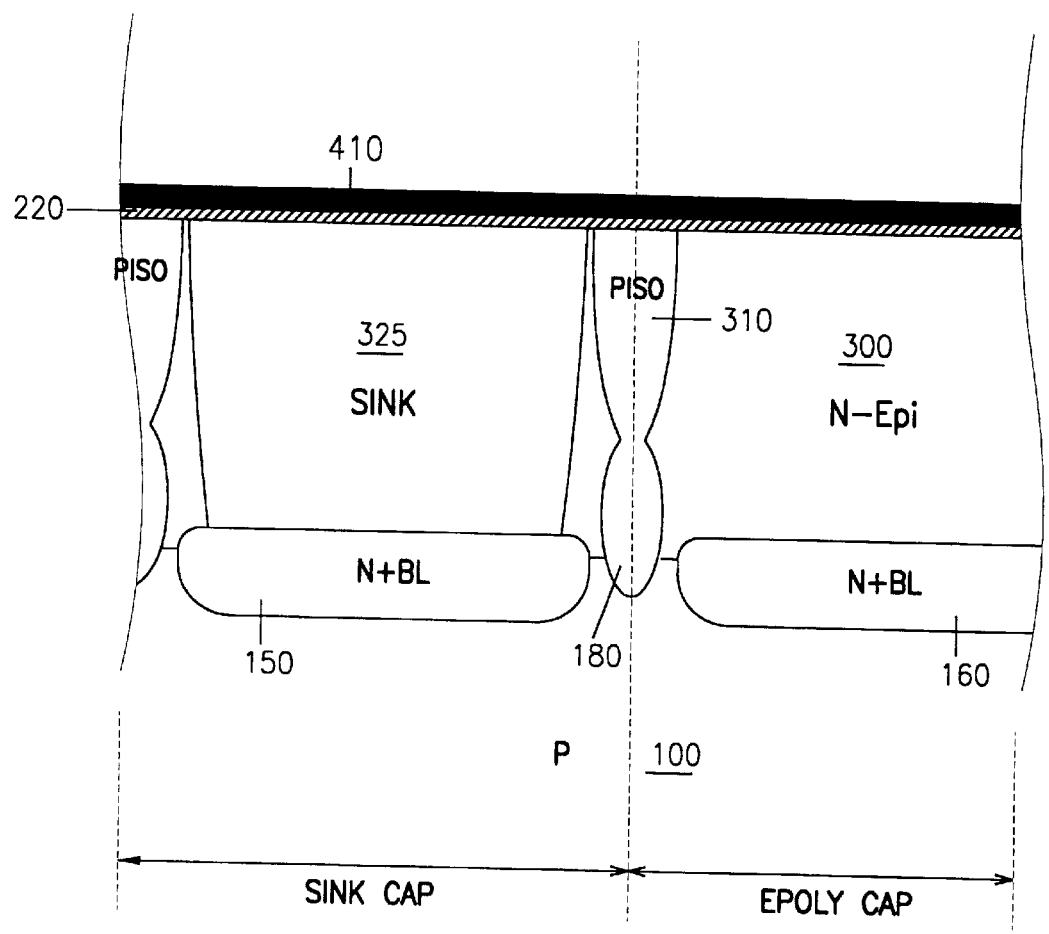
Figure 23A:
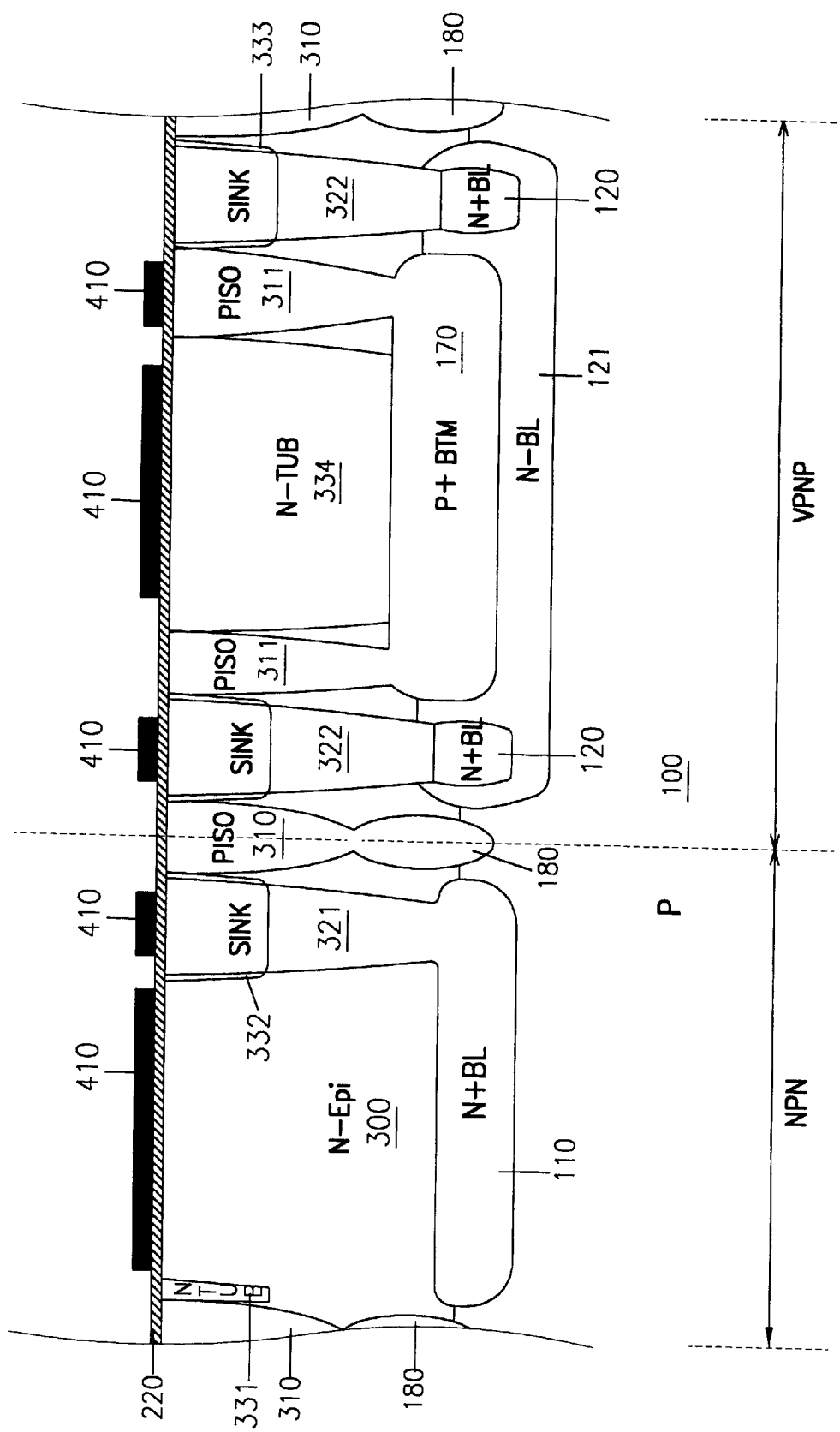
Figure 23B:
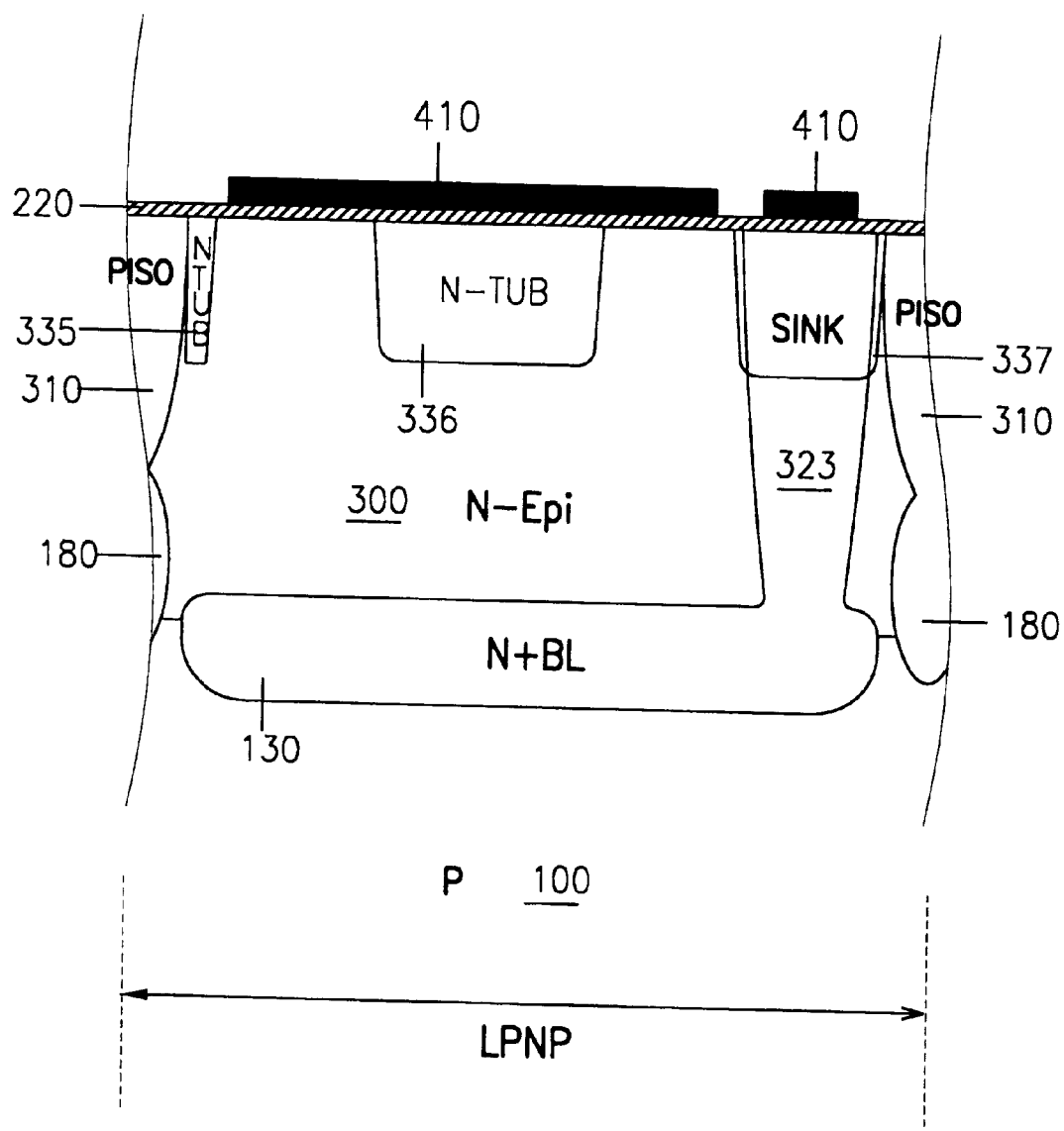
Figure 23C:
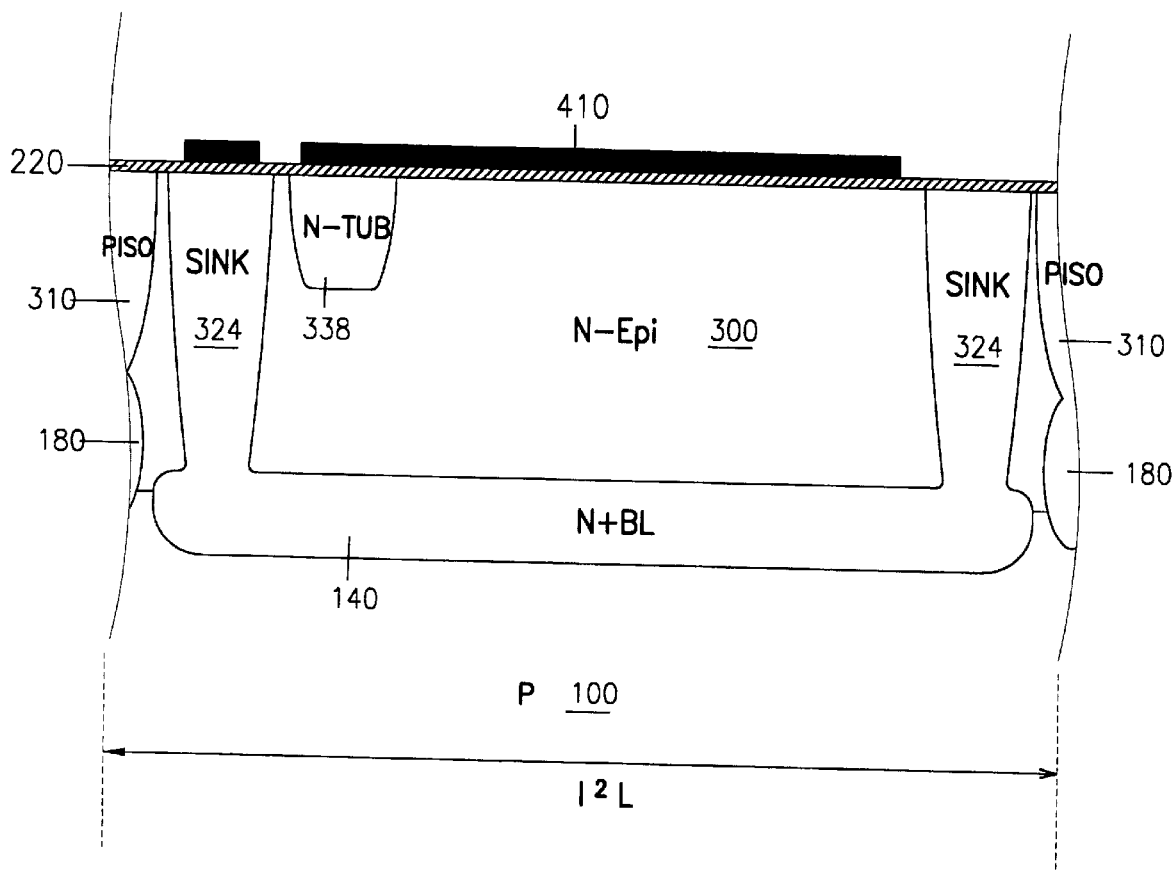
Figure 23D:
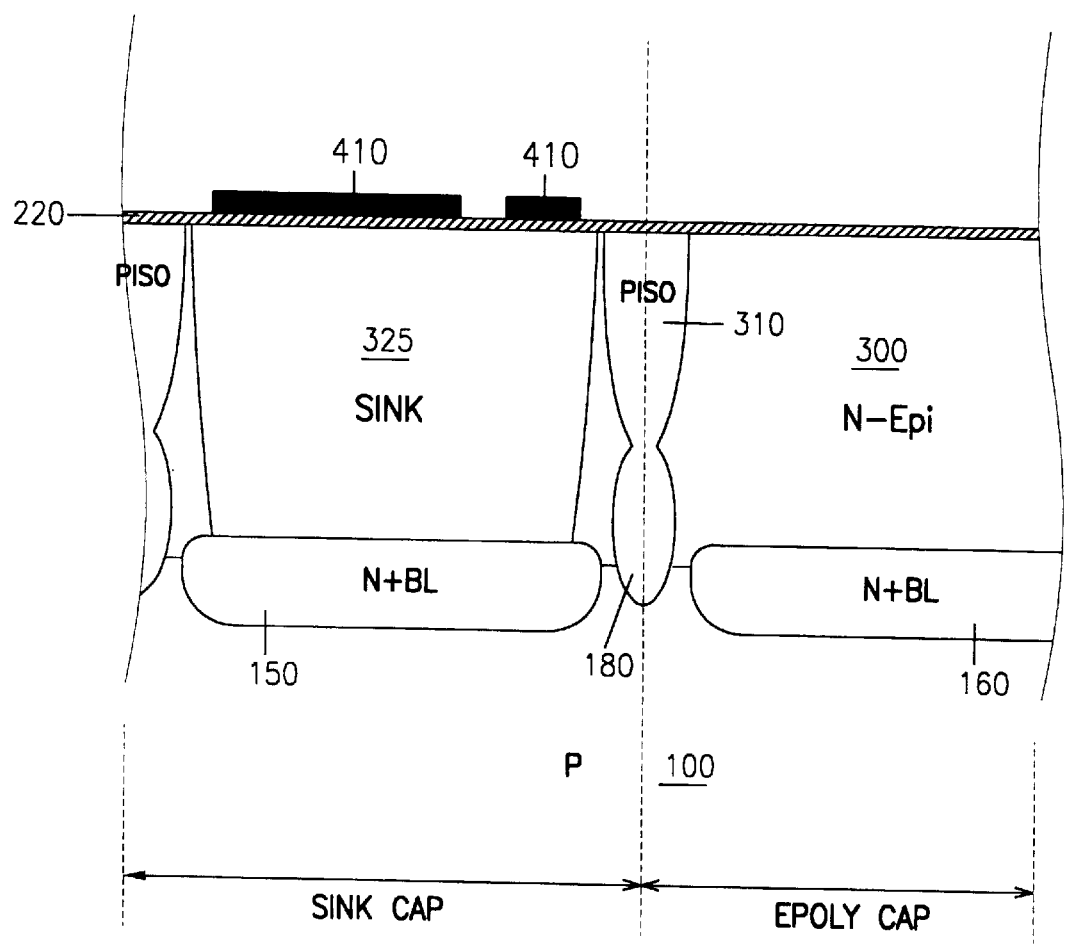
Figure 24A:
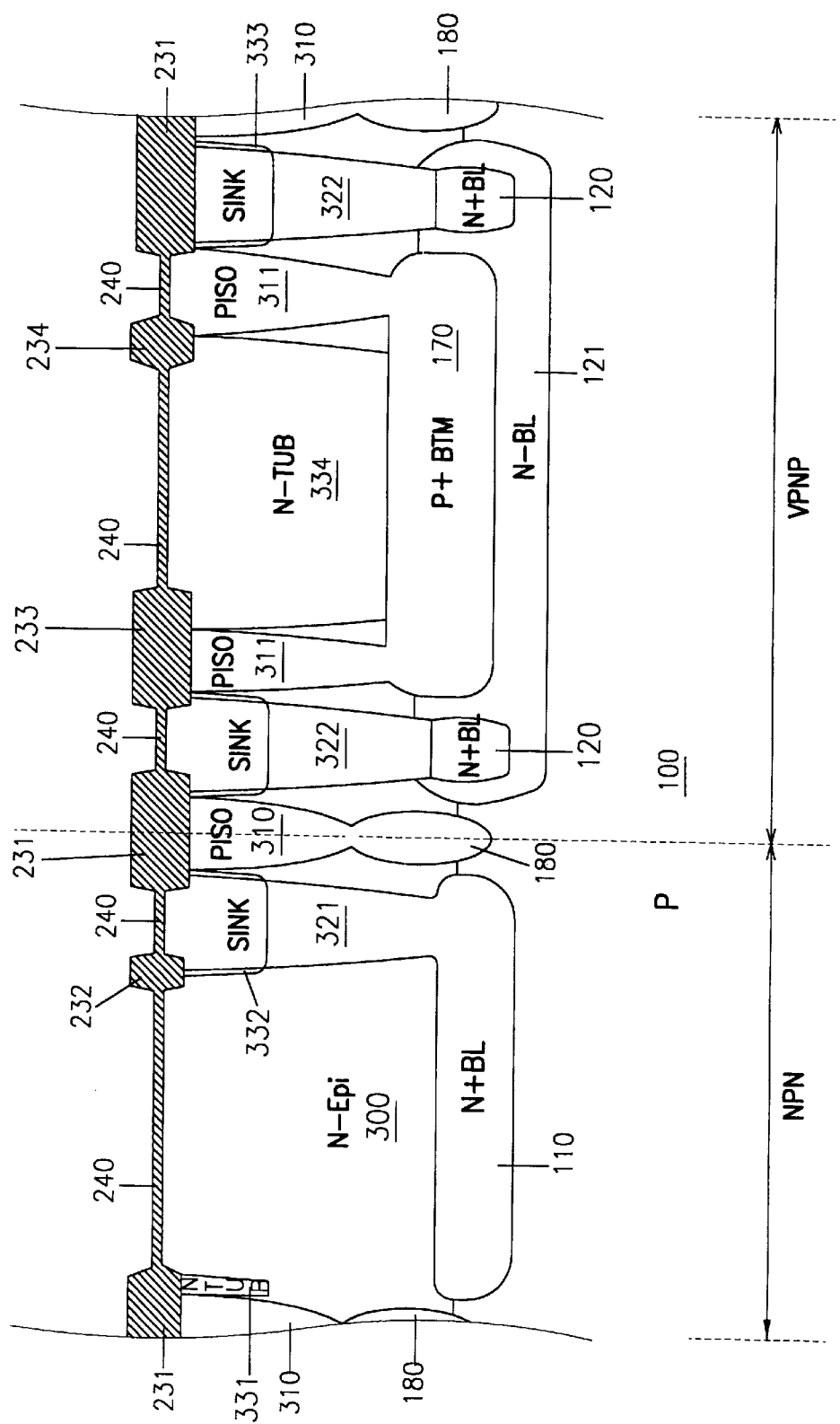
Figure 24B:
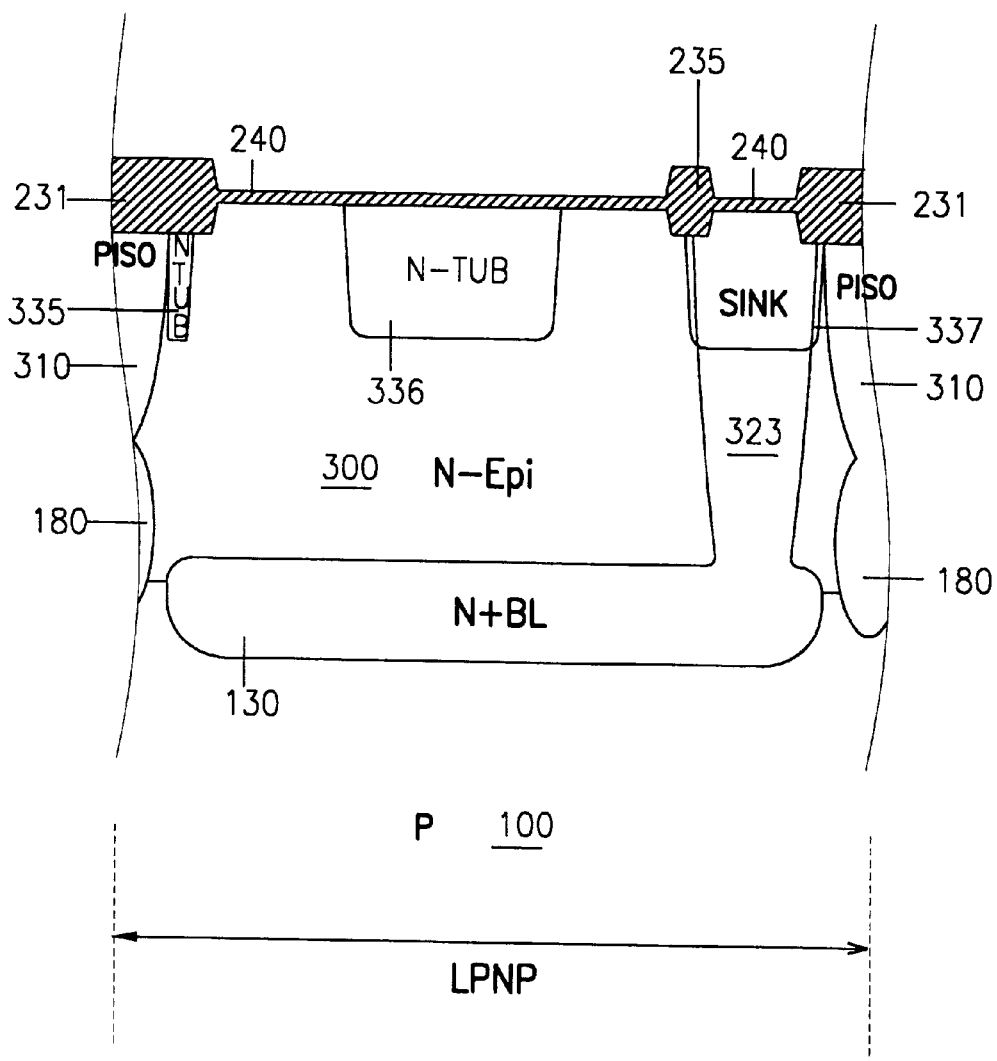
Figure 24C:
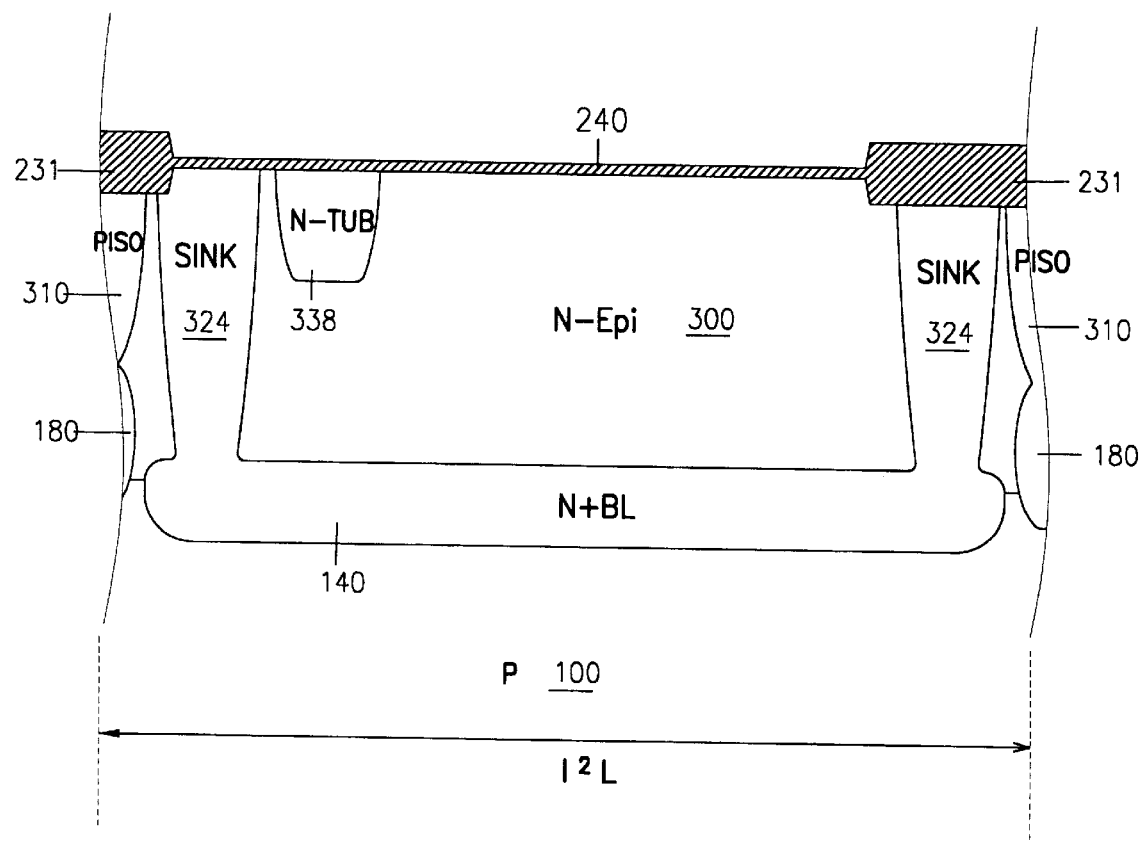
Figure 24D:
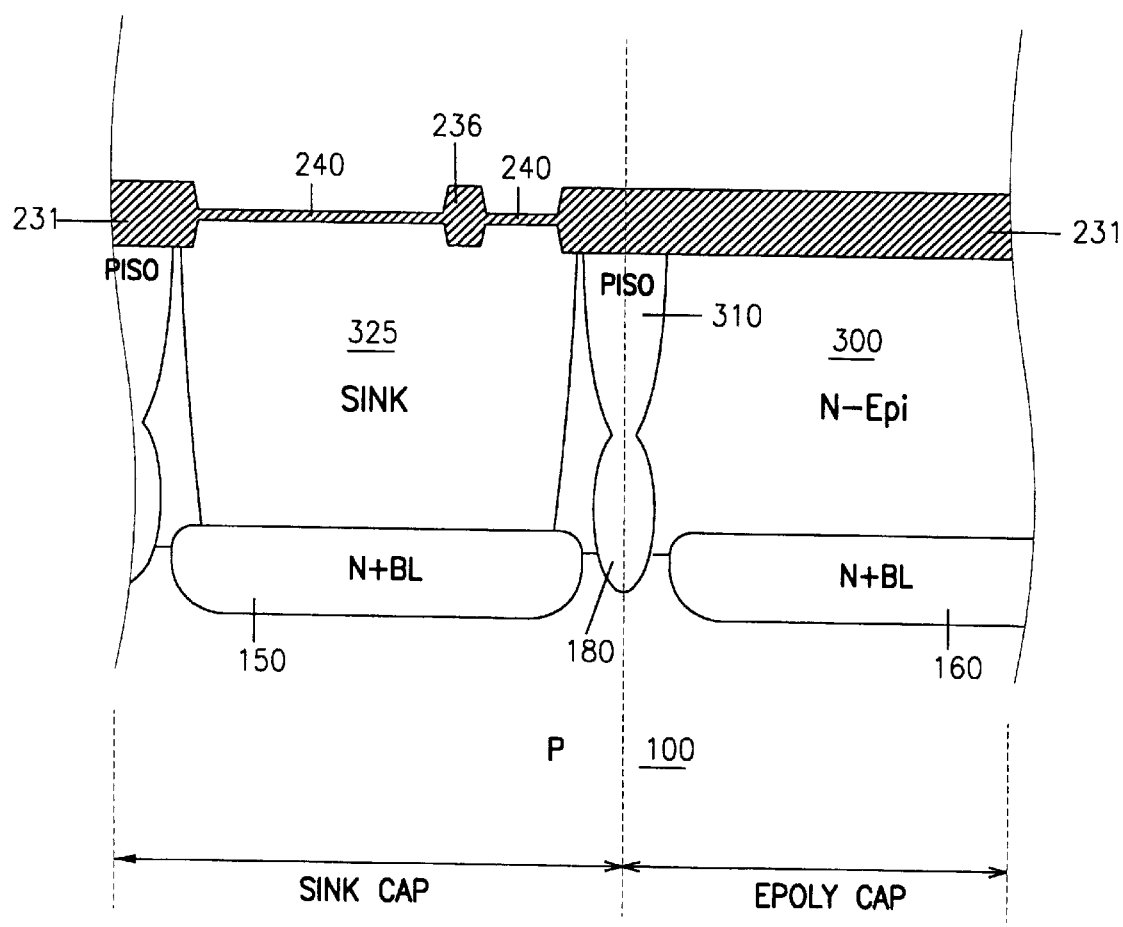
Figure 25A:
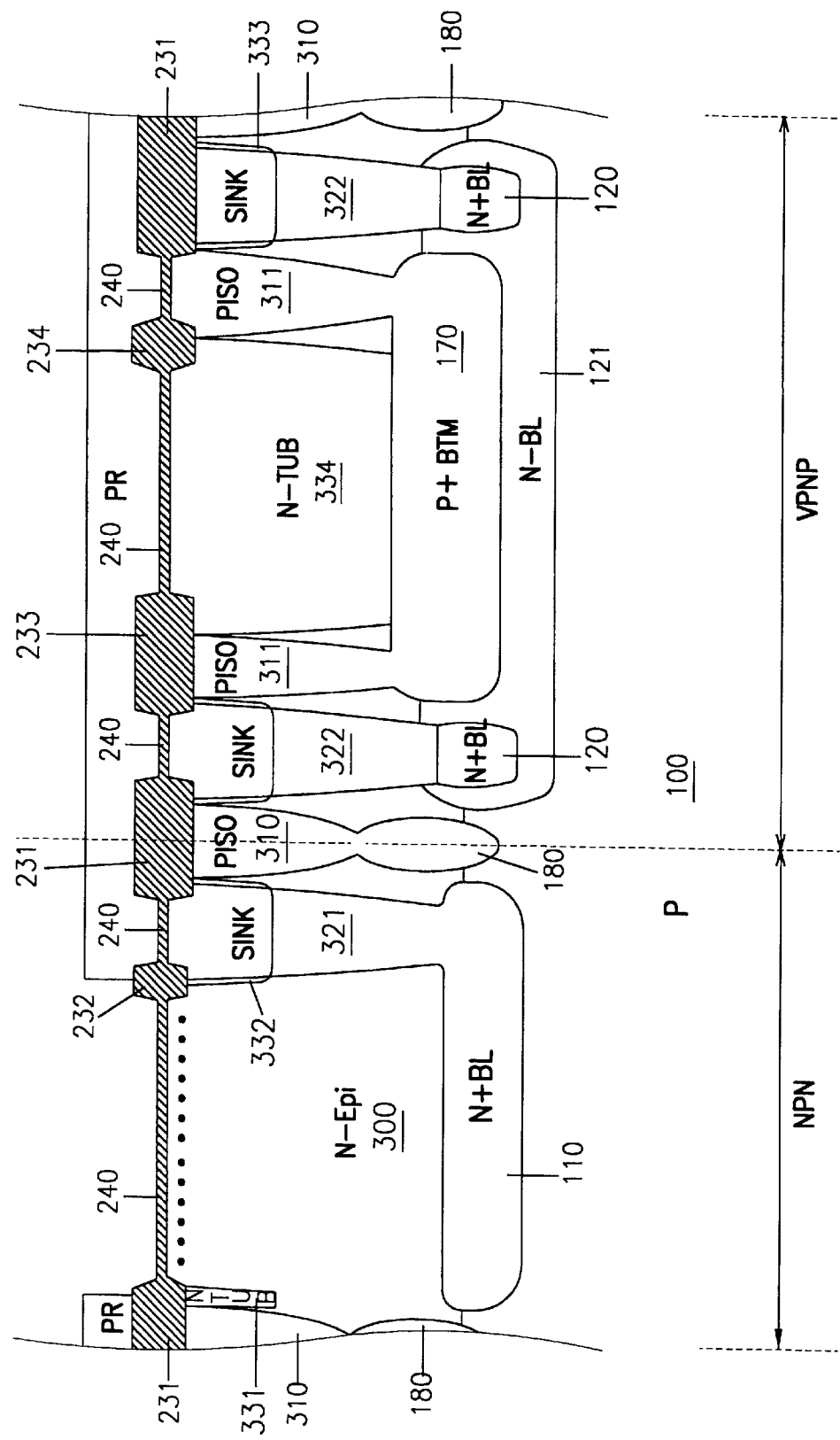
Figure 25B:
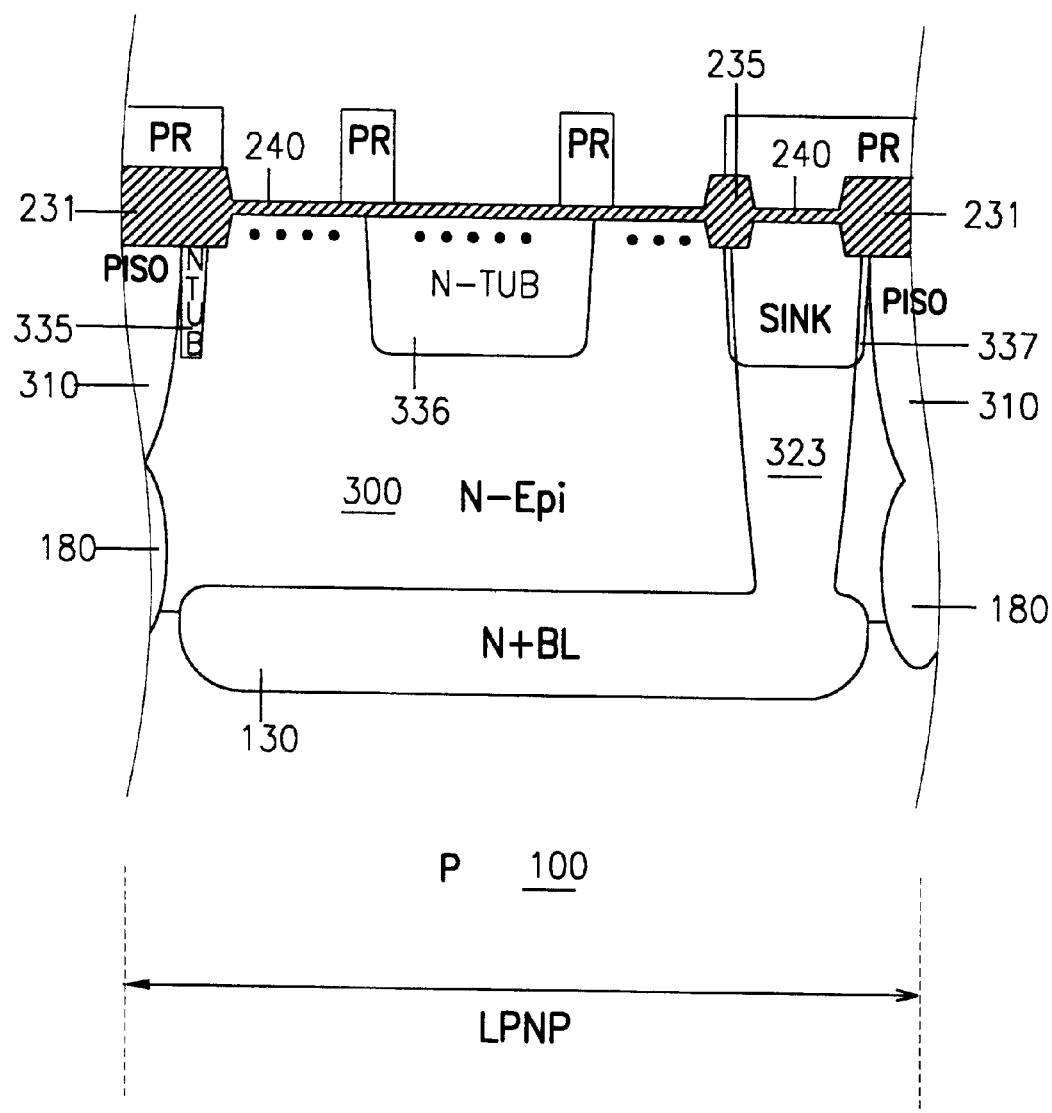
Figure 25C:
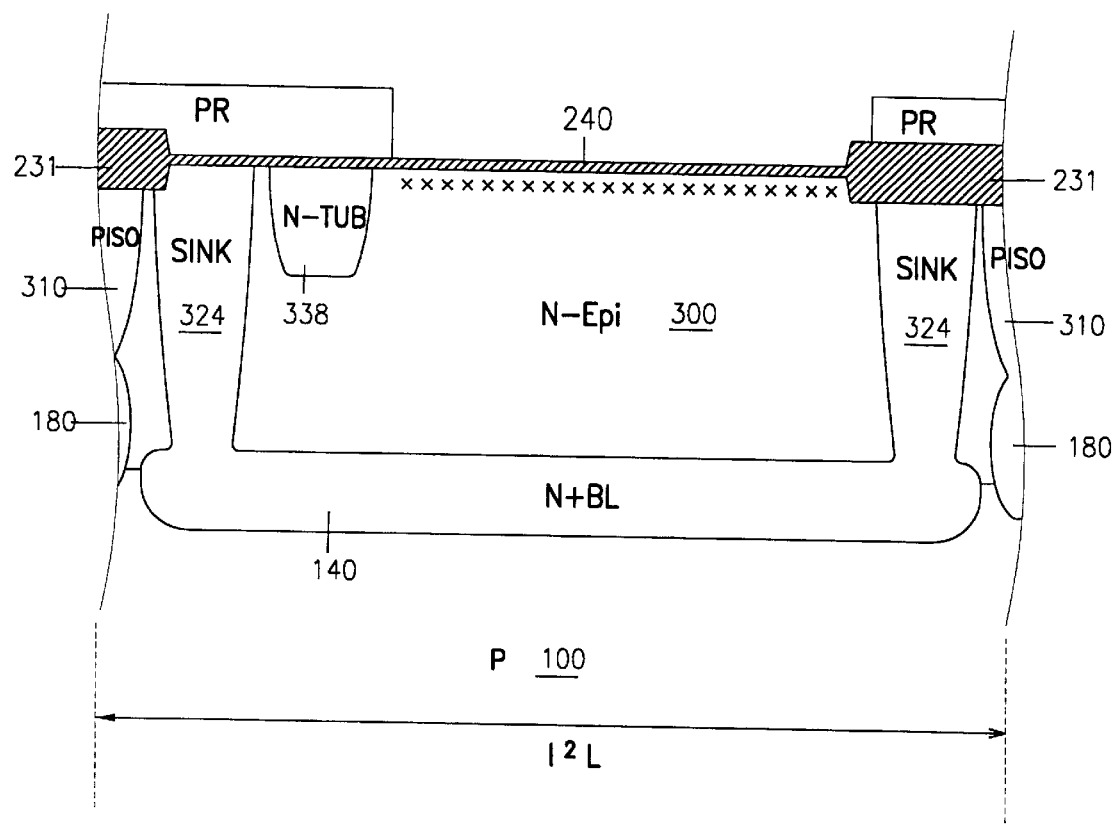
Figure 25D:
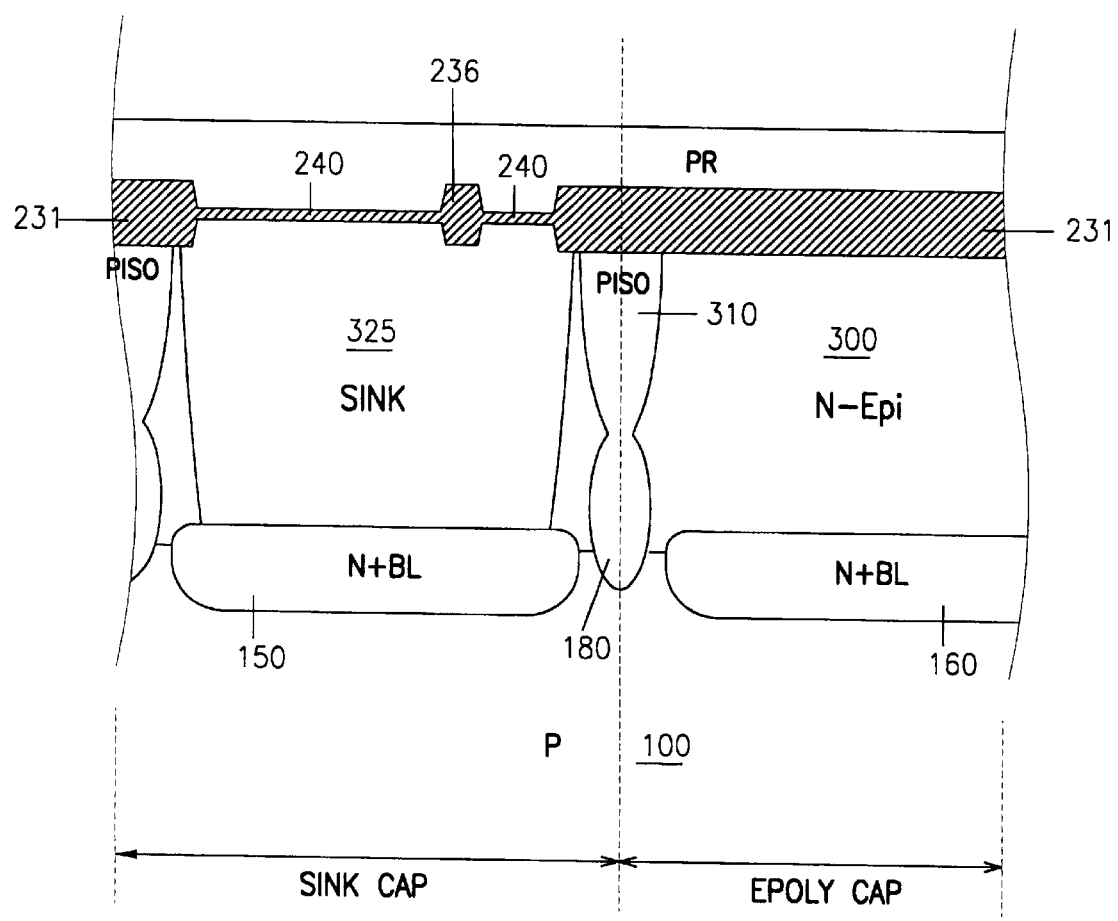
Figure 26A:
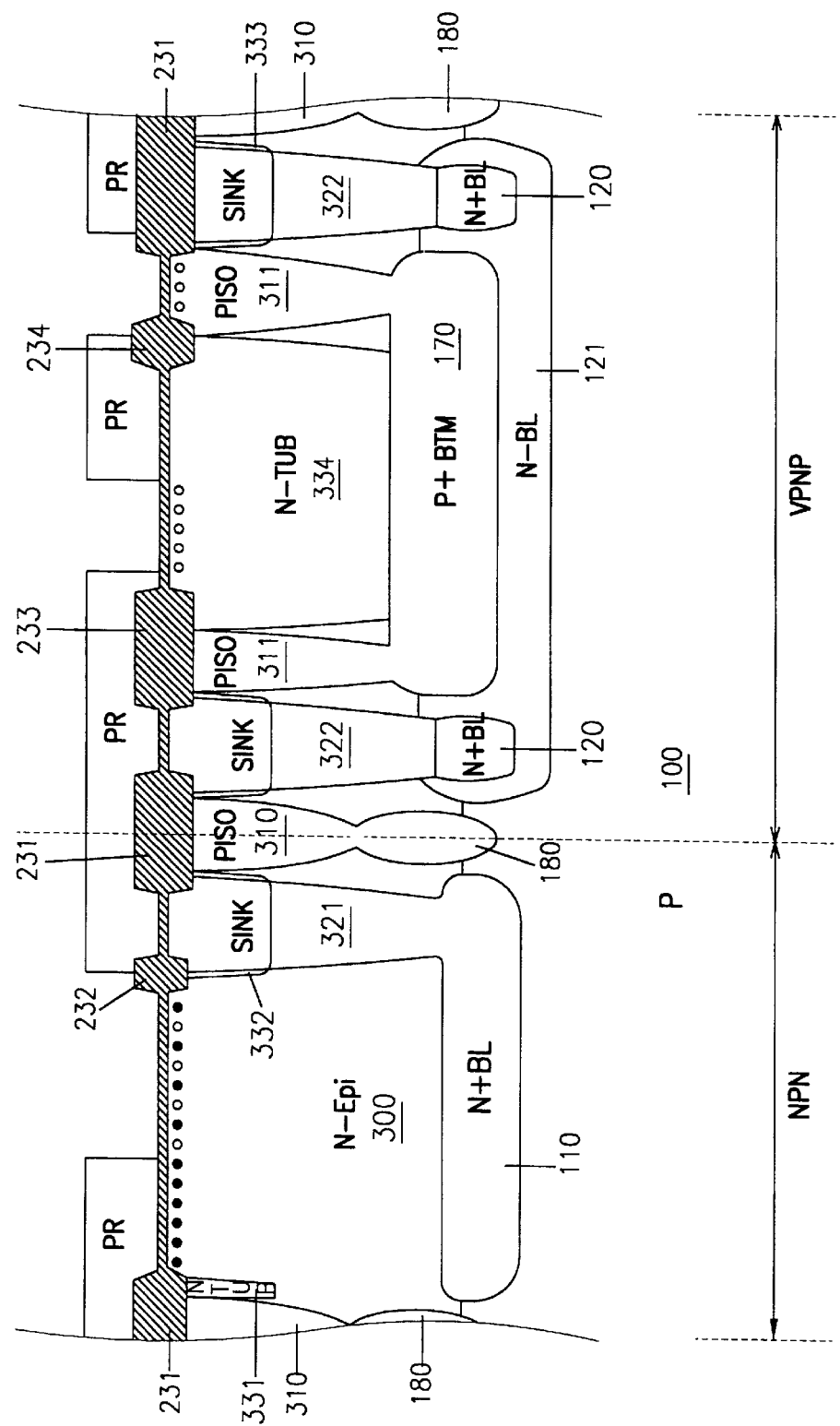
Figure 26B:
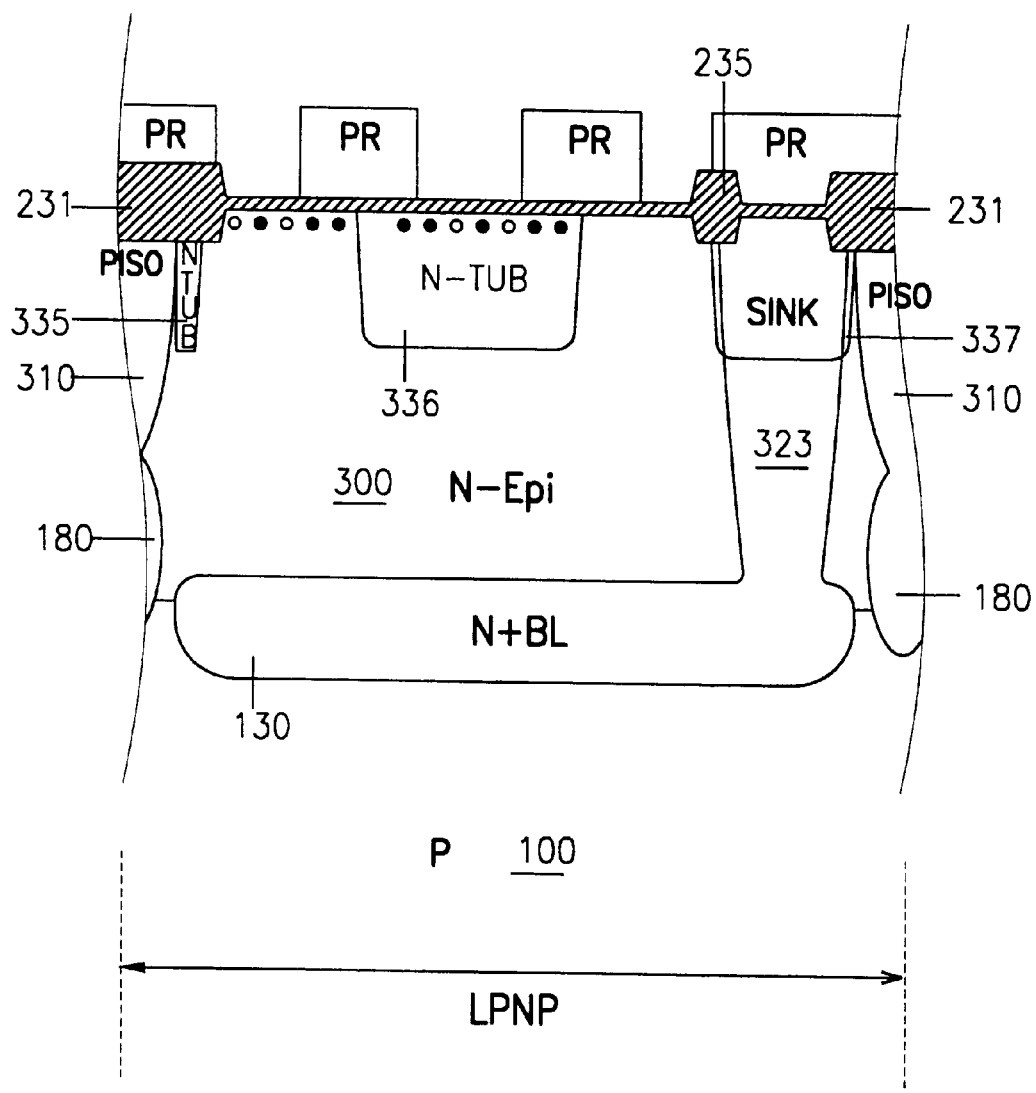
Figure 26C:
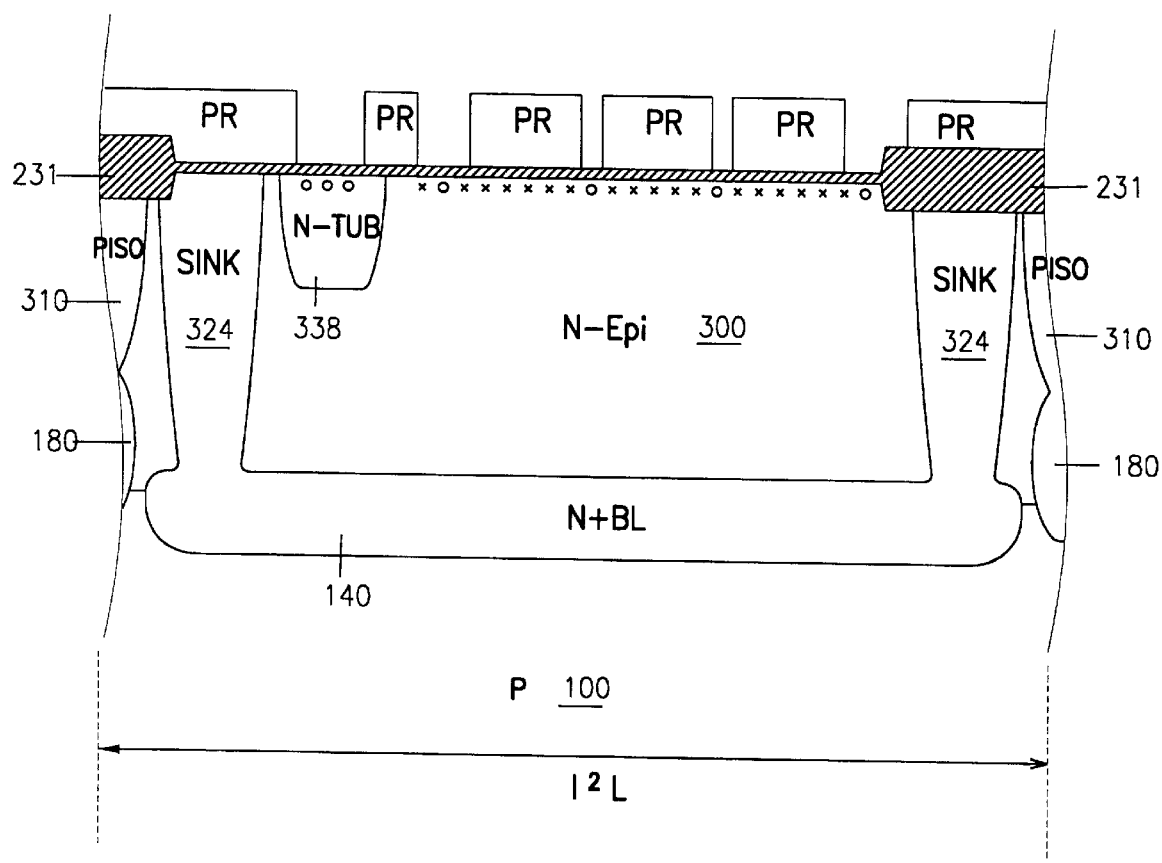
Figure 26D:
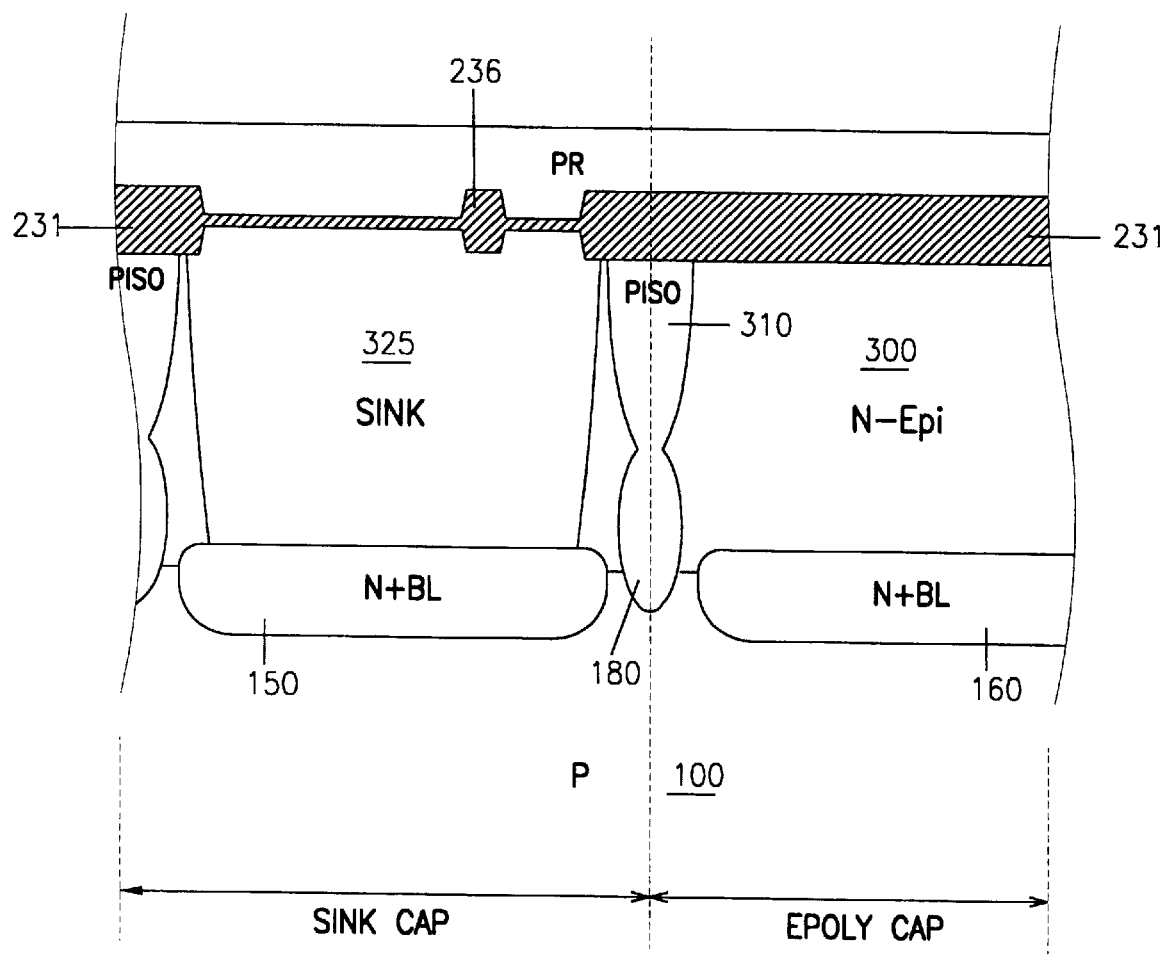
Figure 27A:
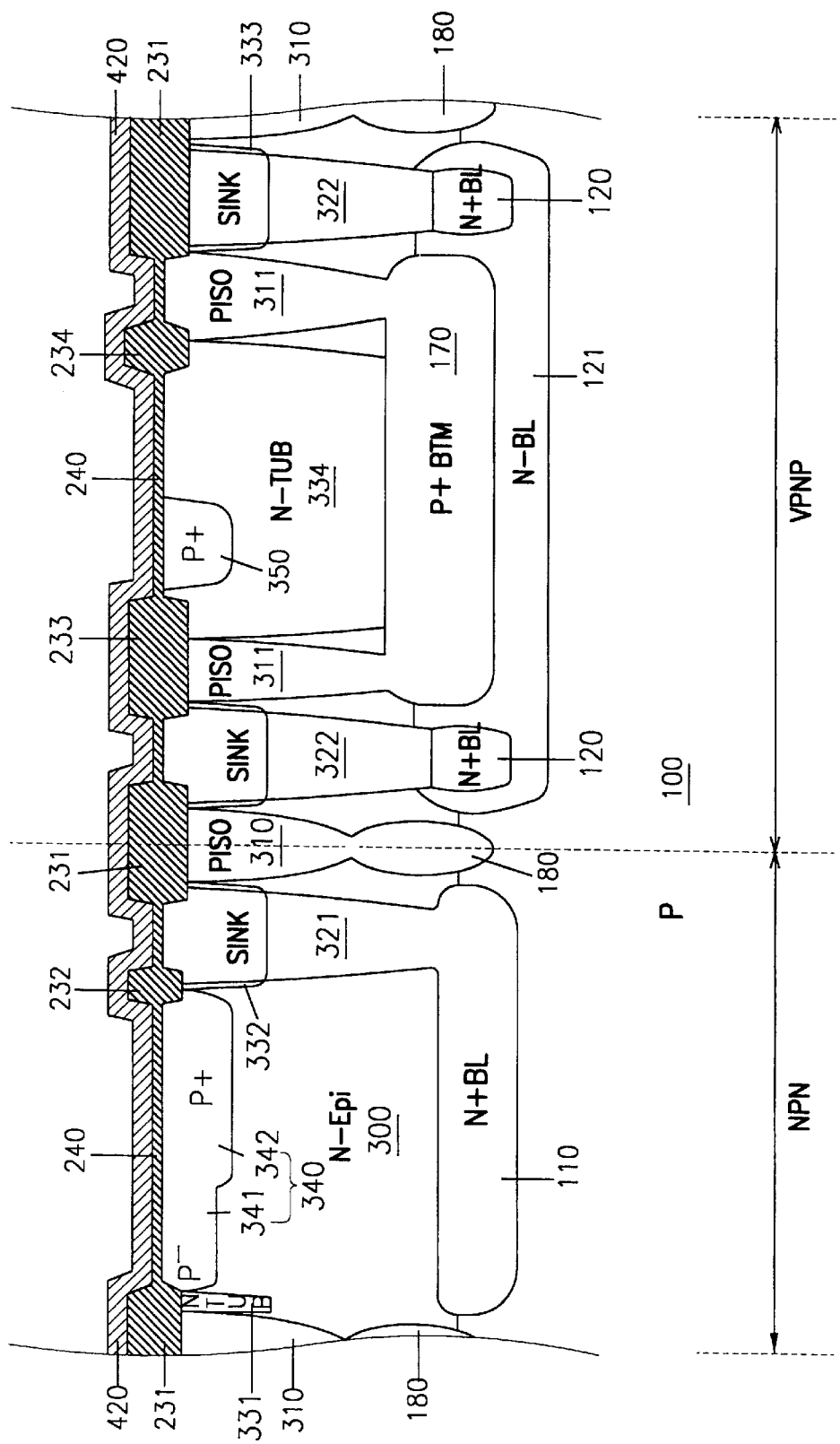
Figure 27B:
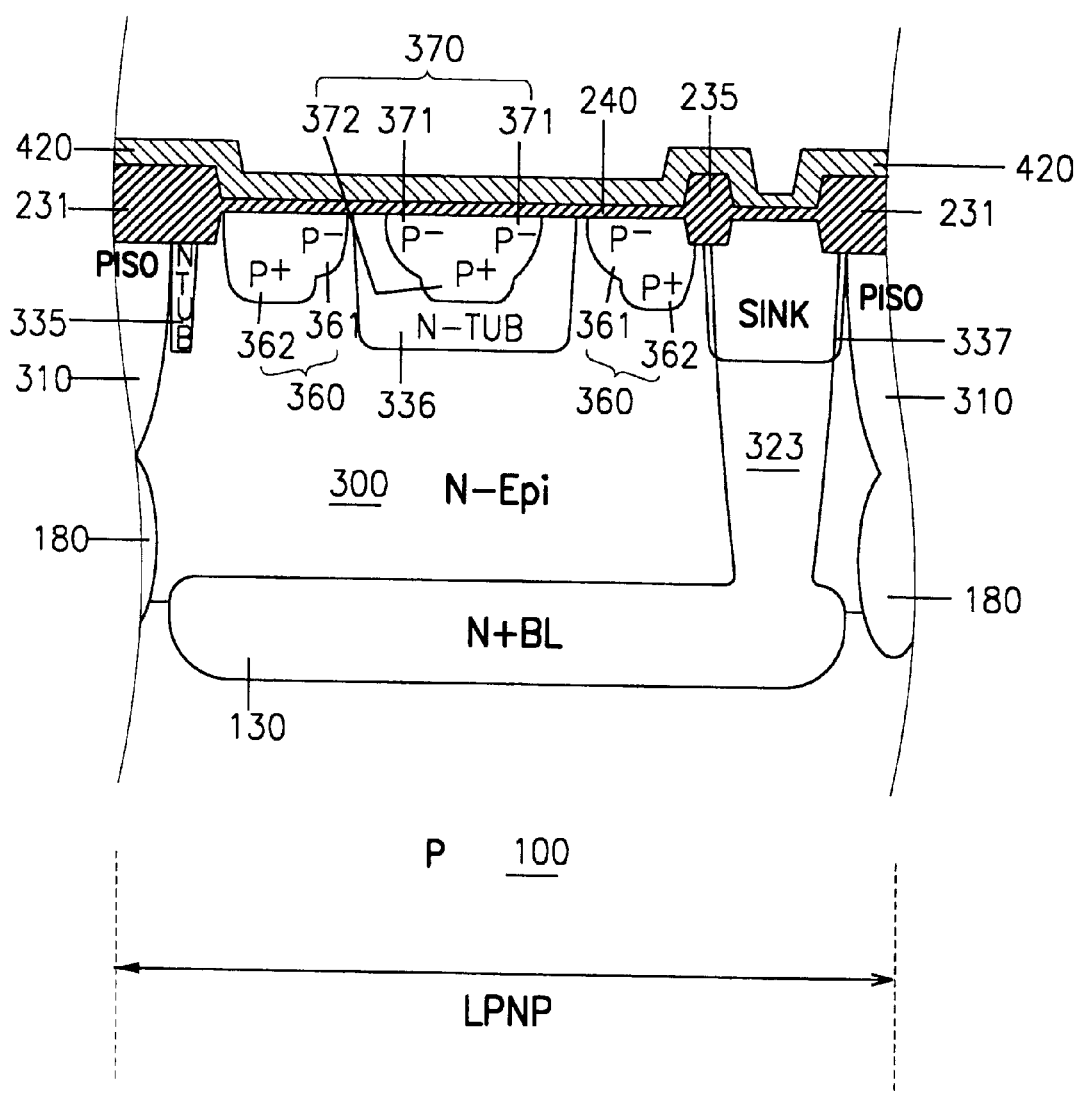
Figure 27C:
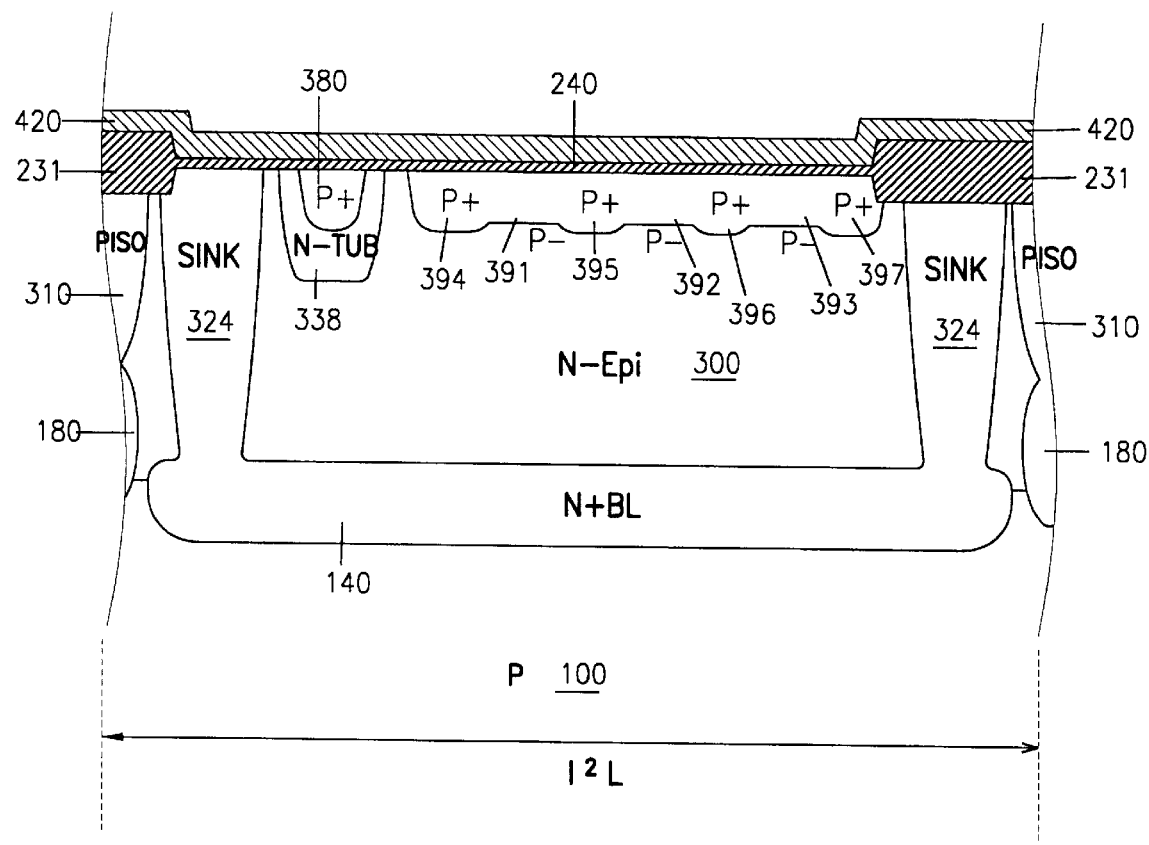
Figure 27D:
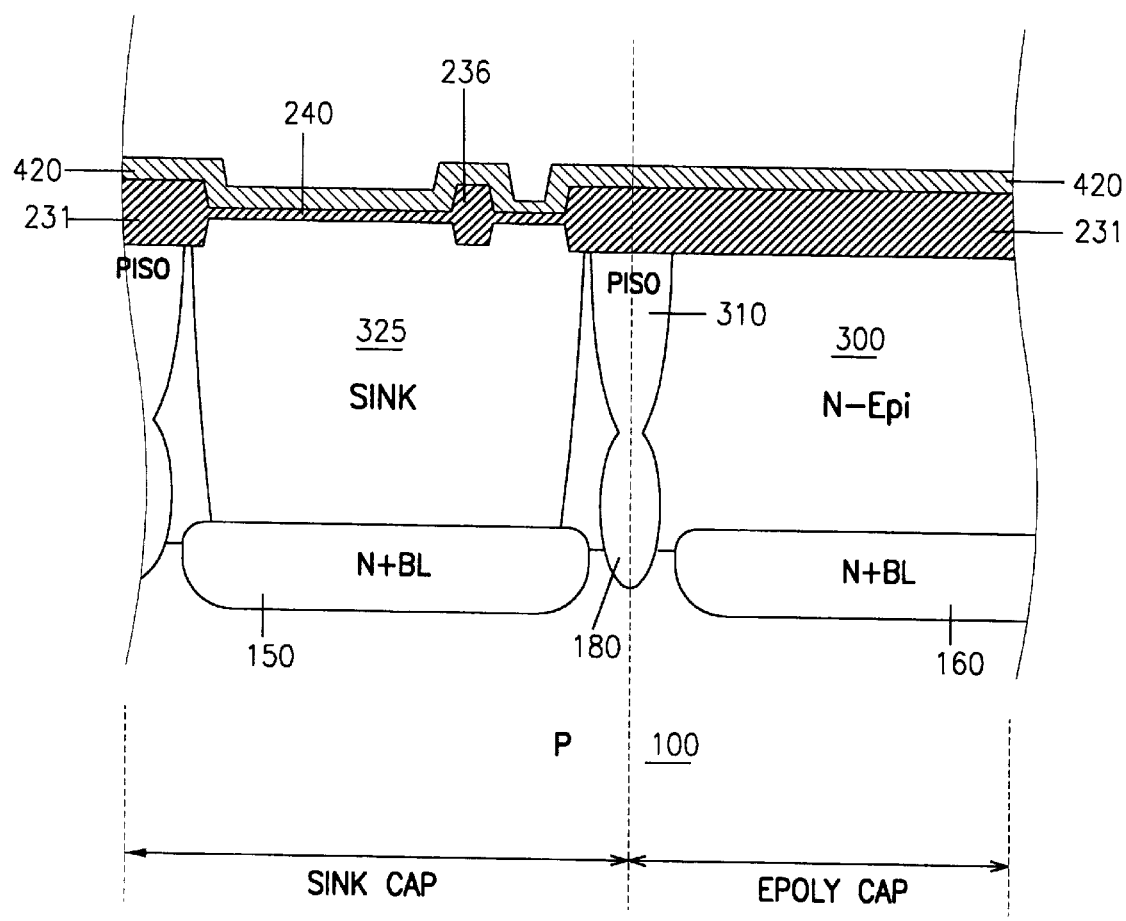
Figure 28A:
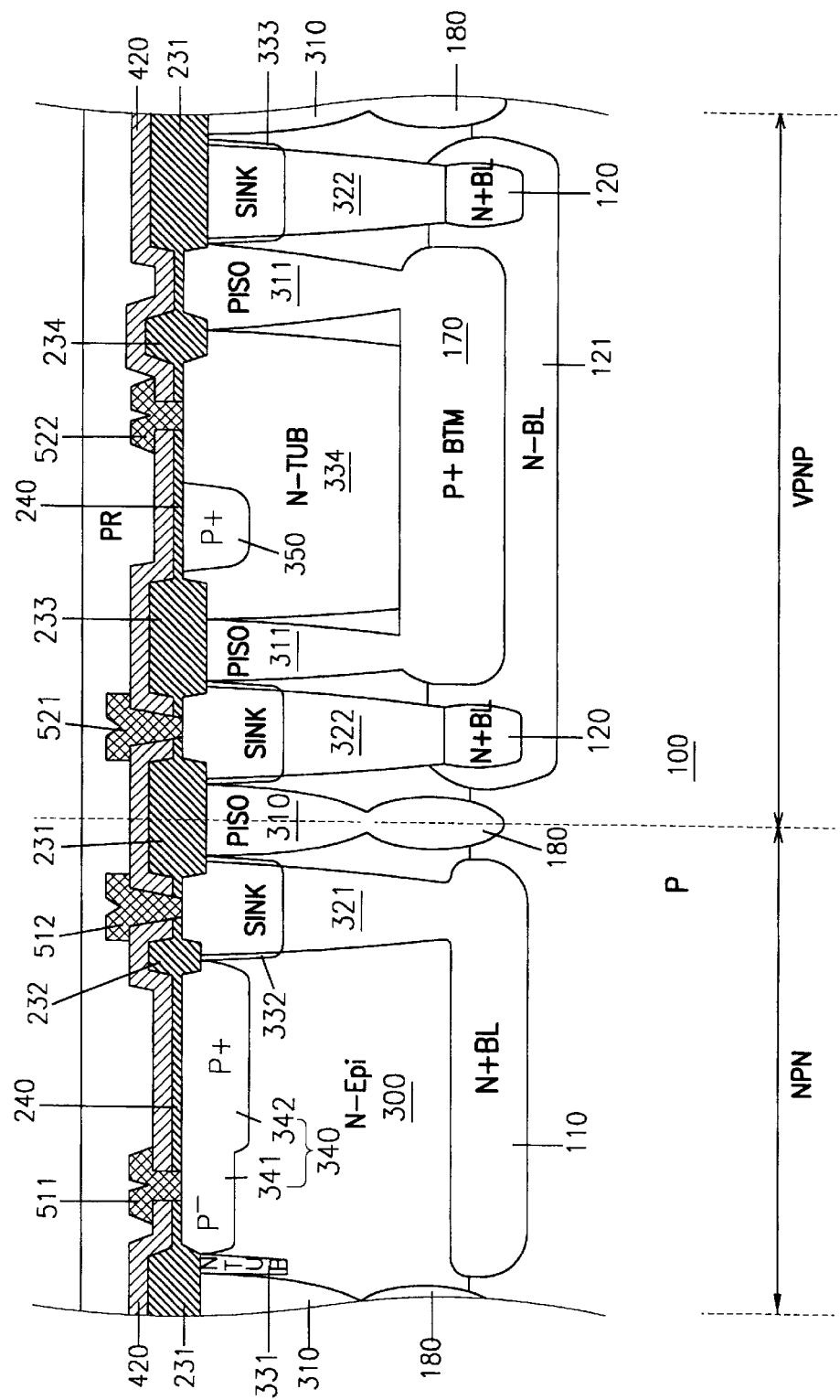
Figure 28B:
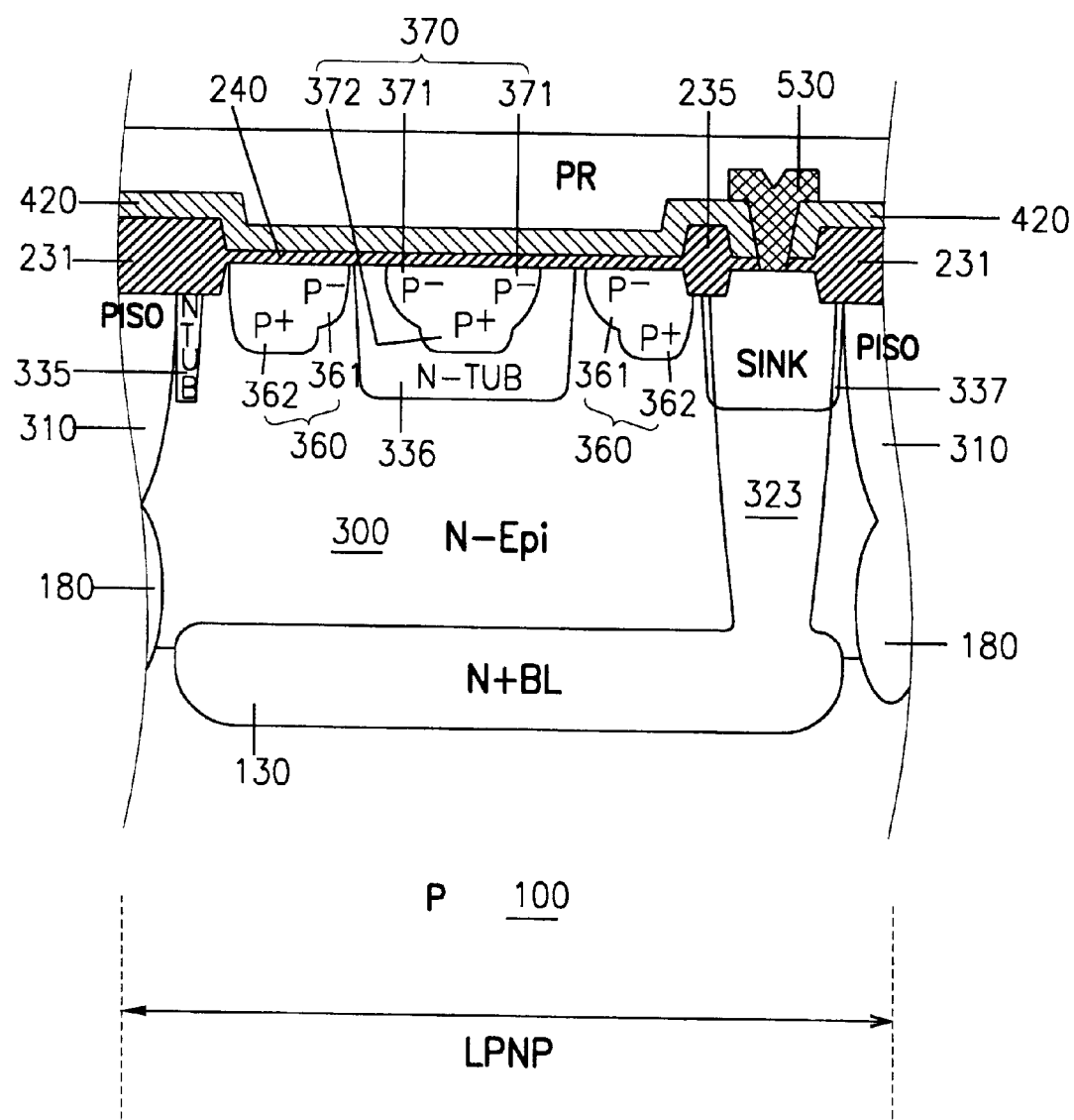
Figure 28C:
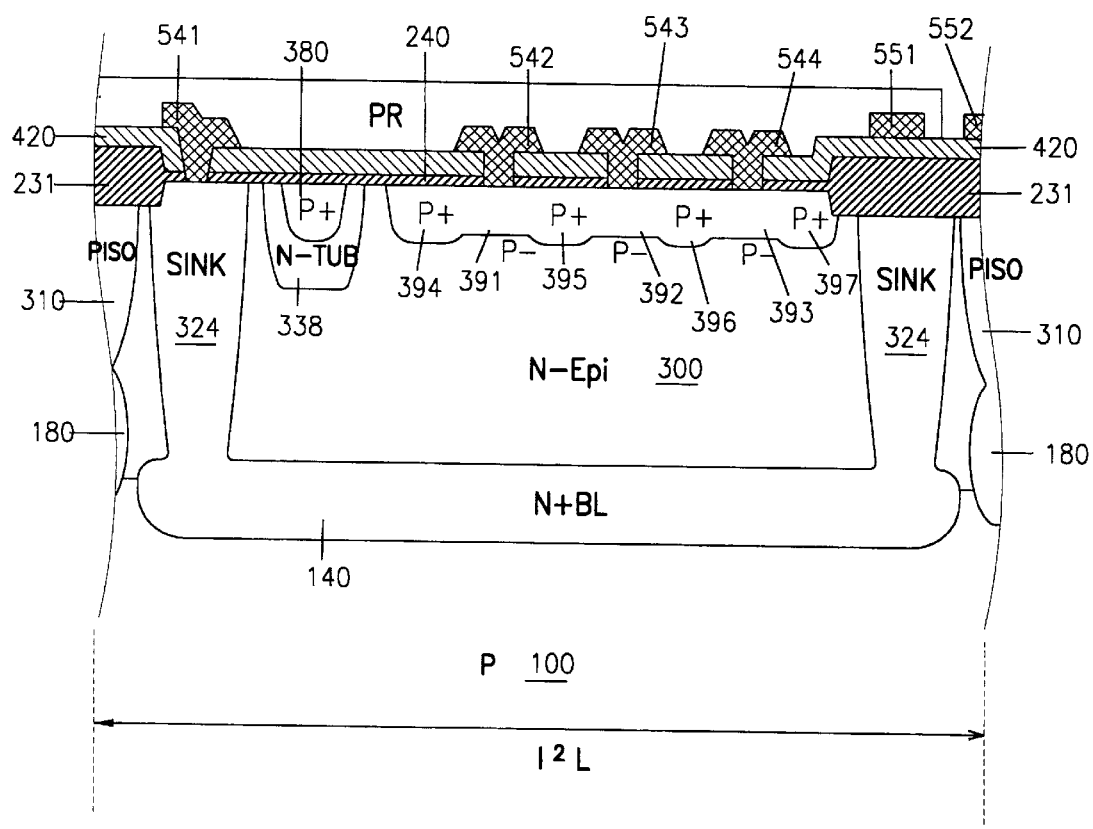
Figure 28D:
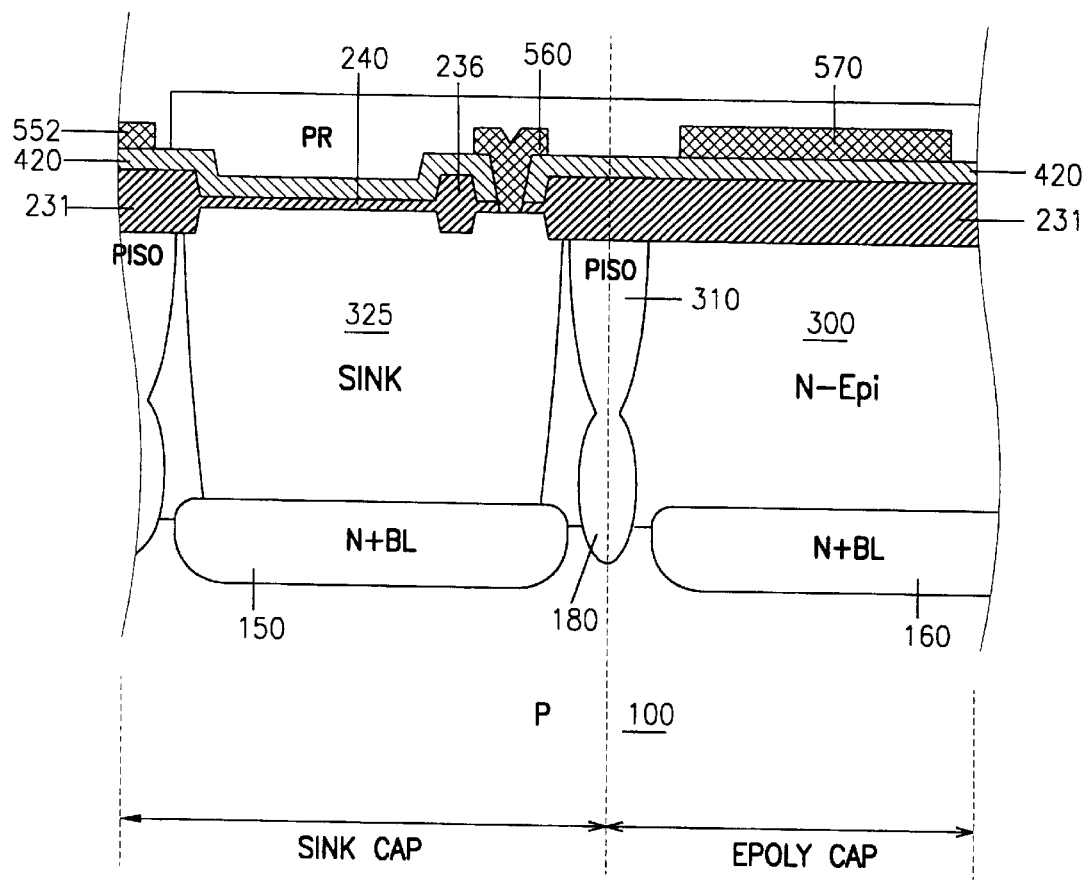
Figure 29A:
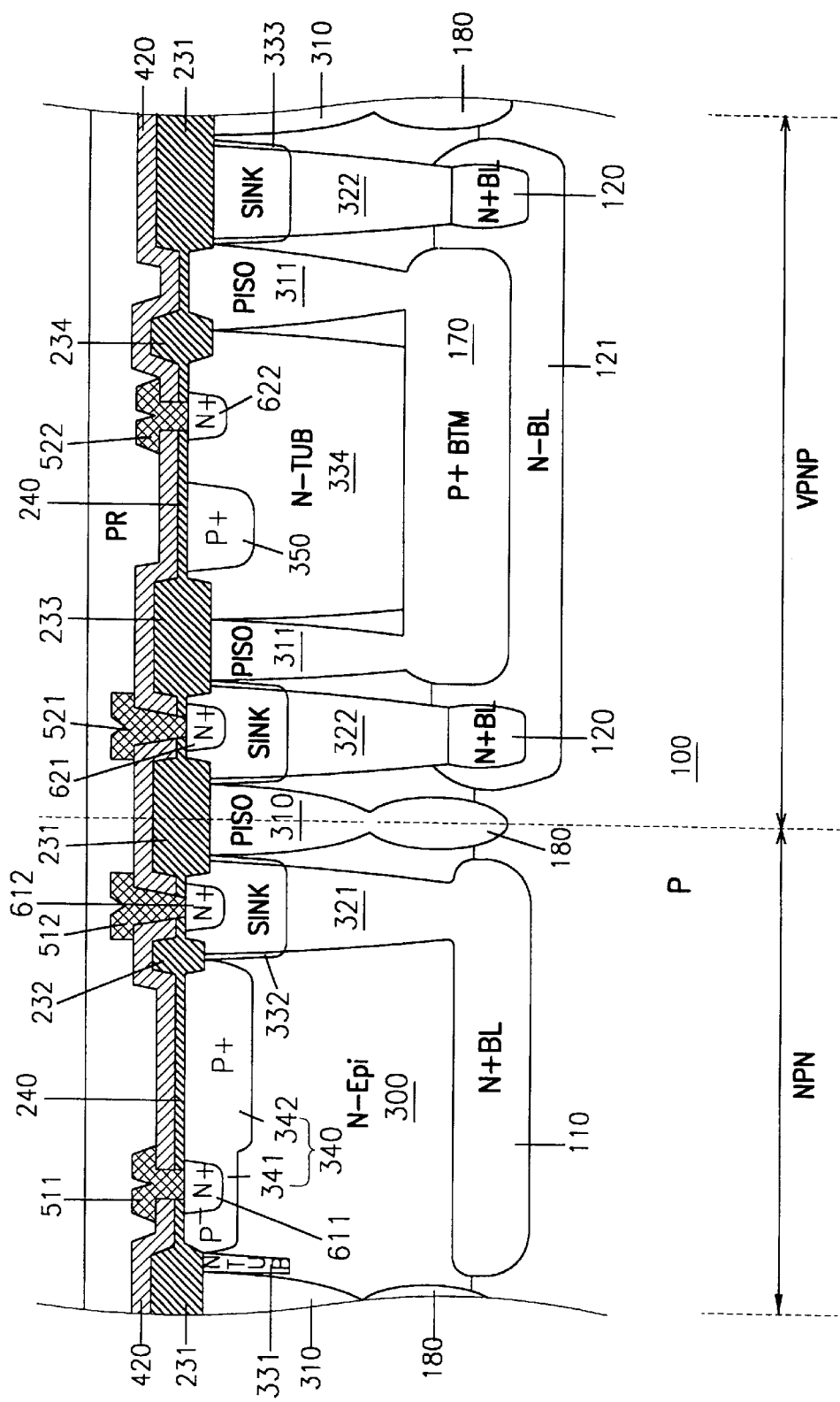
Figure 29B:
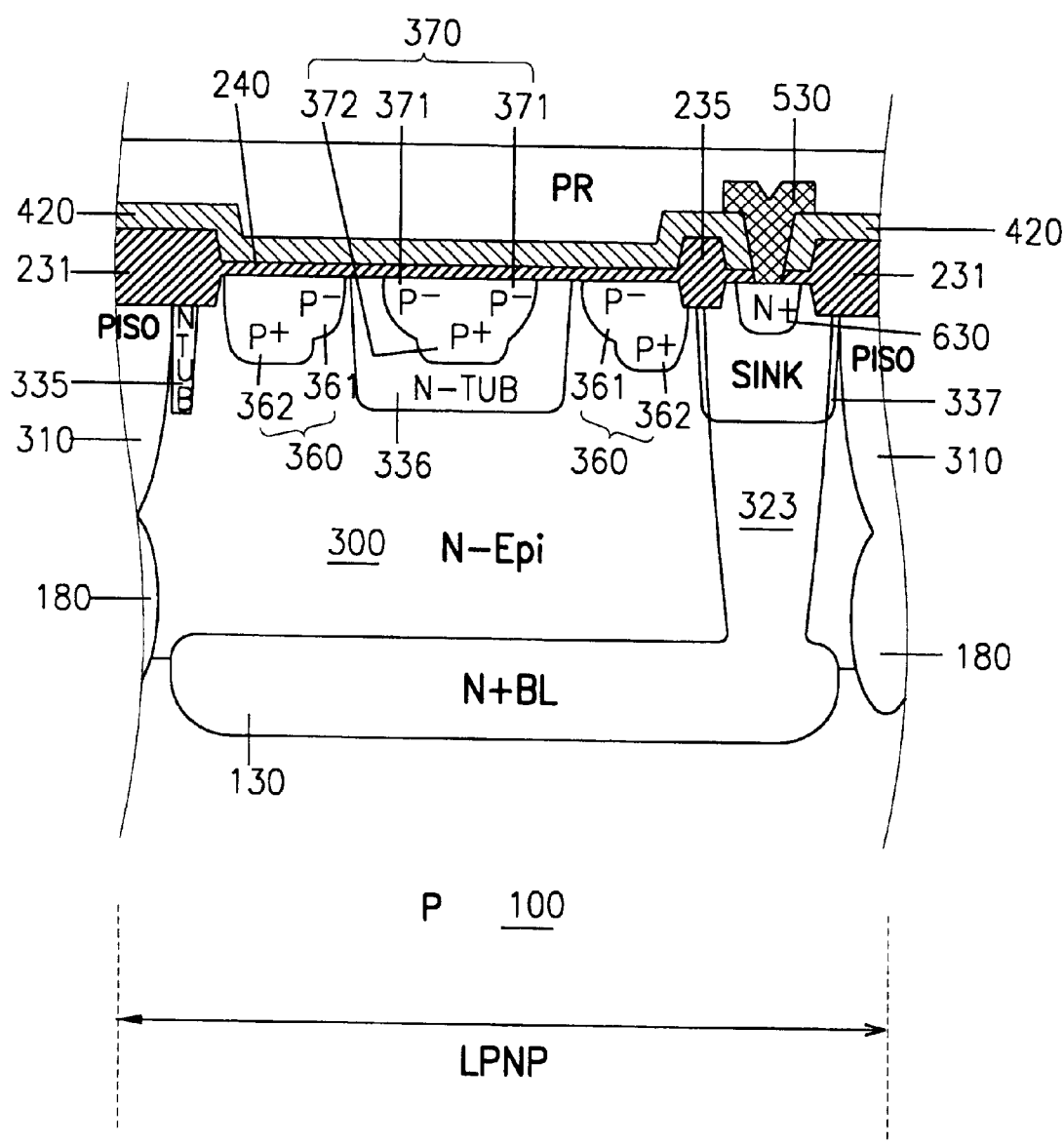
Figure 29C:
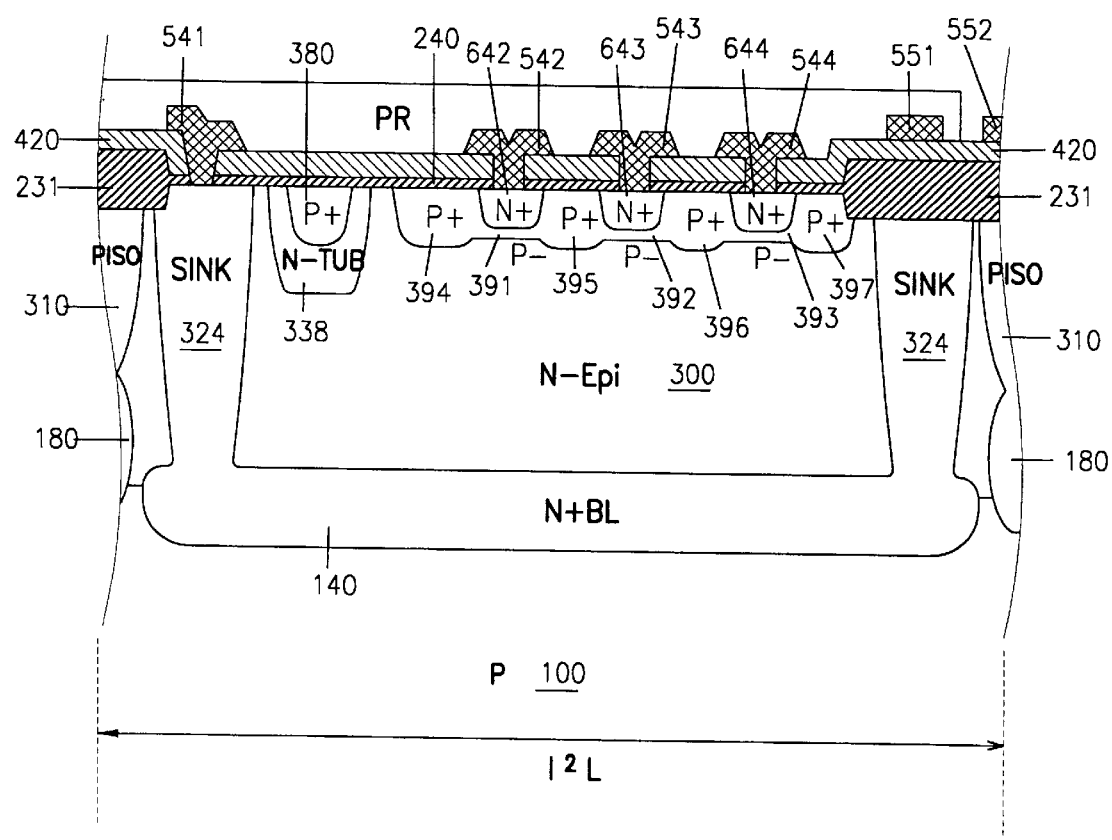
Figure 29D:
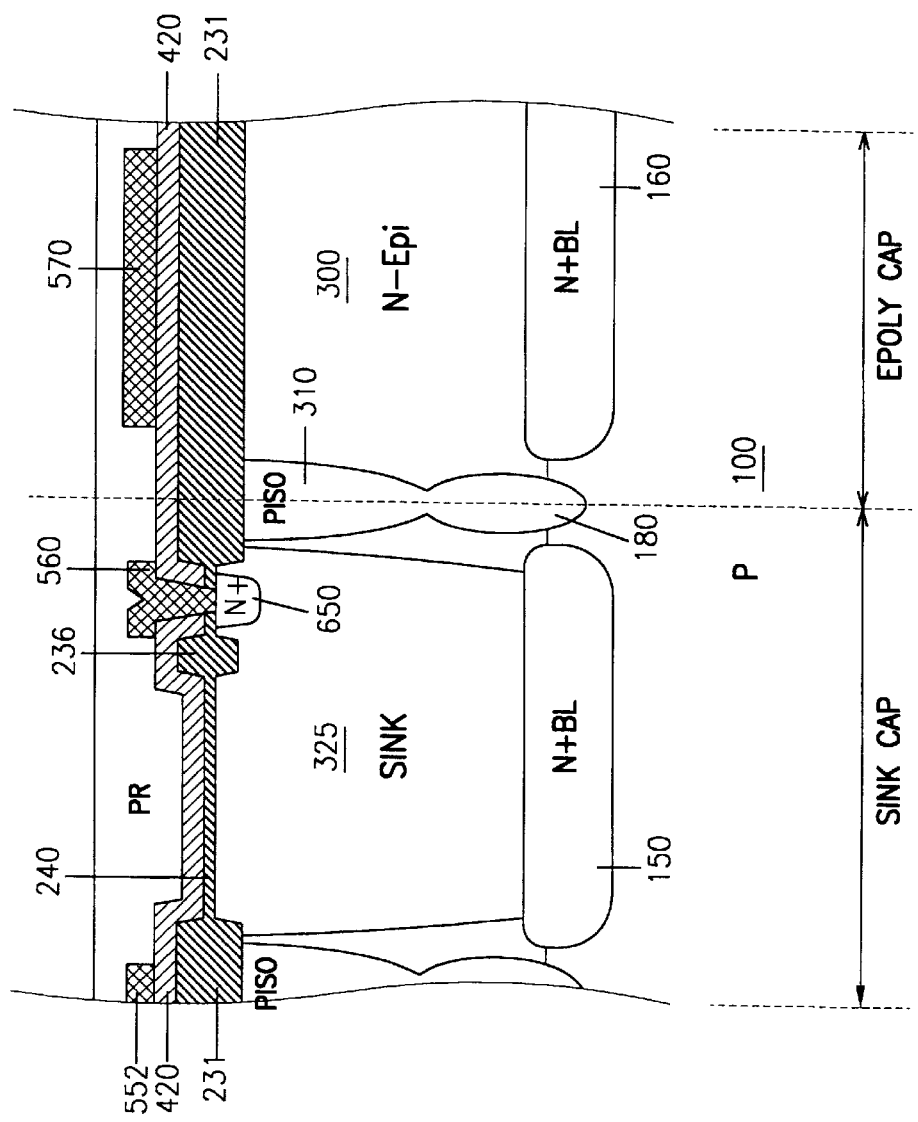
Figure 30A:
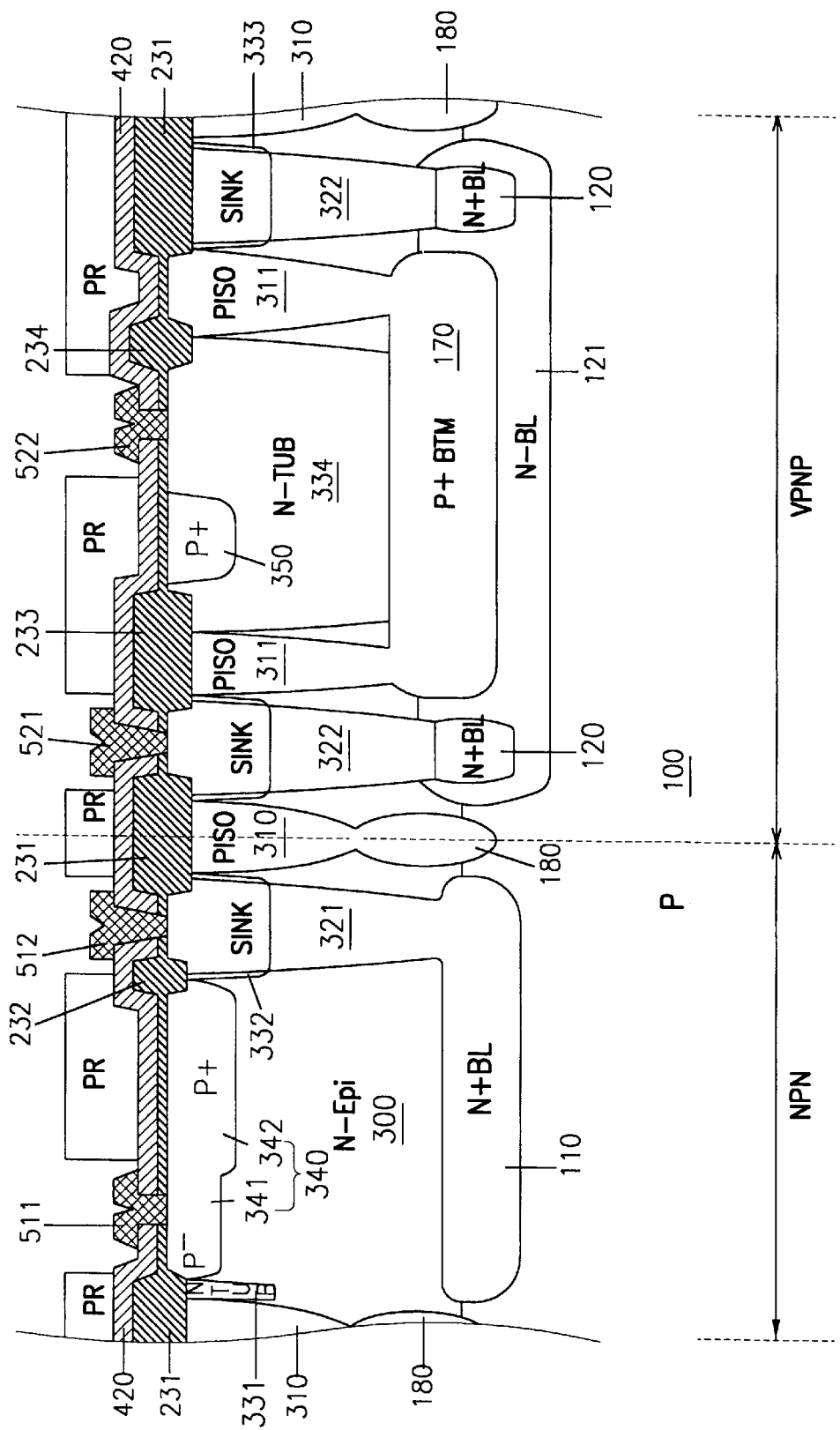
Figure 30B:
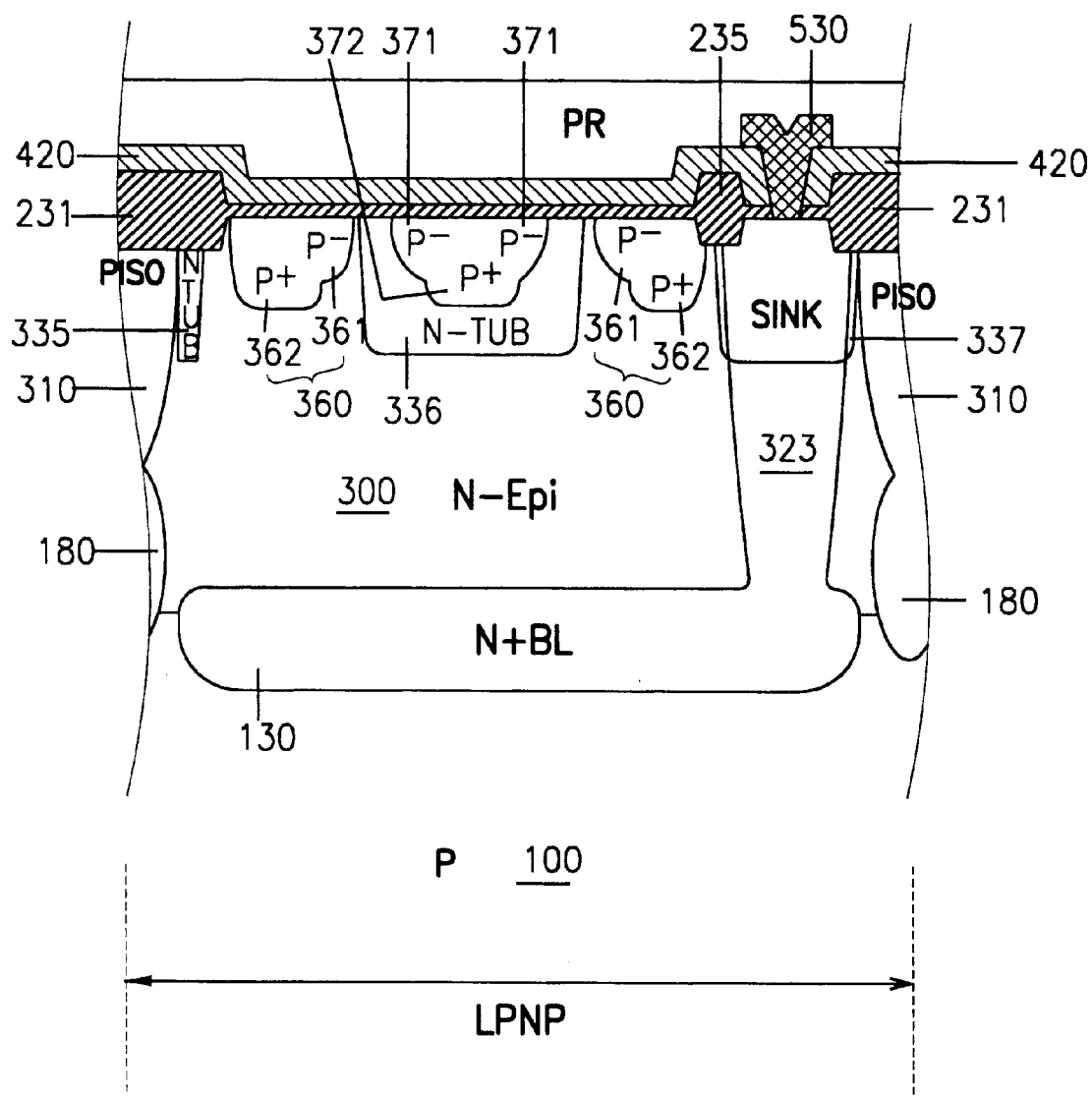
Figure 30C:
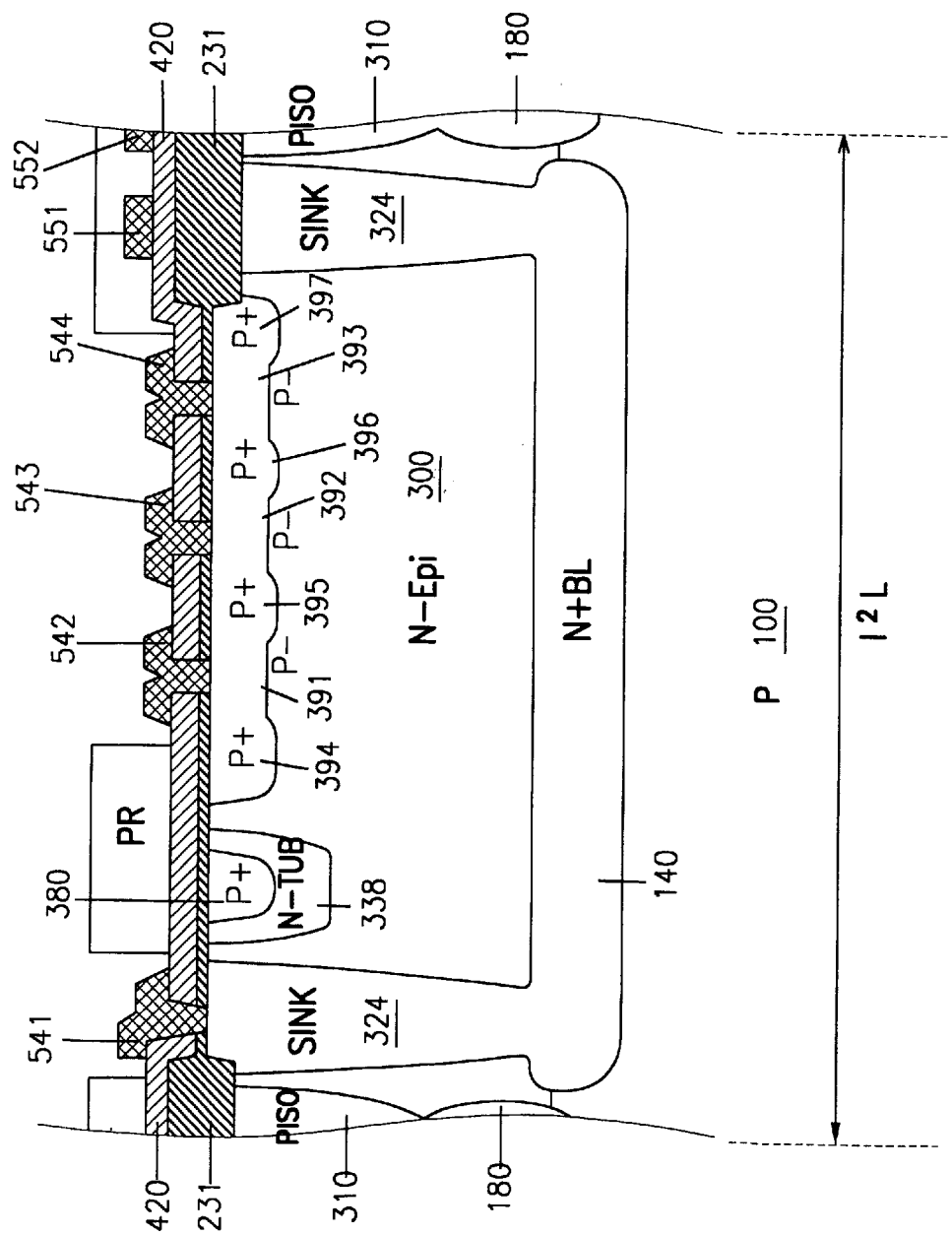
Figure 30D:
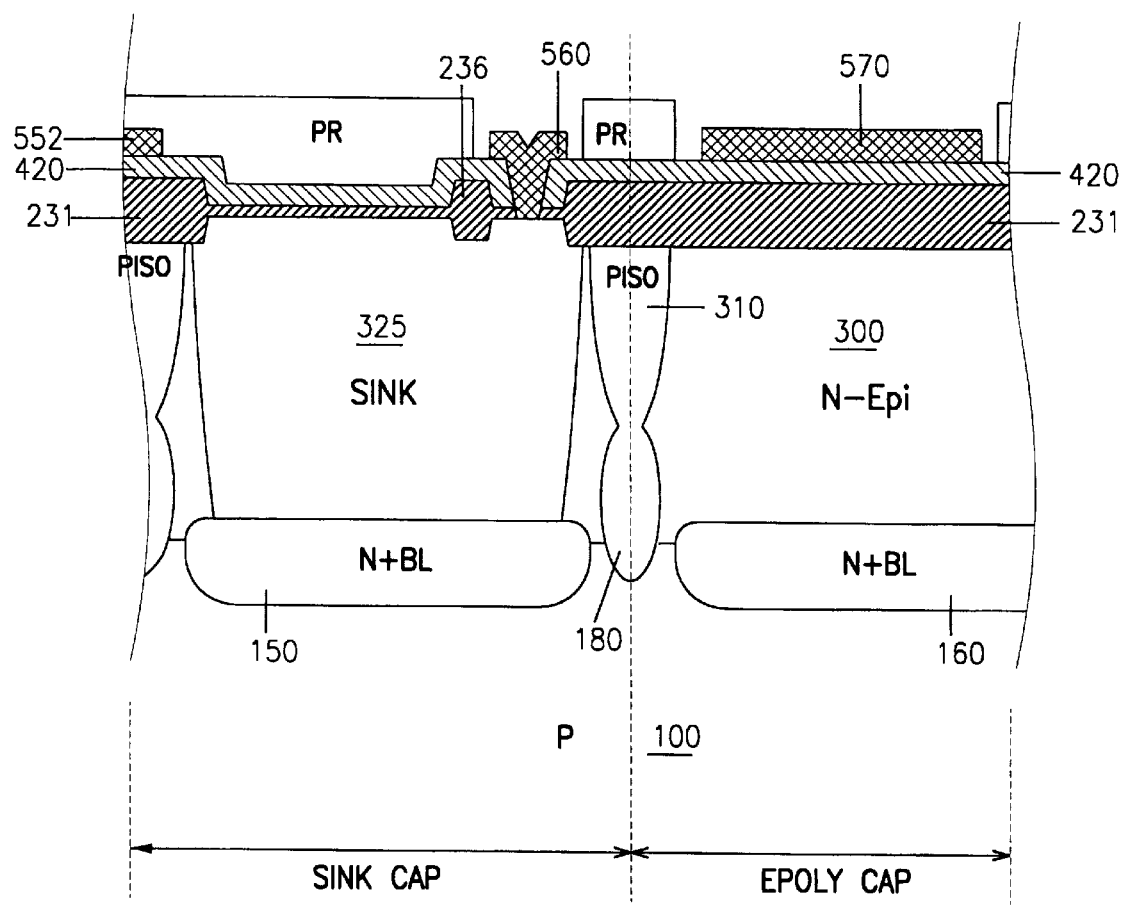
Figure 31A:
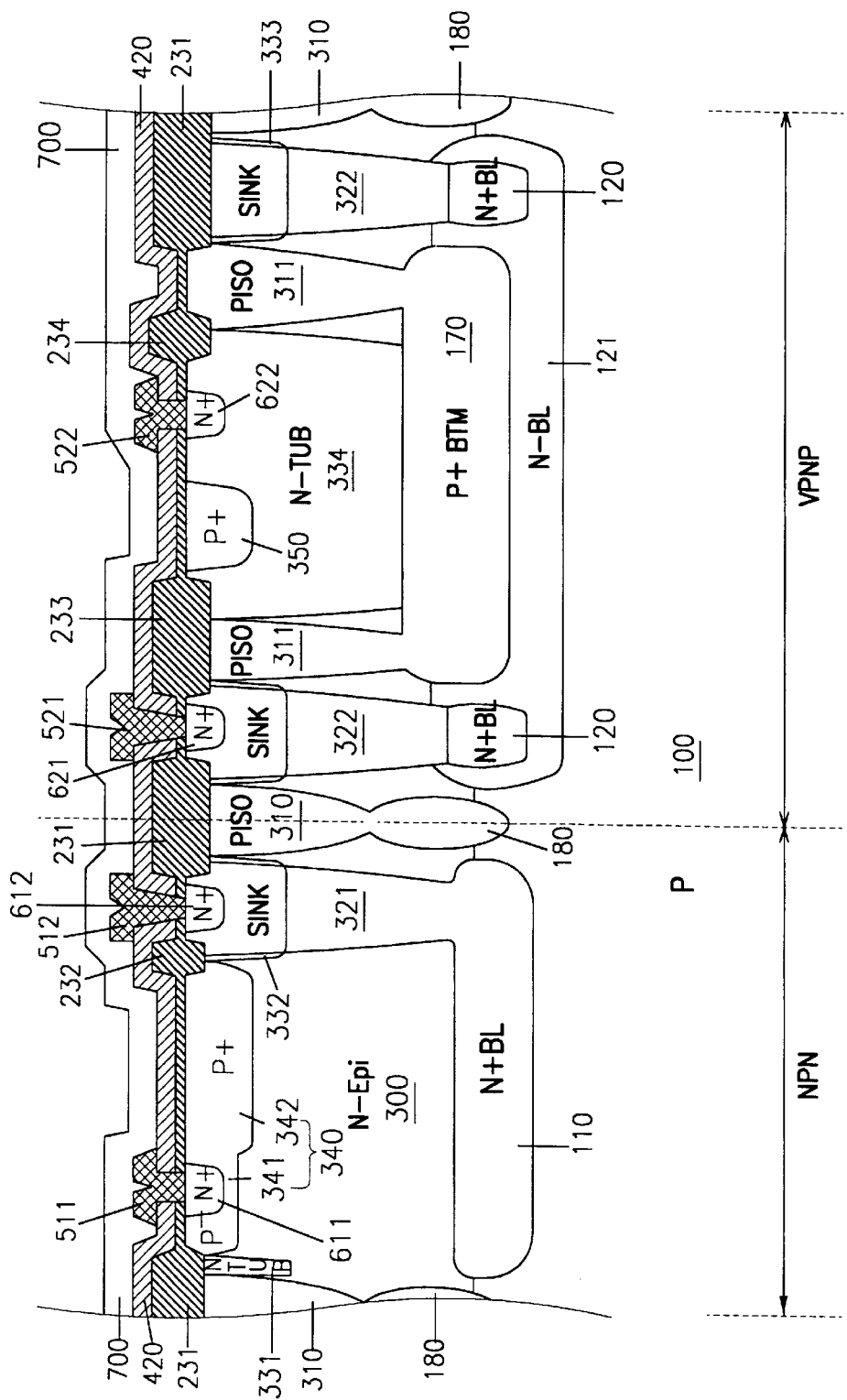
Figure 31B:
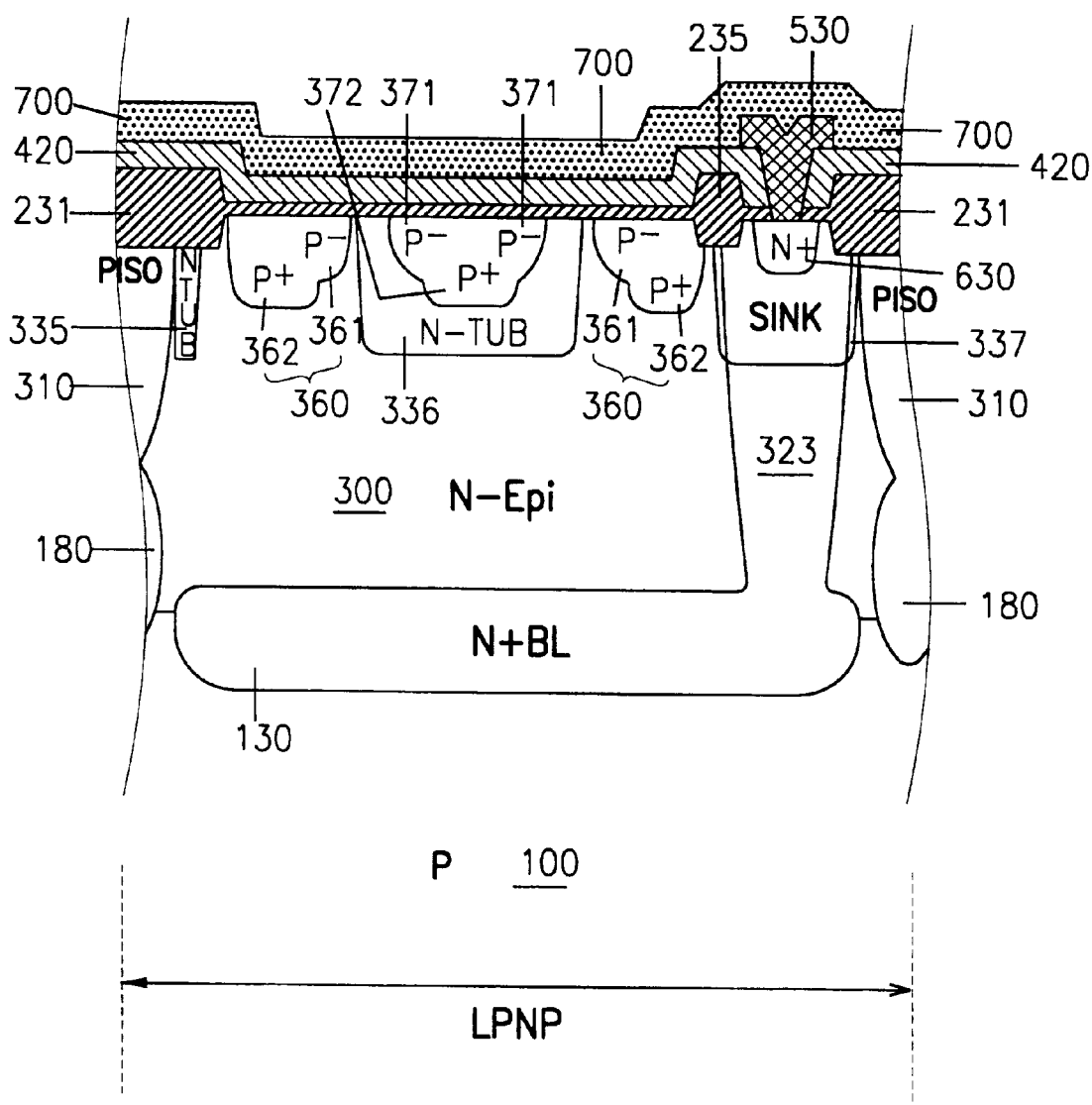
Figure 31C:
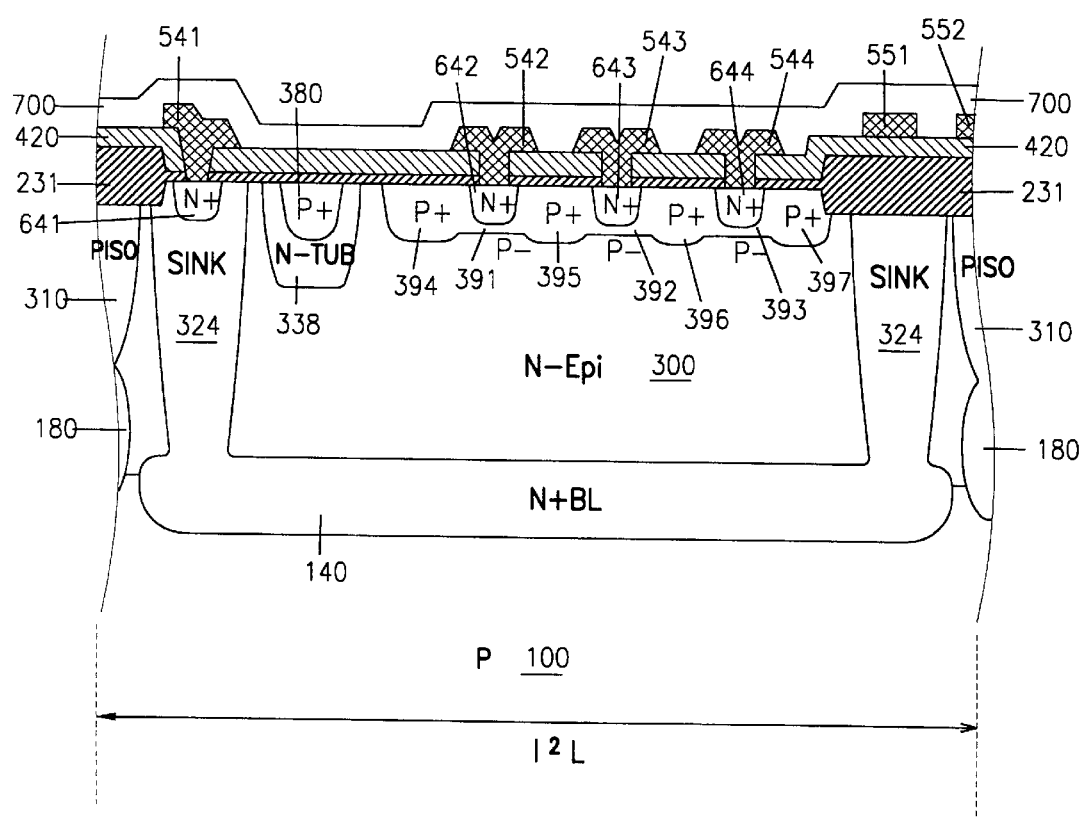
Figure 31D:
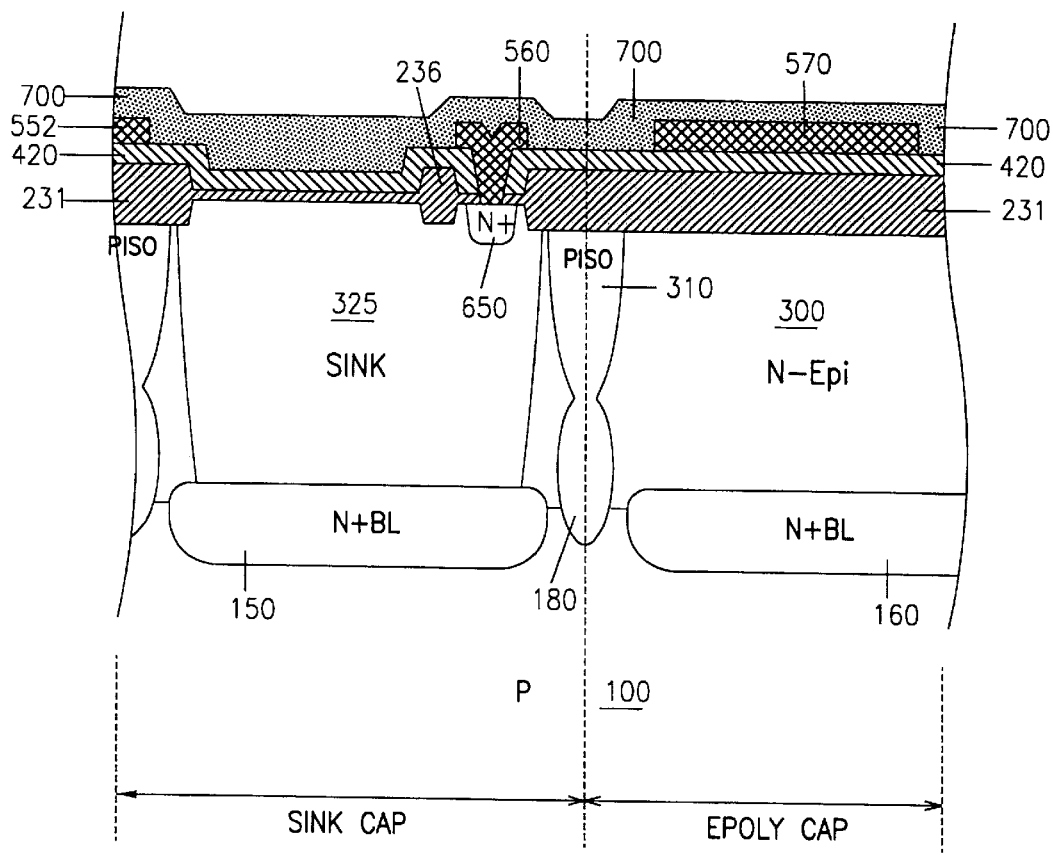
Figure 32A:
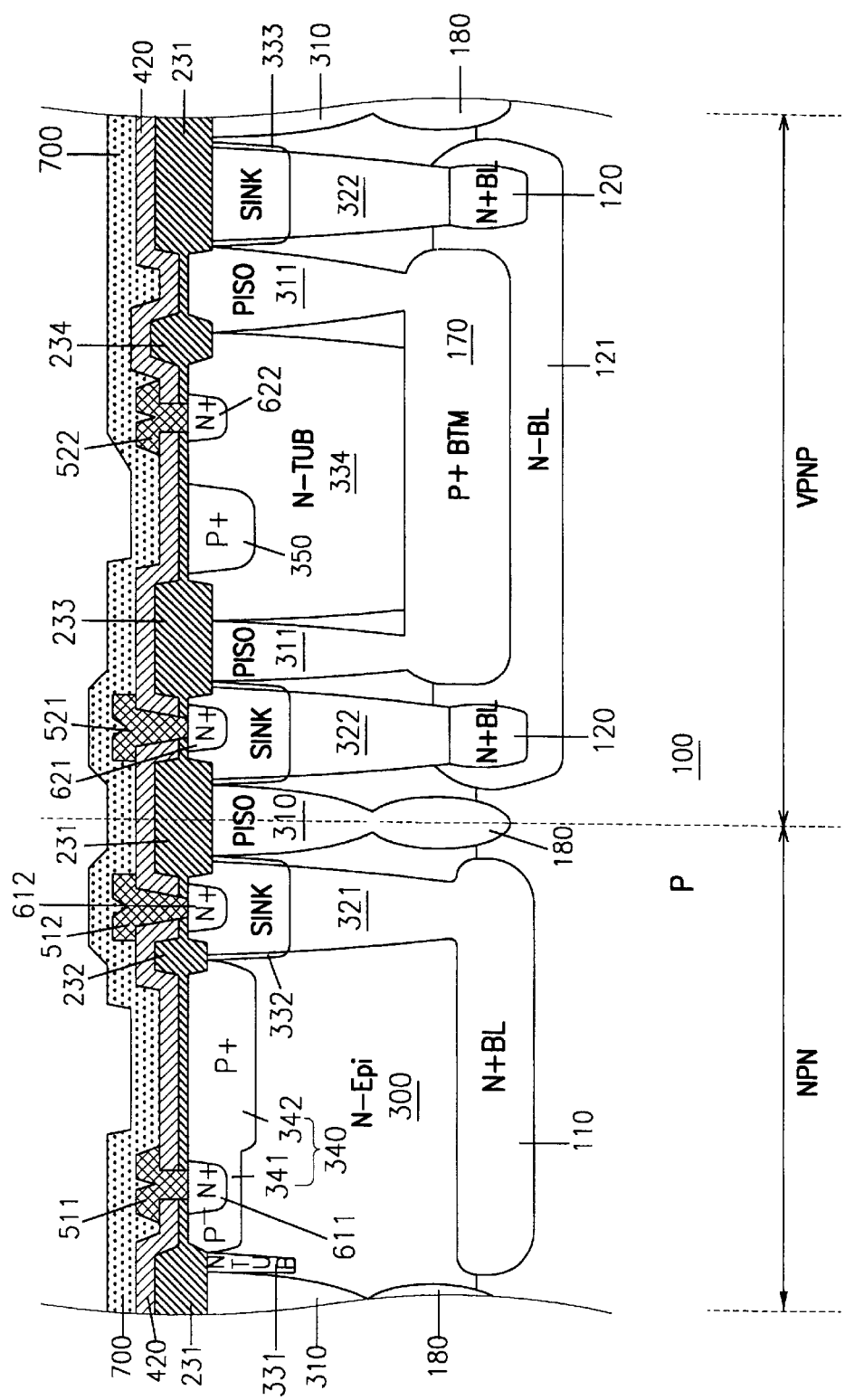
Figure 32B:
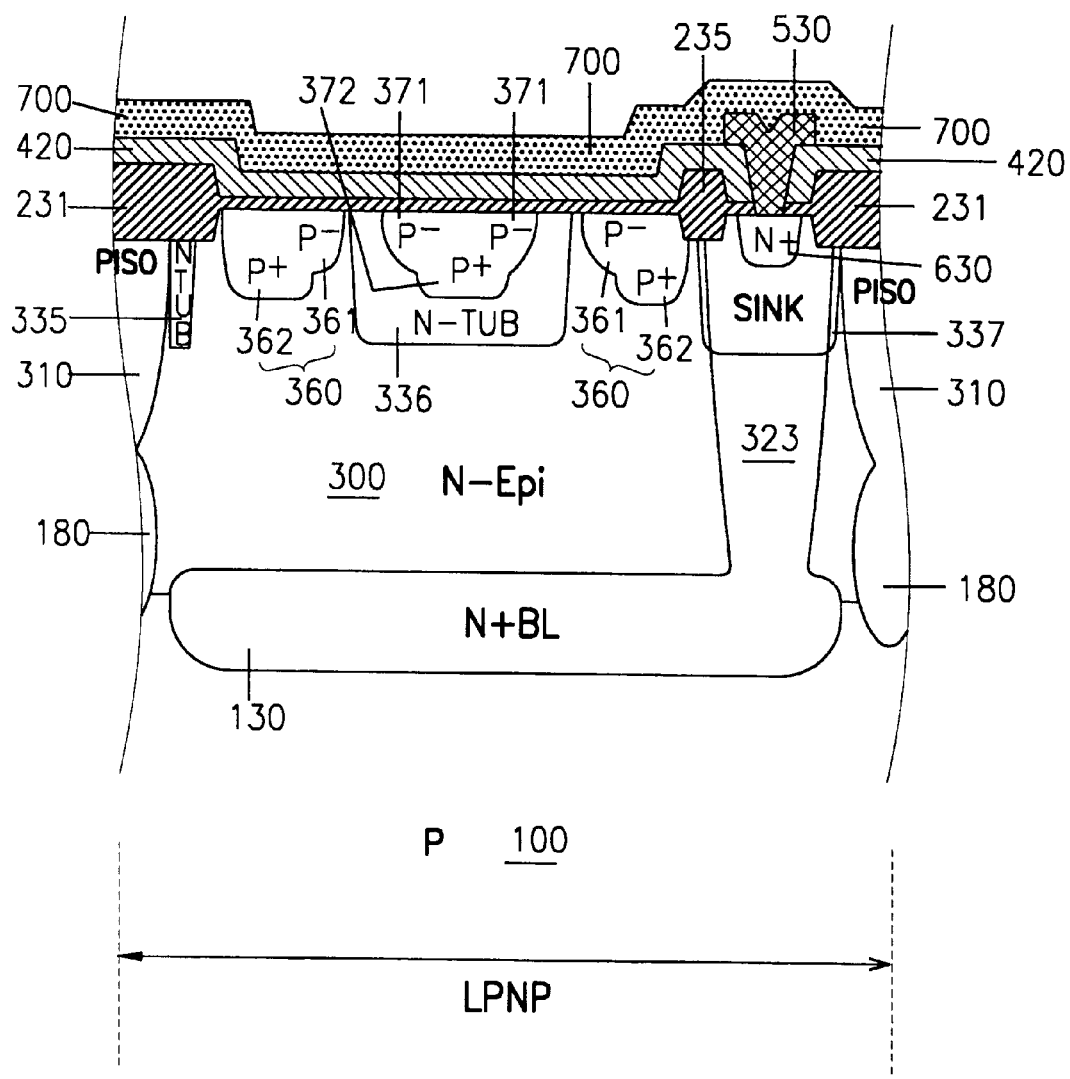
Figure 32C:
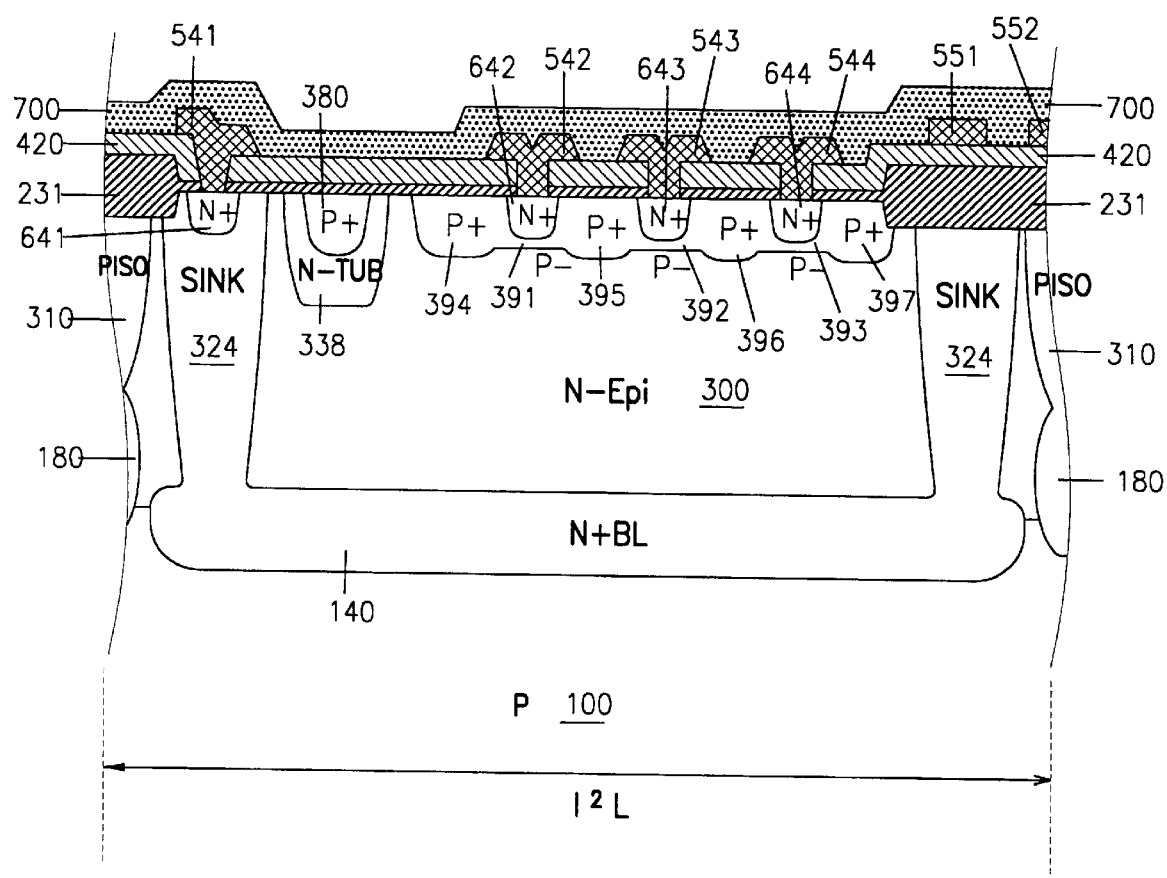
Figure 32D:
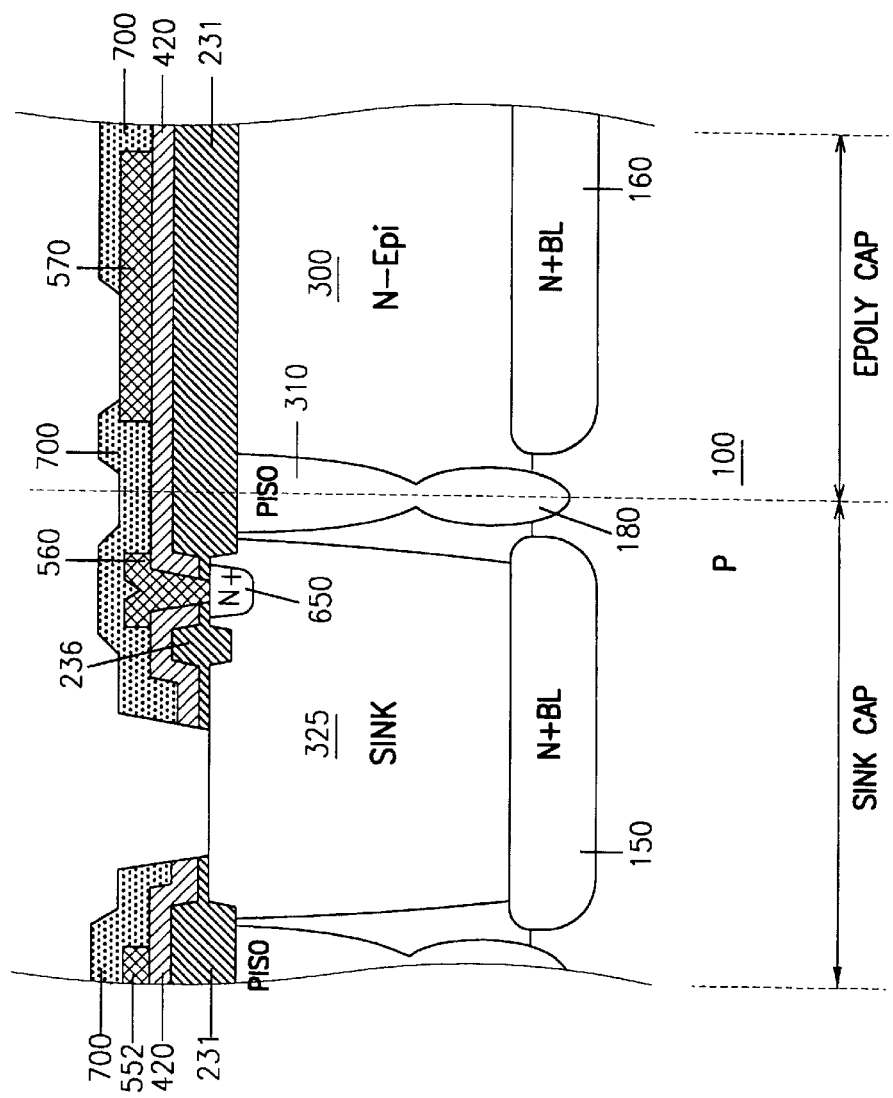
Figure 33B:
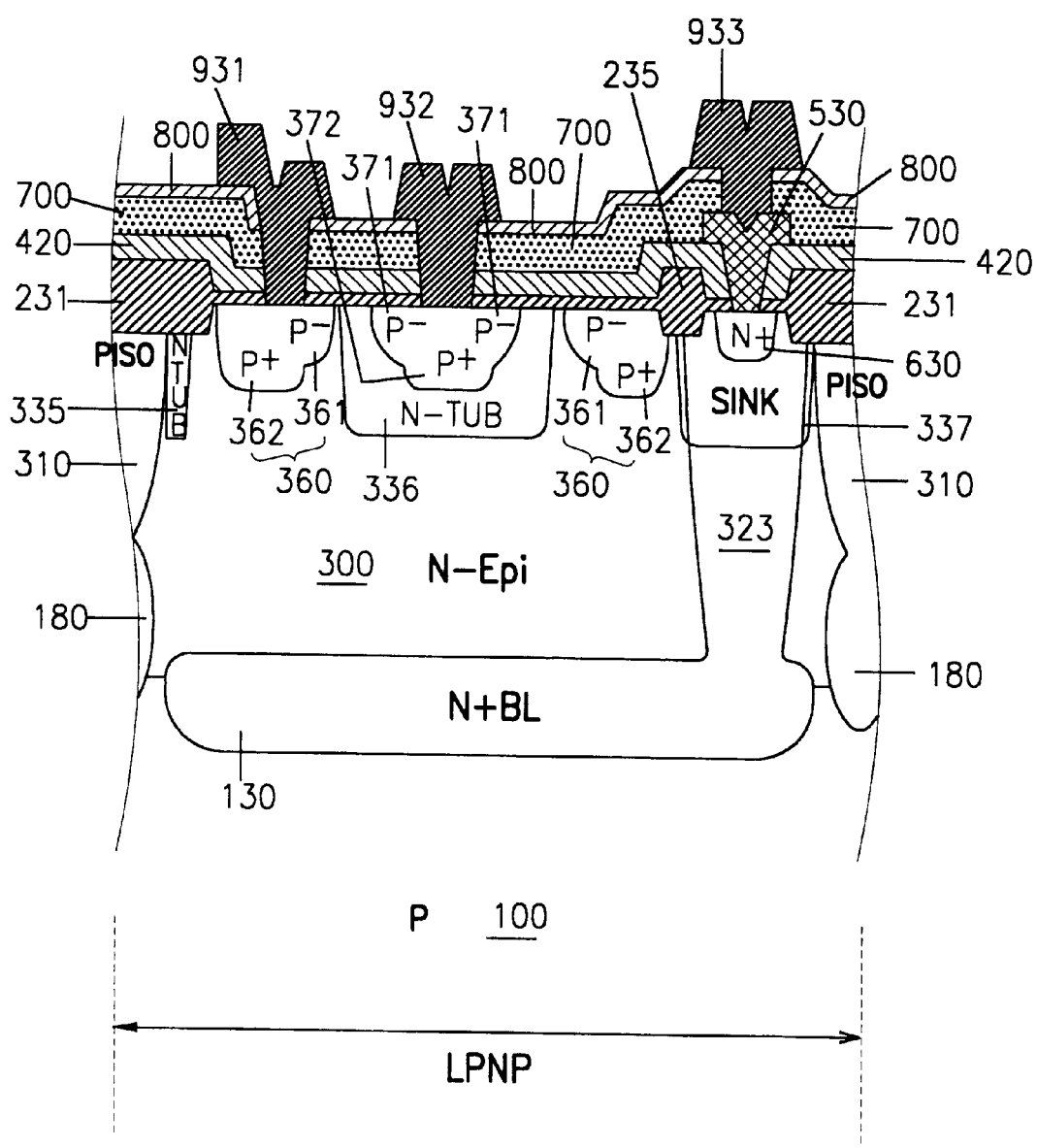
Figure 33C:
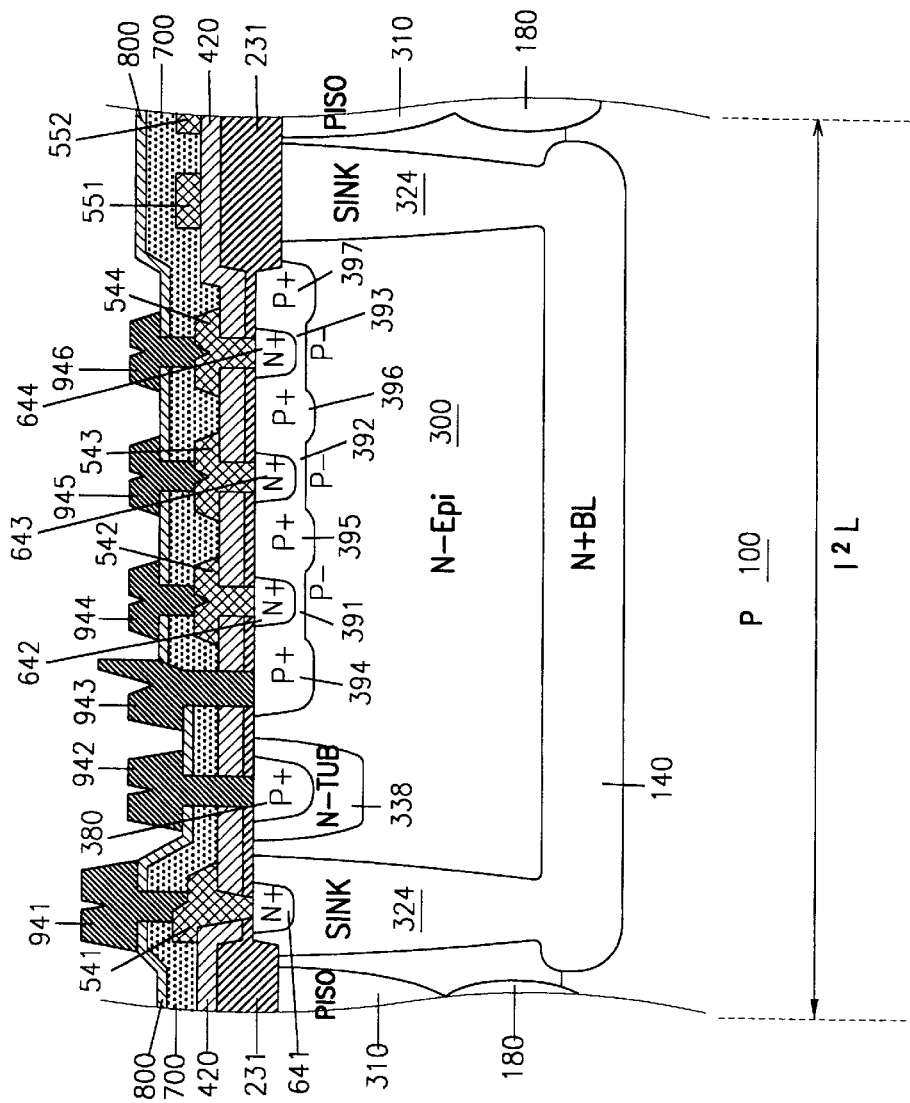
Figure 33D:
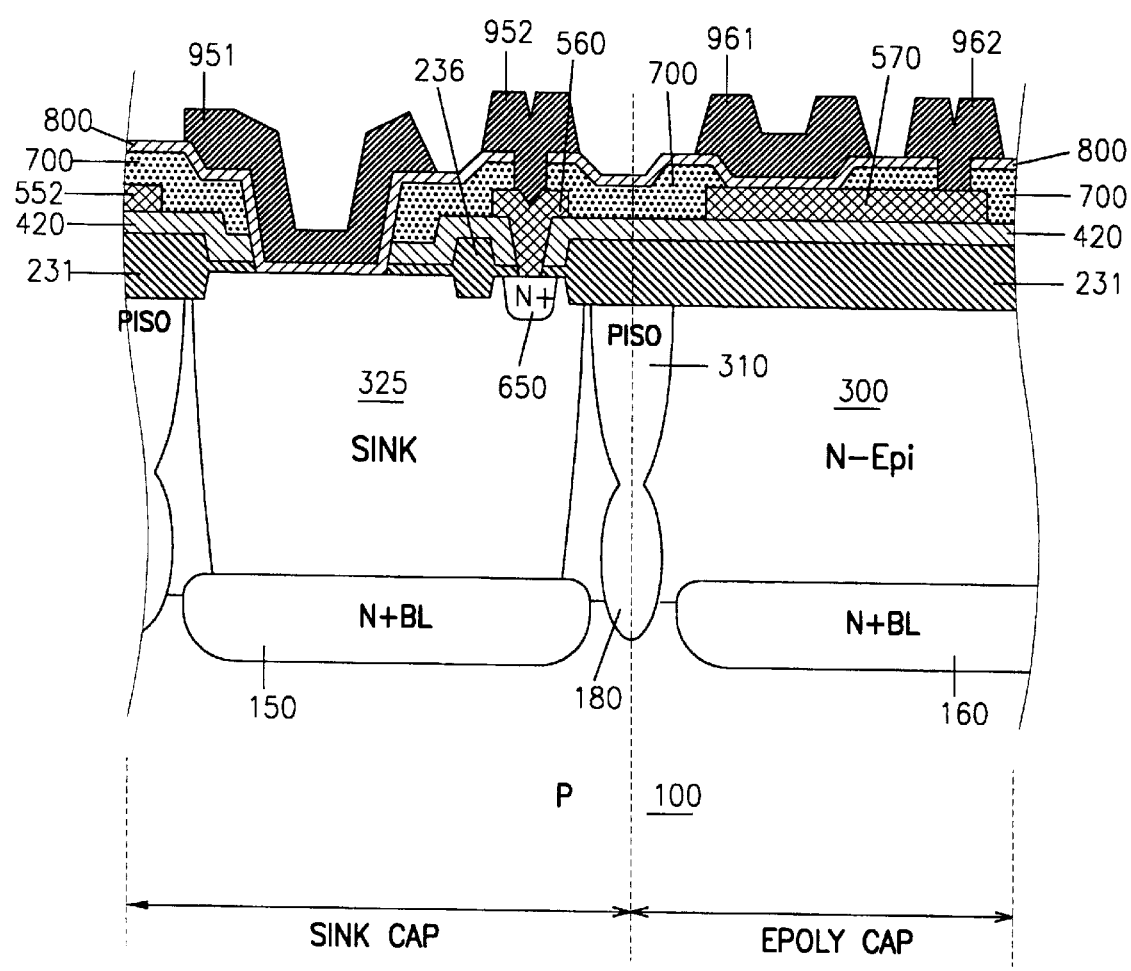

Finally, a polysilicon capacitor according to an embodiment of the present invention is described with reference to FIGS. 12 and 13 which are a layout diagram of the masks and a sectional view of the capacitor, respectively.

An epitaxial layer 300 doped with low-density n type impurities is formed on a p type substrate 100, and an n+ buried layer 160 doped with high-density n type impurities is formed between the substrate 100 and the epitaxial layer 300.

The epitaxial layer 300 is covered with a thick oxide layer 231 made by LOCOS method. An insulating layer such as a low temperature oxide (LTO) layer 420 is formed on the thick oxide layer 231, but the LTO layer 420, may be eliminated if desired.

A polysilicon layer 570 is formed on the LTO layer 420, and an insulating layer such as an LTO layer 700, which may be eliminated, is formed on the polysilicon layer 570. The LTO layer 700 has a first contact hole which exposes a portion of the polysilicon layer 570, the first contact hole is covered with an insulating layer such as a silicon nitride layer 800 formed thereon. The nitride layer 800 and the LTO layer 700 have a second contact hole which exposes the polysilicon layer 570, and a metal electrode 961 is formed in the contact hole to be in electrical contact with the polysilicon layer 570. Furthermore, another metal electrode 961 is formed on the nitride layer 800 on the first contact hole.

Above described devices along with polysilicon resistors may be integrated in a wafer, and the same numerals in each sectional view represent the same element. A method for manufacturing the several devices simultaneously will now be described.

A manufacturing method of the complementary bipolar transistor according to an embodiment of the present invention is described in detail with reference to FIGS. 14A to 33D, and the complementary bipolar transistor includes a vertical npn bipolar transistor, a vertical pnp bipolar transistor, a lateral pnp bipolar transistor, an integrated injection logic, a diffusion capacitor, a polysilicon capacitor and polysilicon resistors. The masks used in this method are illustrated in FIGS. 2, 4, 6, 8 and 12, and the reference characters in these figures represents the same mask.

A substrate 100 used in this embodiment is made of single crystalline silicon doped with p type impurities, and is considered to be divided into many element regions, i.e., a vertical npn bipolar transistor region (which will be referred as an npn region) NPN, a vertical pnp transistor region (which will be referred as a vertical pnp region) VPNP, a lateral pnp transistor region (which will be referred as a lateral pnp region) LPNP, an integrated injection logic region (which will be referred as $I^2L$ region) $I^2L$, a diffusion capacitor region SINK CAP and a polysilicon capacitor region EPOLY CAP.

1. Initial Oxidation

An initial oxide layer 200 of thickness 7,000 Å–8,000 Å is formed on the substrate 100 by thermal oxidation, and is patterned using a mask NPBL (see FIGS. 14A, 14B, 14C and 14D). The initial oxide layer 200 is located at the borders of the element regions and at the central portion of the vertical pnp region VPNP to expose the edges of the vertical pnp region VPNP. The portions of the substrate 100 where the initial oxide layer 200 is located will be recessed later, and these recesses will serve as alignment keys for aligning the following patterns with the substrate 100.

2. Ion Implantation for N+ Buried Layer

Arsenic ions are implanted into the substrate 100 with dosage of about $10^{15}$ atoms/cm$^2$ and the energy of 70 to 100 keV using the initial oxide layer 200 as an implant mask as shown in FIGS. 14A–14D.

3. Photolithography And Ion Implantation for N− Buried Layer

A photoresist pattern PR exposing the central portion of the vertical pnp region VPNP using a mask NMBL, and the exposed portion of the initial oxide layer 200 is removed (see FIGS. 15A, 15B, 15C and 15D). Phosphorous ions are implanted into the substrate 100 with the dosage of $10^{14}$ atoms/cm$^2$ and the energy of 70 to 100 keV.

4. Diffusion for N+ Buried Layer and N− Buried Layer

The remaining photoresist pattern PR is removed, and drive-in process is performed to form n+ buried layers 110, 120, 130, 140, 150 and 160 in the respective element regions NPN, VPNP, LPNP, I$^2$L, SINK CAP and EPOLY CAP and an n− buried layer 121 in the vertical pnp region VPNP (see FIGS. 16A, 16B, 16C and 16D). In the vertical pnp region VPNP, the n− buried layer 121 is formed all around the region and an n+ buried layer 120 is formed on the n− buried layer 121 along the edges of the n− buried layer 121. The junction depth of the n− buried layer 121 is deeper than that of the n+ buried layer 120 because the phosphorous ions diffuse faster than arsenic ions.

5. Removal of the Initial Oxide Layer and First Buffer Oxidation

The initial oxide layer 200 and oxide layers produced during the thermal treatment such as drive-in process are removed, and the portion of the substrate where the initial oxide layer 200 is located is recessed. This recessed portion is used as alignment keys for aligning later formed patterns. Then, first buffer oxide layer 210 with thickness of 500–800 Å is formed on the substrate 100 by thermal oxidation as shown in FIGS. 17A, 17B, 17C and 17D.

6. Photolithography, Ion Implantation and Diffusion for P+ Bottom Regions

A photoresist pattern PR exposing the borders of the element regions and the central portion of the vertical pnp region VPNP enclosed by the n+ buried layer 120 is formed on the first buffer oxide layer 210 using a mask NBTM, and boron ions are implanted into the substrate 100 with dosage of $10^{14}$ atoms/cm$^2$ and the energy of 40 to 80 keV using the photoresist pattern PR as an implant mask as shown in FIGS. 17A–17D).

The remaining portions of the photoresist pattern PR are removed, and drive-in process is performed to form isolating p+ regions 180 at the borders of the element regions and an p+ bottom region 170 in the vertical pnp region VPNP.

7. Removal of the First Buffer Oxide Layer

The first buffer oxide layer 210 is removed.

8. Epitaxial Growth

A low-density n− epitaxial layer 300 having thickness of 5.5–6.5 μm and resistivity of 1.2–1.6 Ωm is grown on the substrate 100. At this time, the buried layers 110, 120, 130, 140, 150 and 160, the isolating p+ regions 180 and the bottom region 170 are grown along with the epitaxial layer 300. The p+ legions 180 and the bottom region 170 having p type impurities grow most highly, the next highest is the n− buried layer 121 which has fast but low-density impurities, and the n+ buried layers 110, 120, 130, 140, 150 and 160 have the lowest height since they have slowly-diffused impurities (see FIGS. 18A, 18B, 18C and 18D).

9. Second Buffer Oxidation

A second buffer oxide layer 220 having thickness of 500–800 Å is grown on the epitaxial layer 100 by thermal oxidation as shown in FIGS. 18A–18D.

10. Photolithography and Ion Implantation for Isolation Regions

A photoresist pattern PR exposing the portions of the buffer oxide layer 220 which are located at the borders of the element regions and above the edges of the bottom layer 170 is formed on the buffer oxide layer 220 using a mask PISO as shown in FIGS. 19A, 19B, 19C and 19D. Boron ions are implanted into the epitaxial layer 300 with the dosage of $10^{15}$ atoms/cm$^2$ and the energy of 40 to 80 keV using the photoresist pattern PR as an implant mask, and the photoresist pattern PR is removed.

11. Photolithography and Ion Implantation for Sink Regions

A photoresist pattern PR is formed on the buffer oxide layer 230 using a mask NSIN. The photoresist pattern PR exposes the portions of the buffer oxide layer 230, which are located above one edges of the n+ buried layers 110 and 130 in the npn region NPN and the lateral pnp region LPNP, above all edges of the n+ buried layers 140 in the I$^2$L region I$^2$L and above the n+ buried layers 120 and 150 in the vertical pnp region VPNP and the diffusion capacitor region SINK CAP (see FIGS. 20A, 20B, 20C and 20D). Phosphor ions are implanted into the epitaxial layer 300 with the dosage of $10^{15}$ atoms/cm$^2$ and the energy of 80 to 100 keV using the photoresist pattern PR as an implant mask, and the photoresist pattern PR is removed.

12. Photolithography and Ion Implantation for Tub Regions

A photoresist pattern PR is formed on the buffer oxide layer 220 using a mask NTUB. The photoresist pattern PR exposes the following portions of the buffer oxide layer 220 (see FIGS. 21A, 21B, 21C and 21D):

in the npn region NPN, the portion where ions are implanted in the previous step and the portion which is located above the other edge of the n+ buried layer 110;

in the vertical pnp region VPNP, the portion where ions are implanted in the previous step and the portion which is located above the central portion of the bottom layer 170;

in the lateral pnp region LPNP, the portion where ions are implanted in the previous step, the portion which is located above the other edge of the n+ buried layer 130 and the portion above the central portion of the n+ buried layer 130; and in the I$^2$L region I$^2$L, the portion which is located above the n+ buried layer 140.

Phosphor ions are implanted into the epitaxial layer 300 with the dosage of $10^{13}$ atoms/cm$^2$ and the energy of 80 to 100 keV using the photoresist pattern PR as an implant mask, and the photoresist pattern PR is removed.

13. Deposition of Nitride Layer

A nitride layer 400 with thickness of about 1,000 Å is deposited on the buffer oxide layer 220 by using the CVD (chemical vapour deposition) method.

14. Diffusion for isolation Regions, Sink Regions and Tub regions

Drive-in process is performed under the condition of 1,000–1,300° C. for 250–300 minutes to form a plurality of diffusion regions which extend downward from the surface of the epitaxial layer 300 in the epitaxial layer 300 (see FIGS. 22A, 22B, 22C and 22D). P+ isolation regions 310 are formed at the borders of the element regions, and extend downward to be in contact with the p+ isolating regions 180. A p+ region 311 is formed on the edges of the bottom layer 170 in the vertical pnp region VPNP. N+ sink regions 321 and 323 are formed respectively on one edge of the n+ buried layers 110 and 130 in the npn region NPN and the lateral pnp region LPNP such that the n+ sink regions 321 and 323 are respectively connected to the n+buried layers 110 and 130. N+ sink regions 322 and 325 are formed respectively on the n+ buried layers 120 and 150 in the vertical npn region VPNP and the diffusion capacitor region SINK CAP such that the n+ sink regions 322 and 325 are respectively connected to the n+ buried layers 120 and 150. Another n+ sink region 324 is formed on the all edges of the n+buried layer 140 to be connected thereto. An n– tub region having a narrow portion 331 and a broad portion 332 is formed in the npn region NPN such that the narrow portion 331 is adjacent to a portion of the isolation region 310 and located opposite the sink region 321, and the broad portion 332 is overlapped with the sink region 321. In the vertical pnp region VPNP, an n– tub region 333 is formed to be overlapped with the sink region 322 and an n– tub region 334 is formed in the region surrounded by the p+ region 311. An n– tub region having a narrow portion 335 and a broad portion 337 is formed in the lateral pnp region LPNP such that the narrow portion 335 is adjacent to a portion of the isolation region 310 and located opposite the sink region 323, and the broad portion 337 is overlapped with the sink region 323, and another n– tub region 336 is formed in the central portion of the region surrounded by the tub region 335 and 337. In the I²L region I²L, a tub region 338 is formed in a portion of the region surrounded by the sink region 324. One of the overlapped sink region and tub region may be eliminated.

15. Defining Active Area

The nitride layer 410 is patterned by using a mask ACT to define active areas as shown in FIGS. 23A–23D. The active area where the nitride layer 400 remains are as follows:

in the npn region NPN, the area surrounded by the tub region 331 and 332 and the area on the sink region 321;
in the vertical pnp region VPNP, the area surrounded by the p+ region 311, the area on a portion of the sink region 322 and the area on a portion of the p+ region 311;
in the lateral pnp region LPNP, the area surrounded by the tub region 335 and 337 and the area on the sink region 323;
in the I²L region I²L, the area surrounded by the sink region 324 and the area on a portion of the sink region 324; and
in the diffusion capacitor region SINK CAP, the area on the sink region 325 except on the a portion of the sink region 325.

The portion of the nitride layer 400 in the polysilicon capacitor region EPOLY CAP is removed.

A thick oxide layer 231, 232, 233, 234, 235 and 236 with thickness of 7,000–8,000 Å is formed on the portions of the epitaxial layer 300 which is not covered by the nitride layer 410 by thermal oxidation under the temperature of 900–1,000° C. for about 160 minutes.

16. Removal of Nitride Layer and Second Buffer Oxide Layer

The remaining portions of the nitride layer 410 and the second buffer layer 220 are removed.

17. Pad Oxidation

A pad oxide layer 240 with thickness of 500–800 Å is formed by thermally oxidizing the exposed portions of the epitaxial layer 300 between the thick oxide layer as shown in FIGS. 24A, 24B, 24C and 24D.

18. Photolithography and Ion Implantation for First Intrinsic Regions

A photoresist pattern PR exposing the portion of the pad oxide layers 240 on the active area near the narrow portion 331 of the tub region in the npn region NPN and on the central portion of the tub region 336 and on the portion between the tub region 336 and the tub region 335 and 337 in the lateral pnp region LPNP is formed on the pad oxide layers 240 and the thick oxide layer using a mask INT1 (see FIGS. 25A, 25B, 25C and 25D which illustrate this step along with the following step).

Boron ions are implanted into the epitaxial layer 300 with the dosage of $10^{13}$ atoms/cm$^2$ and the energy of 30 to 50 keV using the photoresist pattern PR as an implant mask, and the photoresist pattern PR is removed.

19. Photolithography and Ion Implantation for Second Intrinsic Regions

A photoresist pattern PR exposing the portion of the pad oxide layers 240 between the tub region 338 and the thick oxide layer 231 in the I²L region I²L is formed on the pad oxide layers 240 and the thick oxide layer using a mask INT2 (see also FIGS. 25A, 25B, 25C and 25D).

Boron ions are implanted into the epitaxial layer 300 with the dosage of $10^{12}$ atoms/cm$^2$ and the energy of 140 to 180 keV using the photoresist pattern PR as an implant mask, and the photoresist pattern PR is removed.

20. Photolithography and Ion Implantation for Extrinsic Regions

A photoresist pattern PR is formed on the pad oxide layers 240 and the thick oxide layer using a mask EXT. The photoresist pattern PR exposes the following portions of the pad oxide layers 240 (see FIGS. 26A, 26B, 26C and 26D):

in the npn region NPN, the portion which is located near the sink region 321;
in the vertical pnp region VPNP, the portion which is located on a portion of the tub region 334 near the thick oxide layer 333, and the portion which is located on the p+ region 311;
in the lateral pnp region LPNP, the portion which is located on the central portion of the tub region 336, and the portion which is located on the portion of the epitaxial layer 300 near the tub region 335 and 337; and
in the I²L region I²L, the portion which is located on the central portion of the tub region 338, and the portion which is located on the portion of the epitaxial layer 300 between the tub region 338 and the sink region 321 (except for the three isolated portions);

Boron ions are implanted into the epitaxial layer 300 with the dosage of $10^{15}$ atoms/cm$^2$ and the energy of 30 to 50 keV using the photoresist pattern PR as an implant mask, and the photoresist pattern PR is removed.

21. Deposition of Low Temperature Oxide Layer

A low temperature oxide (LTO) layer 420 is deposited on the pad oxide layers 240 and the thick oxide layer as shown in FIGS. 27A, 27B, 27C and 27D.

22. Diffusion for First and Second Intrinsic Regions and Extrinsic regions

Drive-in process is performed under the condition of 1,000–1,300° C. for 30–50 minutes to form a plurality of diffusion regions which extend downward from the surface of the epitaxial layer 300 in the epitaxial layer 300 (see FIGS. 27A–27D). A base region 340 including a p– region 341 and a p+ region 342 is formed in the npn region NPN. An emitter region 350 is formed in the tub region 334 of the vertical pnp region VPNP. In the lateral pnp region LPNP, an emitter region 370 including a p– region 371 and a p+ region 372 is formed in the tub region 336, and a collector region 360 including a p– region 361 and a p+ region 362 is formed outside of the tub region 336. In the I²L region I²L, an injection region 380 is formed in the tub region 338, p– regions 391, 392 and 393 separated from one another are formed outside of the tub region 338, and a p+ region having portions 394, 395, 396 and 397 is formed to surround the p– regions 391, 392 and 393.

23. Photolithography for N+ Regions

The LTO layer 420 and the pad oxide layers 240 are patterned to have contact holes by using a mask EMIT as shown in FIGS. 28A, 28B, 28C and 28D. The contact holes expose the p– region 341 and the sink region 321 in the npn region NPN, the tub region 334 and the sink region 322 in the vertical pnp region VPNP, the sink region 323 in the lateral pnp region LPNP, the p– regions 391, 392 and 393 and the sink region 324 in the I²L region I²L, and the sink region 325 in the diffusion capacitor region SINK CAP.

24. Deposition and Photolithography of Polysilicon Layer

A polysilicon layer having thickness of 2,500–3,000 Å is deposited on the LTO layer 420 and patterned to form polysilicon electrodes 511, 512, 521, 522, 530, 541, 542, 543, 544 and 560 in the contact holes, two polysilicon resistors 551 and 552 above the thick oxide layer 231 between the I²L region I²L and the diffusion capacitor region SINK CAP, and a polysilicon pattern 570 above the thick oxide layer 231 in the polysilicon capacitor region EPOLY CAP. The polysilicon electrodes 511, 512, 521, 522, 530, 541, 542, 543, 544 and 560 are respectively connected to the diffusion regions 341, 321, 322, 334, 323, 324, 391, 392, 393 and 325 through the contact holes (see FIGS. 28A–28D).

25. Photolithography and Ion Implantation for Low Density Polysilicon Resistor

A photoresist pattern PR exposing one 552 of the polysilicon resistors 551 and 552 is formed on the LTO layer 420 and the polysilicon layer as shown in FIGS. 28A–28D. Boron ions are implanted into the polysilicon resistor 552 with the dosage of $10^{14}$ atoms/cm² and the energy of 30 to 50 keV using the photoresist pattern PR as an implant mask, and the photoresist pattern PR is removed.

26. Photolithography and Ion Implantation for High Density Polysilicon Resistor

A photoresist pattern PR exposing the other one 551 of the polysilicon resistors 551 and 552 is formed on the LTO layer 420 and the polysilicon layer as shown in FIGS. 29A, 29B, 29C and 29D. Boron ions are implanted into the polysilicon resistor 552 with the dosage of $10^{15}$ atoms/cm² and the energy of 30 to 50 keV using the photoresist pattern PR as an implant mask, and the photoresist pattern PR is removed. This step may be eliminated.

27. Photolithography and Ion Implantation for N+ Regions

A photoresist pattern PR covering the polysilicon resistors 551 and 552 is formed on the LTO layer 420 and the polysilicon layer as shown in FIGS. 30A, 30B, 30C and 30D. Arsenic ions are implanted into the polysilicon electrodes 511, 512, 521, 522, 530, 541, 542, 543, 544 and 560, and the polysilicon pattern 570 with the dosage of $10^{15}$ atoms/cm² and the energy of 100 to 140 keV using the photoresist pattern PR as an implant mask, and the photoresist pattern PR is removed. In the case of abbreviating the previous step, the ions are also implanted into the polysilicon resistor 551.

28. Deposition of Low Temperature Oxide Layer

A low temperature oxide layer 700 with thickness of about 2,500 Å is deposited on the LTO layer 420 and the polysilicon electrodes, resistors and pattern as shown in FIGS. 31A, 31B, 31C and 31D.

29. Diffusion for N+ Regions and Polysilicon Resistors

Drive-in process is performed to form a plurality of diffusion regions which extend downward from the surface of the epitaxial layer 300 in the epitaxial layer 300 (see FIGS. 31A–31D) by diffusing the ions in the polysilicon electrodes into the epitaxial layer 300. An n+ emitter region 611 and an n+ region 612 are formed respectively in the p– region 341 and the sink region of the npn region NPN. An n+ base region 622 and an n+ region 621 are formed respectively in the tub region 334 and the sink region 322 of the vertical pnp region VPNP, and an n+ region 630 is formed in the sink region 323 of the lateral pnp region LPNP. In the I²L region I²L, n+ collector regions 642, 643 and 644 is formed in the p– regions 391, 392 and 392, and an n+ region 641 is formed in the sink region 324. An n+ region 650 is formed under the polysilicon electrode 560 of the diffusion capacitor region SINK CAP.

30. Photolithography for Capacitors

The LTO layer 700 is patterned to expose the sink region 325 in the diffusion capacitor region SINK CAP and the polysilicon pattern 570 in the polysilicon capacitor region EPOLY CAP by using a mask CAP as shown in FIGS. 32A, 32B, 32C and 32D.

31. Deposition of Nitride Layer for Capacitors

A silicon nitride layer 800 with thickness of 400–600 is deposited as shown in FIGS. 33A, 33B, 33C and 33D.

32. Photolithography for Contacts

The nitride layer 800 and the LTO layer 700 is patterned to expose the polysilicon electrodes 511, 512, 521, 522, 530, 541, 542, 543, 544 and 560, the polysilicon pattern 570 and portions of the LTO layer 420 by using a mask CNT. At the same time, the exposed portions of the LTO layer 420 and the pad oxide layer 240 are removed to expose the p+ diffusion regions 342, 350, 311, 362, 372, 380 and 394 (see FIGS. 33A, 33B, 33C and 33D). The contact holes may be formed on the resistors 551 and 552.

33. Deposition and Photolithography for Metal Layer

A metal layer with thickness of about 8,500 is deposited by sputtering method on the nitride layer 800, and patterned to form metal electrodes in the contact holes by using a mask MET. The metal electrodes 911, 912, 913, 921, 922, 923, 924, 931, 932, 933, 941, 942, 943, 944, 945, 946, 952 and 962 are electrically connected to the polysilicon electrodes, the polysilicon pattern or the p+ regions through the contact holes, a metal electrode 951 is formed above the sink region 325, and a metal electrode 961 is formed above the polysilicon pattern 570.

As described above, the complementary bipolar transistor and the manufacturing method thereof according to the present invention improve the characteristics of each device and simplify the manufacturing process.

In the drawings and specifications, there have been disclosed typical preferred embodiments of the invention and, although specific terms are employed, they are used in a generic and descriptive sense only and not for purposes of limitation, the scope of the invention being set forth in the following claims.

What is claimed is:

1. A lateral bipolar transistor comprising:
   a semiconductor layer of first conductivity type;
   a first tub layer of the first conductivity type in the semiconductor layer and has higher impurity density than the semiconductor layer;

a collector region of second conductivity type in the semiconductor layer, wherein the collector region is separated from the first tub layer and surrounds the first tub layer; and an emitter region of the second conductivity type in the first tub layer.

2. The lateral bipolar transistor according to claim 1, wherein the emitter region comprises a first high-density region and a first low-density region which has lower impurity density than the first high-density region and surrounds the first high-density region.

3. The lateral bipolar transistor according to claim 2, wherein the collector region comprises a second low-density region and a second high-density region which has higher impurity density than the second low-density region and surrounds the second low-density region.

4. The lateral bipolar transistor according to claim 3, further comprising:

an isolation region of the second conductivity type for isolating the bipolar transistor, wherein the isolation region is in the semiconductor layer and surrounds the collector region, and wherein the isolation region is separated from the collector region; and a second tub region of the first conductivity type which is in the semiconductor layer and sandwiched laterally between the isolation region and the collector region.

5. The lateral bipolar transistor according to claim 1, wherein the collector region comprises a low-density region and a high-density region which has higher impurity density than the low-density region and surrounds the low-density region.

6. A lateral bipolar transistor comprising:

a semiconductor substrate of first conductivity type;

a semiconductor layer of second conductivity type on the substrate;

a buried layer of the second conductive type between the substrate and the semiconductor layer and having higher density than the semiconductor layer;

a first tub region of the second conductivity type in the semiconductor layer, the first tub region extending from the surface of the semiconductor layer and having higher impurity density than the semiconductor layer;

an emitter region of the first conductivity type which is in the first tub region and extending from the surface of the semiconductor layer;

a collector region of the first conductivity type in the semiconductor layer a being separated from the first tub region, the collector region extending from the surface of the semiconductor layer and surrounding the tub region; and a first region of the second conductivity type in the semiconductor layer and being separated from the first tub region and the collector region, the first region extending downward from the surface of the semiconductor layer and having higher impurity density than the semiconductor layer, wherein the emitter region has a first high-density region and a first low-density region which has lower impurity density than the first high-density region and surrounds the first high-density region, and the collector region has a second low-density region and a second high-density region which has higher impurity density than the second low-density region and surrounds the second high-density region.

7. The lateral bipolar transistor according to claim 6, wherein the first region is separated from the buried layer.

8. The lateral bipolar transistor according to claim 7, further comprising a second region of the second conductivity type in the first region extending from the surface of the semiconductor layer and having higher impurity density than the first region.

9. The lateral bipolar transistor according to claim 6, further comprising:

an isolation region of the first conductivity type for isolating the bipolar transistor, wherein the isolation region is in the semiconductor layer extending from the surface of the semiconductor layer and surrounding the collector region and the first region, and wherein the isolation region is separated from the collector region and the first region; and a second tub region of the second conductivity type in the semiconductor layer and extending from the surface of the semiconductor layer and sandwiched laterally between the isolation region and the collector region.

* * * * *